United States Patent
Ogasawara et al.

(10) Patent No.: US 8,704,923 B2
(45) Date of Patent: Apr. 22, 2014

(54) SOLID-STATE IMAGER AND SIGNAL PROCESSING SYSTEM

(75) Inventors: Hidehiko Ogasawara, Chiba (JP); Toshiyuki Sekiya, Tokyo (JP)

(73) Assignee: Sony Corporation, Tokyo (JP)

( * ) Notice: Subject to any disclaimer, the term of this patent is extended or adjusted under 35 U.S.C. 154(b) by 714 days.

(21) Appl. No.: 12/572,637

(22) Filed: Oct. 2, 2009

(65) Prior Publication Data

US 2010/0091128 A1 Apr. 15, 2010

(30) Foreign Application Priority Data

Oct. 10, 2008 (JP) ................. 2008-264576

(51) Int. Cl.
*H04N 3/14* (2006.01)
*H04N 5/335* (2011.01)
*H04N 5/225* (2006.01)

(52) U.S. Cl.
USPC .......................................... 348/294; 348/374

(58) Field of Classification Search
None
See application file for complete search history.

(56) References Cited

U.S. PATENT DOCUMENTS

| | | | | |
|---|---|---|---|---|
| 7,324,716 B2 * | 1/2008 | Epitaux | ........................ | 385/14 |
| 7,821,554 B2 * | 10/2010 | Ma et al. | ...................... | 348/294 |
| 2004/0095495 A1 * | 5/2004 | Inokuma et al. | ............. | 348/308 |
| 2005/0062864 A1 * | 3/2005 | Mabuchi | ...................... | 348/294 |
| 2007/0076109 A1 * | 4/2007 | Krymski | ...................... | 348/300 |

FOREIGN PATENT DOCUMENTS

| | | |
|---|---|---|
| JP | 2004-112422 | 4/2004 |
| JP | 2004-219882 | 8/2004 |
| JP | 2006-191465 | 7/2006 |
| JP | 2006-196972 | 7/2006 |
| JP | 2006196972 A * | 7/2006 |

OTHER PUBLICATIONS

JP2006-1969772-A Maching Translation Jul. 2006.*
U.S. Appl. No. 12/554,506, filed Sep. 4, 2009, Ogasawara, et al.
U.S. Appl. No. 12/555,235, filed Sep. 8, 2009, Ogasawara, et al.
U.S. Appl. No. 12/565,369, filed Sep. 23, 2009, Ogasawara, et al.
U.S. Appl. No. 12/572,452, filed Oct. 2, 2009, Ogasawara, et al.

* cited by examiner

*Primary Examiner* — Sinh Tran
*Assistant Examiner* — Jason Flohre
(74) *Attorney, Agent, or Firm* — Oblon, Spivak, McClelland, Maier & Neustadt, L.L.P.

(57) ABSTRACT

A solid-state imager includes a pixel unit for converting incident light into an electrical signal, a substrate bearing the pixel unit formed thereon, an analog-to-digital converter, formed on the substrate, for converting a signal read from the pixel unit into a digital signal, an optical communication unit, arranged on the bottom surface of the substrate opposite the surface of the substrate bearing opposite the top surface of the substrate bearing the pixel unit receiving the incident light, for converting the digital signal converted by the analog-to-digital converter into a light signal and outputting the light signal, and a signal line for transferring the digital signal, converted by the analog-to-digital converter, to the optical communication unit arranged on the bottom surface of the substrate.

12 Claims, 47 Drawing Sheets

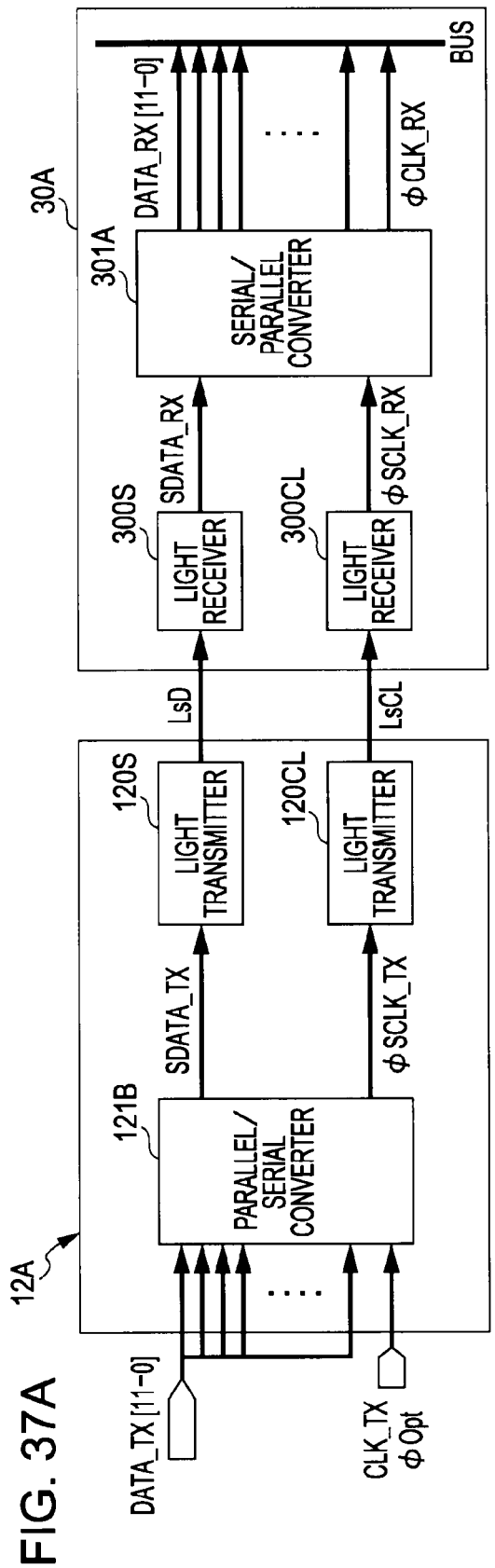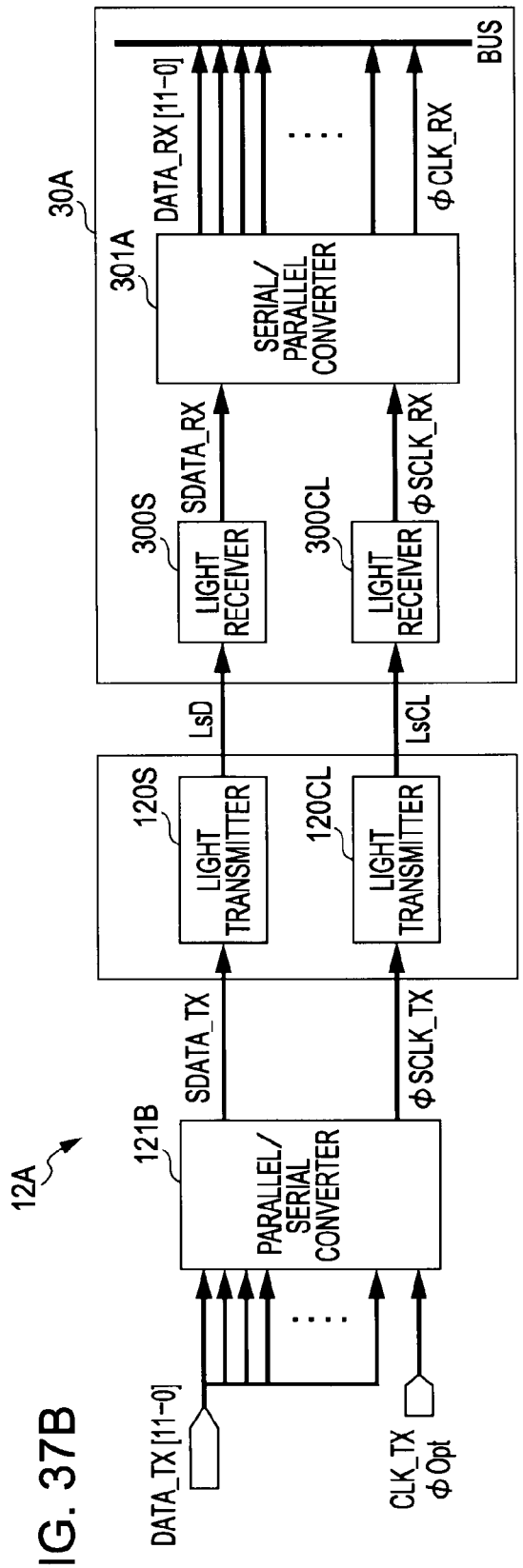

SOLID-STATE IMAGER AND SIGNAL PROCESSING SYSTEM

BACKGROUND OF THE INVENTION

1. Field of the Invention

The present invention relates to a solid-state imager for converting an optical image into an electrical signal and a signal processing system including the solid-state imager. More specifically, the present invention relates to a signal processing system that outputs in the form of a light signal a pixel signal read from the solid-state imager.

2. Description of the Related Art

As the degree of integration and speed of operation of circuit boards are increased, a remedial step to the delaying of signals and the generation of electromagnetic interference (EMI) becomes an urgent necessity. Optical wiring technique currently draws attention. The optical wiring technique is free from signal delay and signal degradation caused by electric wiring and electromagnetic interference noise radiated from the electric wiring, and can transfer data at a high speed.

Japanese Unexamined Patent Application Publication No. 2006-196972 discloses an optical wiring technique. In accordance with the disclosure, a solid-state imager is attached to a lens that is detachably mounted on a camera body, and a signal output from the solid-state imager is transferred in the form of light signal to the camera body.

Japanese Unexamined Patent Application Publication No. 2004-112422 discloses another technique. In accordance with the disclosure, heat generation by a solid-state imager is controlled by controlling the supplying of power to the solid-state imager so that an output unit of the solid-state imager is not driven when no pixel signal is output.

SUMMARY OF THE INVENTION

High-speed signal transmission is possible using the optical wiring technique. Japanese Unexamined Patent Application Publication No. 2006-196972 discloses only a structure in which a light emitter is mounted on a substrate having a solid-state imager and the disclosed technique is unable to cope with the high-speed signal transmission requirement. The technique disclosed in Japanese Unexamined Patent Application Publication No. 2004-112422 pays little attention to the effect of heat generated by a light emitter on the solid-state imager although taking into consideration heat generated by the solid-state imager.

It is thus desirable to provide a solid-state imager that transmits at a high speed a pixel signal read from a pixel unit in the form of light signal and controls the effect of heat attributed to optical communication and to provide a signal processing system including the solid-state imager.

According to one embodiment of the present invention, a solid-state imager includes a pixel unit for converting incident light into an electrical signal, a substrate bearing the pixel unit formed thereon, an analog-to-digital converter, formed on the substrate, for converting a signal read from the pixel unit into a digital signal, an optical communication unit, arranged on the bottom surface of the substrate opposite the top surface of the substrate bearing the pixel unit receiving the incident light, for converting the digital signal converted by the analog-to-digital converter into a light signal and outputting the light signal, and a signal line for transferring the digital signal, converted by the analog-to-digital converter, to the optical communication unit arranged on the bottom surface of the substrate.

According to another embodiment of the present invention, a signal processing system includes an optical device including a solid-state imager for converting incident light into an electrical signal, and an optical element for guiding light to the solid-state imager, and a signal processing device connected to the optical device. The solid-state imager includes a pixel unit for converting incident light into an electrical signal, a substrate bearing the pixel unit formed thereon, an analog-to-digital converter, formed on the substrate, for converting a signal read from the pixel unit into a digital signal, an optical communication unit, arranged on the bottom surface of the substrate opposite the top surface of the substrate bearing the pixel unit receiving the incident light, for converting the digital signal converted by the analog-to-digital converter into a light signal and outputting the light signal, and a signal line for transferring the digital signal, converted by the analog-to-digital converter, to the optical communication unit arranged on the bottom surface of the substrate.

According to embodiments of the present invention, the electrical signal resulting from photoelectrically converting the light incident on the pixel unit is read and input to the analog-to-digital converter. The signal input to the analog-to-digital converter is analog-to-digital converted, and then input to the optical communication unit on the bottom surface of the substrate via the signal line. The digital signal input to the optical communication unit is converted into the light signal and the light signal is output as signal light from the bottom surface of the substrate.

According to embodiments of the present invention, the arrangement of the optical communication unit on the bottom surface of the substrate opposite the top surface bearing the pixel unit increases the freedom of layout of the optical communication unit. Since this arrangement allows the substrate to be interposed between the pixel unit and the optical communication unit, the effect of heat generated by the optical communication unit on the pixel unit is reduced. Also, the effect of the electromagnetic noise generated in the optical communication unit on the pixel unit is reduced.

The use of the signal line for transferring the signal read from the pixel unit to the optical communication unit on the bottom surface of the substrate increases the freedom of selection of the signal transfer method of the optical communication unit on the bottom surface of the substrate. For example, a signal transfer method is selected from a variety of signal transmission methods including a superimposition serial transmission method in which a synchronization signal is transmitted on a data line with a clock signal superimposed thereon, and a transmission method in which a plurality of clock signals are transmitted with serial data lines used.

The optical communication unit is manufactured in a manufacturing process different from a manufacturing process of the pixel unit. The integration of the optical communication unit is easy and the freedom of internal layout of the optical communication unit is thus increased.

BRIEF DESCRIPTION OF THE DRAWINGS

FIGS. 37A and 37B are functional block diagrams illustrating one example of the optical communication unit that includes a plurality of light transmitters transmitting the serialized pixel data;

DESCRIPTION OF THE PREFERRED EMBODIMENTS

An solid-state imager, an optical device including the solid-state imager, a signal processing device connected to the optical device, and a signal processing system including the optical device and the signal processing device of embodiments of the present invention are described below with reference to the drawings.

Structure of Solid-State Imager of First Embodiment

Figure 1:
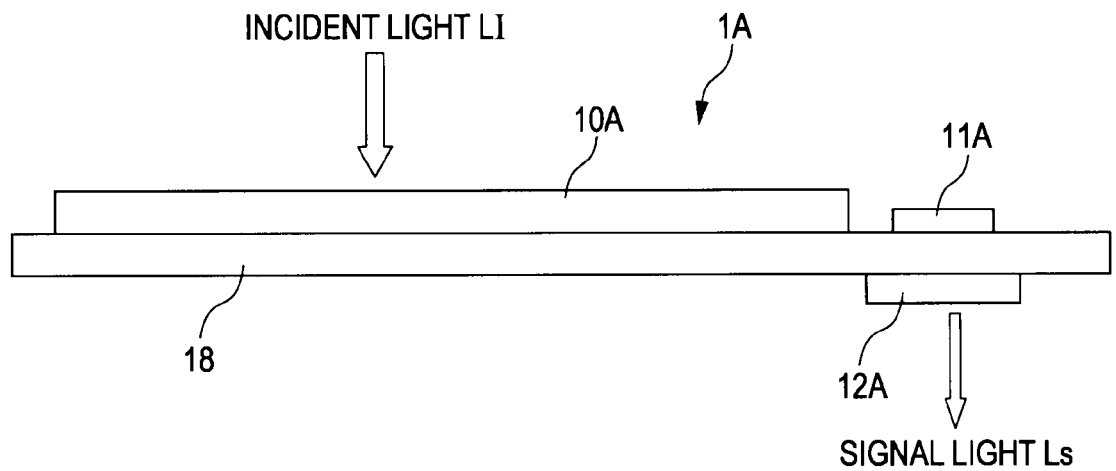
FIG. 1 is a side view diagrammatically illustrating a solid-state imager in accordance with a first embodiment of the present invention.
Figure 2:
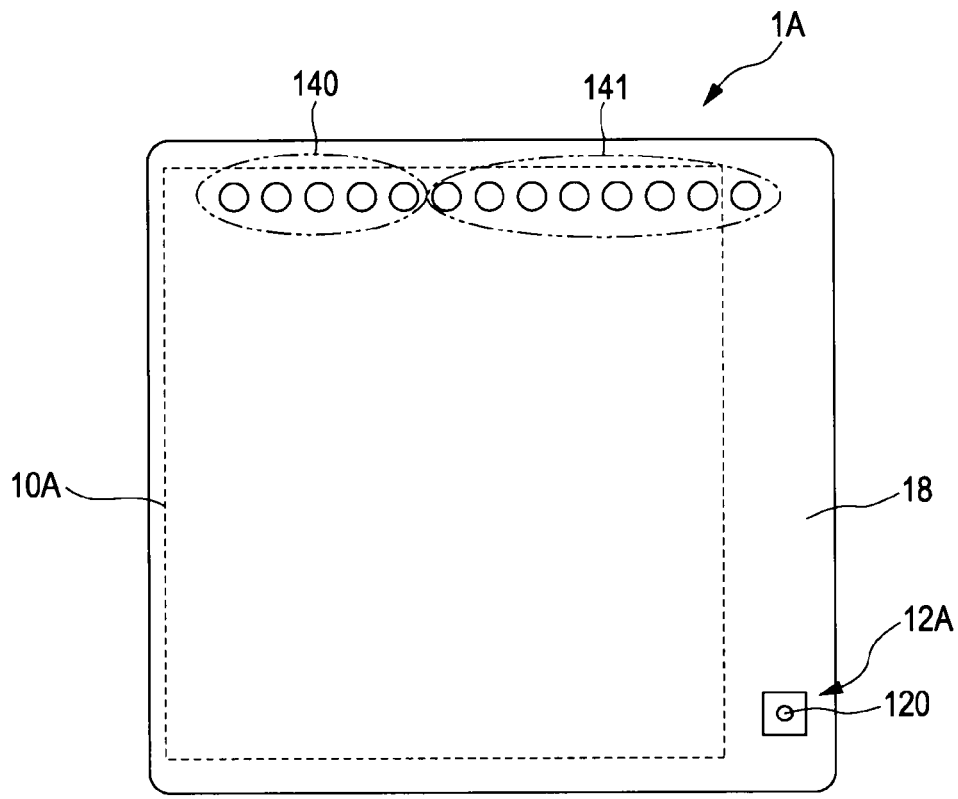
FIG. 2 is a plan view diagrammatically illustrating the solid-state imager in accordance with the first embodiment of the present invention.
Figure 3:
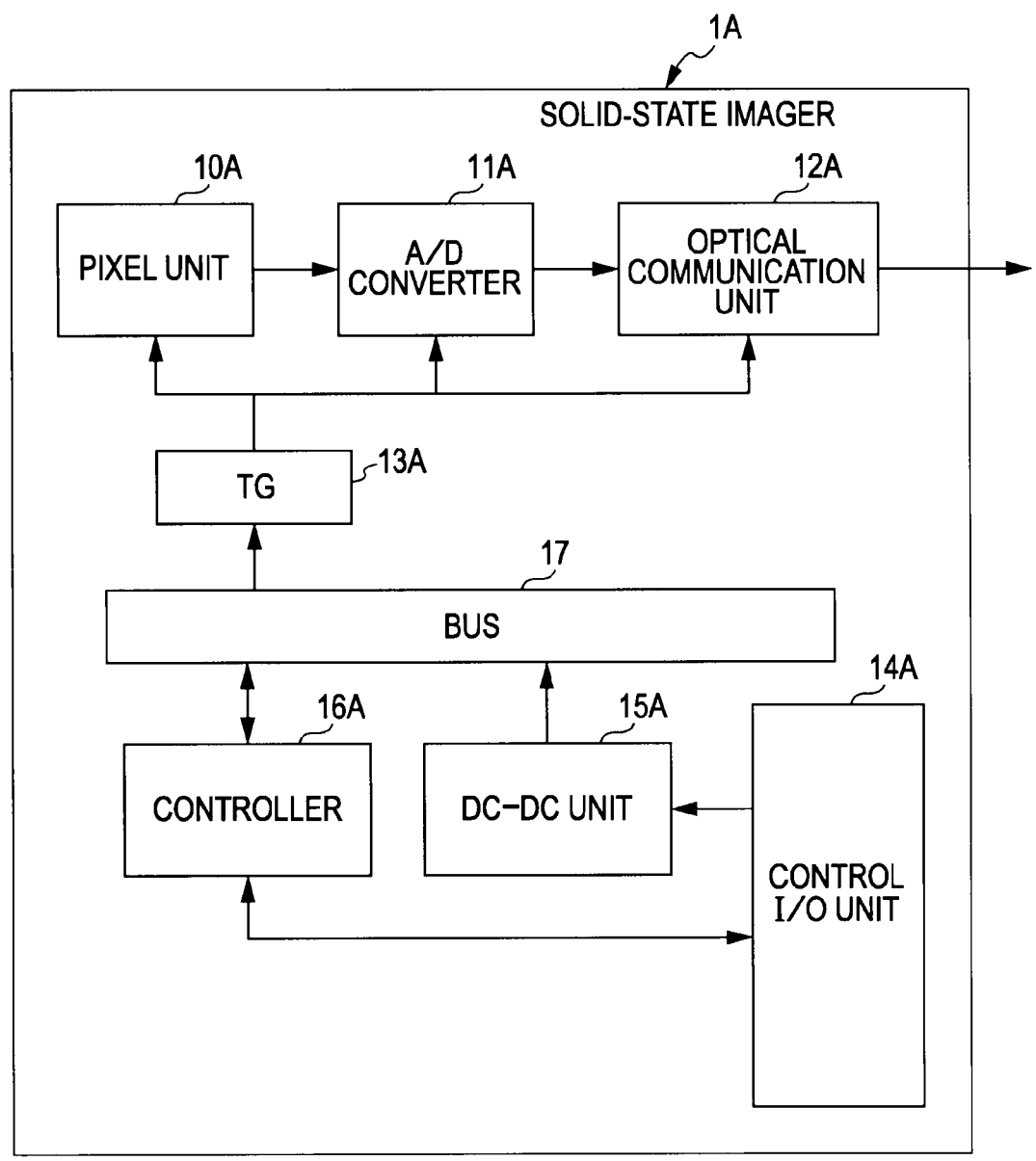
FIG. 3 is a functional block diagram illustrating a function of the solid-state imager in accordance with the first embodiment of the present invention.

FIGS. 1 and 2 illustrate a solid-state imager 1A in accordance with a first embodiment of the present invention. FIG. 1 is a side view diagrammatically illustrating the solid-state imager 1A of the first embodiment, and FIG. 2 is a plan view diagrammatically illustrating the solid-state imager of the first embodiment. FIG. 3 is a functional block diagram illustrating a function of the solid-state imager 1A of the first embodiment.

The solid-state imager 1A of the first embodiment is a complementary metal oxide semiconductor (CMOS) image sensor or a charge-coupled device (CCD) image sensor. The solid-state imager 1A includes a pixel unit 10A converting light into an electrical signal and outputting the electrical signal. The pixel unit 10A includes one-dimensionally or two-dimensionally arranged pixels, each pixel converting light into the electrical signal, and thus outputs the electrical signal responsive to the intensity of incident light LI.

The solid-state imager 1A includes an analog-to-digital converter 11A converting the electrical signal output from the pixel unit 10A, and an optical communication unit 12A converting the electrical signal, analog-to-digital converted by the analog-to-digital converter 11A, into a light signal.

The optical communication unit 12A includes one or a plurality of light transmitters 120, each light transmitter 120 converting the electrical signal into the light signal, depending on the signal transmission method, such as a serial transmission of the signal or a parallel transmission of the signal. One optical communication unit 12A or a plurality of optical communication units 12A are arranged, each including one light transmitter 120 or a plurality of light transmitters 120. The optical communication unit 12A including one light transmitter 120 provides one channel of light signal transmission. The optical communication unit 12A may include a plurality of light transmitters 120 arranged in an array, thereby providing a plurality of channels for light signal transmission. A plurality of optical communication units 12A, each including a single light transmitter 120, may be arranged, thereby providing a plurality of channels for light signal transmission.

The optical communication unit 12A includes a self-luminous light emitting element emitting light in response to an applied voltage, such as a semiconductor laser (LD), for the light transmitter 120 as a first embodiment of the present invention. The light emitting element such as the semiconductor laser can modulate light with an electrical signal representing a change in an applied voltage. The optical communication unit 12A thus modulates light emitted by itself with the electrical signal, analog-to-digital converted by the analog-to-digital converter 11A, and outputs signal light Ls responsive to the pixel data read from the pixel unit 10A. The optical communication unit 12A also includes a light modulator as the light transmitter 120 in accordance with a second embodiment of the present invention. The light modulator modulates incident light being transmitted or reflected with the electrical signal representing a change in an applied voltage. The light modulator in the optical communication unit 12A receives constant light from the outside while also receiving the electrical digital signal converted by the analog-to-digital converter 11A. The optical communication unit 12A thus modulates the incident light input from the outside with the electrical signal input from the analog-to-digital converter 11A and outputs the signal light Ls responsive to the pixel data read from the pixel unit 10A.

The solid-state imager 1A includes a timing generator (TG) 13A generating a drive clock (CLK) matching an operation mode, and supplying the drive clock to each functional block in the pixel unit 10A, the analog-to-digital converter 11A, and the optical communication unit 12A. The solid-state imager 1A includes a control input/output (I/O) unit 14A inputting and outputting control signals, a DC-DC unit 15A supplying power, and a controller 16A controlling reading of the pixel data. The controller 16A, the DC-DC unit 15A, and the timing generator 13A are connected to a bus 17 so that the control signals and data are exchanged.

The controller 16A controls the DC-DC unit 15A, thereby switching on and off the power supplying to the solid-state imager 1A. Under the control of the controller 16A, the timing generator 13A generates the drive clock, and supplies the drive clock to each of the pixel unit 10A, the analog-to-digital converter 11A, and the optical communication unit 12A. The controller 16A thus operates the pixel unit 10A, the analog-to-digital converter 11A, and the optical communication unit 12A in synchronization with the drive clock.

The drive clock supplied from the timing generator 13A causes the pixel unit 10A, the analog-to-digital converter 11A, and the optical communication unit 12A to input and output signals in synchronization. The pixel unit 10A reads as the electrical signal the pixel data responsive to an incident optical image. The analog-to-digital converter 11A receives the pixel data read from the pixel unit 10A, and converts the pixel data into a digital signal and outputs the digital signal. The optical communication unit 12A receives the electrical signal into which the analog-to-digital converter 11A analog-to-digital converts the electrical signal read from the pixel unit 10A. The optical communication unit 12A thus converts the digital signal into the light signal responsive to the pixel data, and then outputs the light signal as the signal light Ls.

The solid-state imager 1A includes the pixel unit 10A, the analog-to-digital converter 11A, the optical communication unit 12A, the timing generator 13A, the DC-DC unit 15A, and the controller 16A, all integrated in a silicon substrate 18. The solid-state imager 1A is a one-chip device into which these elements are integrated through a semiconductor manufacturing process.

The solid-state imager 1A includes the pixel unit 10A on one surface of the substrate 18. Light is incident on the surface of the substrate 18 bearing the pixel unit 10A. The solid-state imager 1A also includes, on the surface of the substrate 18, the analog-to-digital converter 11A, the DC-DC unit 15A, and the controller 16A, each exchanging signals with the pixel unit 10A. The DC-DC unit 15A supplies power to the pixel unit 10A.

The solid-state imager 1A also includes the optical communication unit 12A on the bottom surface of the substrate 18 opposite the surface of the substrate 18 bearing the pixel unit 10A. The optical communication unit 12A is electrically connected to the analog-to-digital converter 11A via electrodes (not shown) formed within the substrate 18. The solid-state imager 1A also includes, as the control input/output unit 14A, a power source line 140 and a control line 140 on the bottom surface of the substrate 18. Optionally, the power source line 140 and the control line 141 may be formed on the top surface of the substrate 18.

Figure 4:
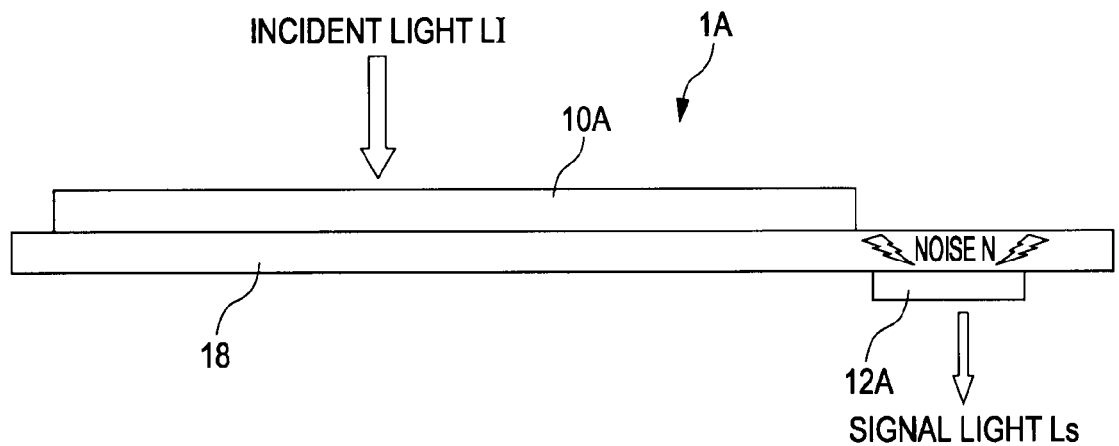
FIG. 4 is a side view diagrammatically illustrating the solid-state imager in which an optical communication unit is appropriately arranged.
Figure 5:
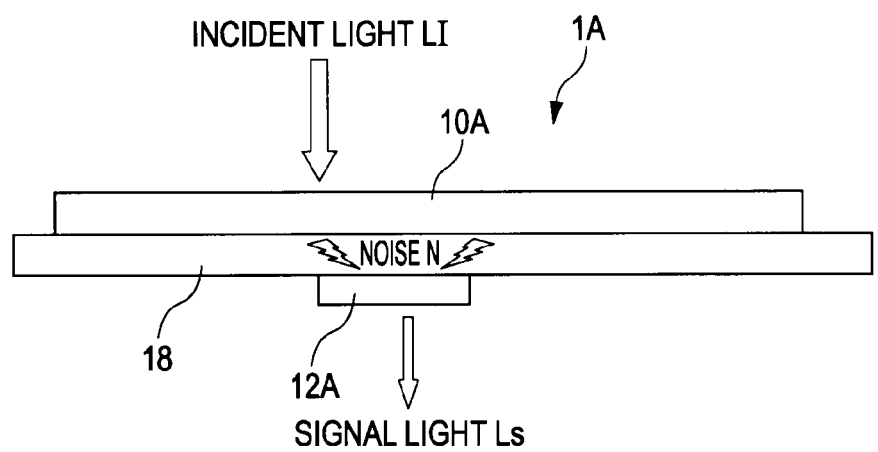
FIG. 5 is a side view diagrammatically illustrating the solid-state imager in which the optical communication unit is arranged in a comparative example.

FIG. 4 is a side view diagrammatically illustrating the solid-state imager 1A having the optical communication unit 12A arranged in an appropriate layout. FIG. 5 is a side view diagrammatically illustrating a solid-state imager having an optical communication unit in a comparative layout. An appropriate layout example of the optical communication unit on the bottom surface of the substrate with respect to the pixel unit is described below.

FIG. 5 illustrates the optical communication unit 12A that is installed on a region on the bottom surface of the substrate 18 overlapping the formation region of the pixel unit 10A arranged on the top surface of the substrate 18. In the arrangement in which the optical communication unit 12A partly or entirely overlaps the pixel unit 10A with the substrate 18 interposed therebetween, an area occupied by the optical communication unit 12A is shared by the pixel unit 10A. This arrangement leads to compact design of the substrate 18.

The distance between the optical communication unit 12A and the pixel unit 10A is determined by the thickness of the substrate 18. The optical communication unit 12A is thus arranged close to the pixel unit 10A. Heat and electromagnetic noise N generated by the operating optical communication unit 12A travel through the substrate 18. The heat and the electromagnetic noise N traveling in the direction of thickness of the substrate 18 reach the pixel unit 10A. The pixel unit 10A can be adversely affected.

As illustrated in FIG. 4 in contrast, the optical communication unit 12A is mounted on a peripheral region of the bottom surface of the substrate 18 spaced from the formation region of the pixel unit 10A arranged on the top surface of the substrate 18. In this arrangement, the optical communication unit 12A does not entirely overlap the pixel unit 10A with the substrate 18 interposed therebetween.

In this arrangement, the optical communication unit 12A and the pixel unit 10A are spaced apart in the plane of the substrate 18. The heat and the electromagnetic noise N, generated by the operating optical communication unit 12A, and traveling along 18, are radiated and attenuated, and the arrival of the heat and the electromagnetic noise N at the pixel unit 10A is thus controlled. The effect of the heat and the electromagnetic noise N, generated by the optical communication unit 12A and affecting the pixel unit 10A, is substantially reduced.

Structure of the Optical Communication Unit of the Solid-State Imager

Figure 6:
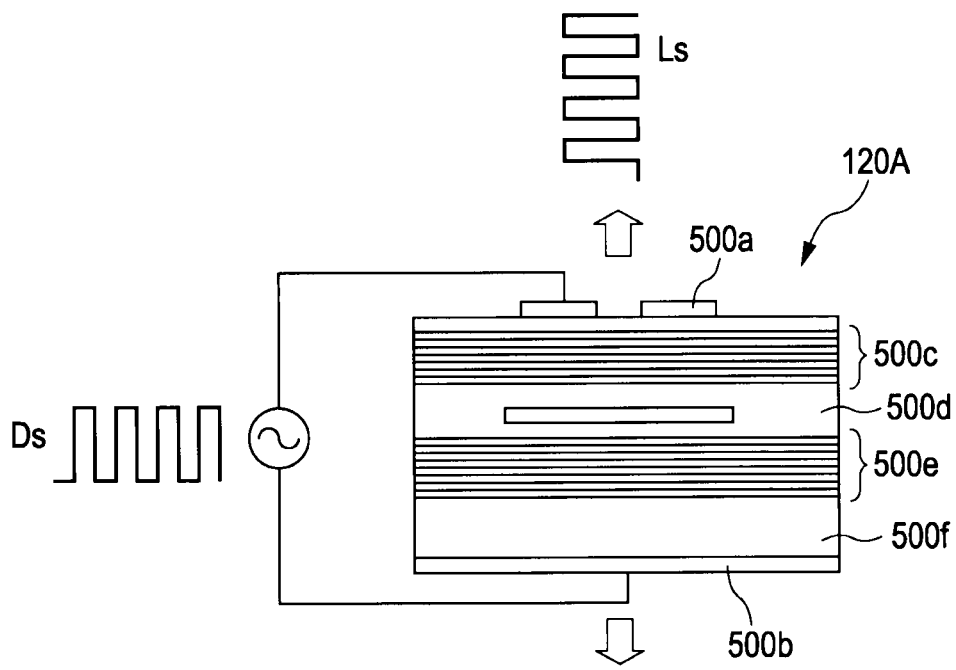
FIG. 6 illustrates one example of the optical communication unit of the solid-state imager.

FIG. 6 illustrates one example the optical communication unit 12A in the solid-state imager 1A. The optical communication unit 12A in the solid-state imager 1A includes a self-luminous light emitting element as the light transmitter 120. For example, the self-luminous light emitting element is a vertical cavity surface emitting laser (VCEL) 120A as a surface emitting semiconductor laser. The surface emitting semiconductor laser 120A is produced by laminating, between a p-type electrode 500a and an n-type electrode 500b, an upper distributed Bragg reflector (DBR) mirror 500c, an active layer 500d, a lower distributed Bragg reflector (DBR) mirror 500e, and an n-type semiconductor substrate 500f. The surface emitting semiconductor laser 120A includes the active layer 500d interposed between the upper distributed Bragg reflector mirror 500c and the lower distributed Bragg reflector mirror 500e, each formed of dielectric multi-layers. The surface emitting semiconductor laser 120A thus forms a resonator between the mirrors.

Operation principle of the surface emitting semiconductor laser 120A is described below.

(1) A voltage from the outside is applied to the p-type electrode 500a and the n-type electrode 500b to cause a current therebetween. The energy level of the active layer 500d is shifted to a population inversion state.

(2) Photons having energy equal to an energy gap are spontaneously emitted in the active layer 500d, causing stimulated emission and amplifying light.

(3) Light is reflected from the upper and lower mirrors of the active layer 500d, part of the light is guided to within the active layer 500d and amplified through stimulated emission.

(4) Part of the amplified light passes through an end face of the p-type electrode 500a and is emitted outwardly.

Levels 1 and 0 representing a digital signal and output from the analog-to-digital converter 11A are associated with an on voltage and an off voltage, generating a light on level and a light off level representing a light signal. Modulation is thus performed. An edge emitting semiconductor laser may also serve as a self-luminous light emitting element.

Figure 7:
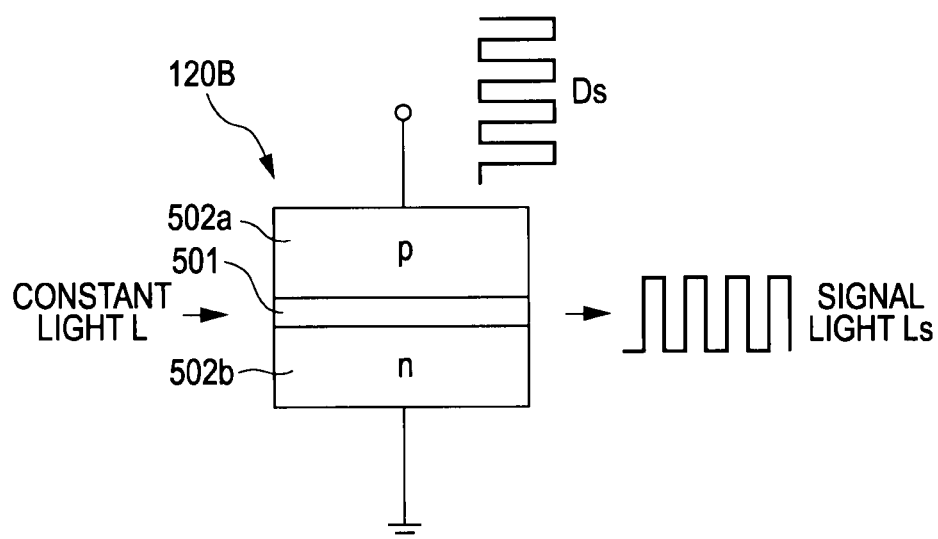
FIG. 7 illustrates another example of the optical communication unit of the solid-state imager.
Figure 8:
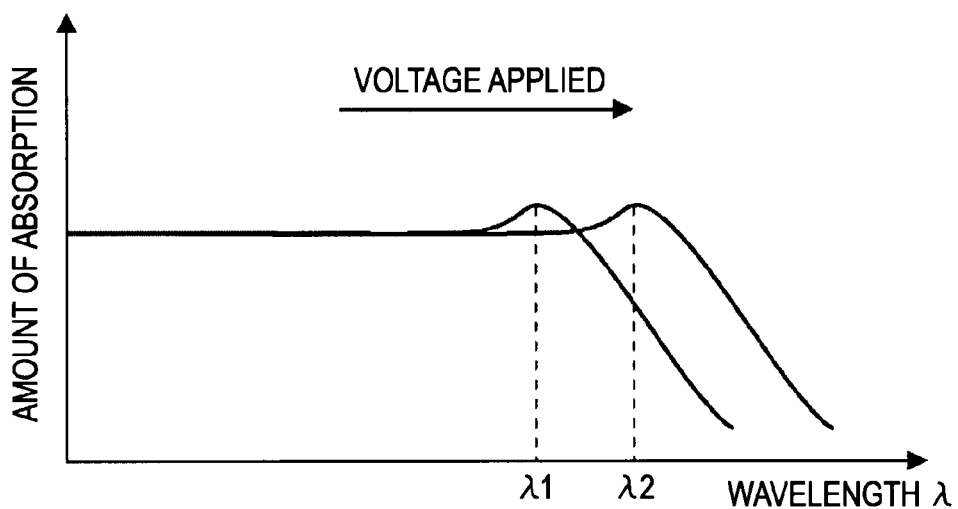
FIG. 8 is a plot of the relationship between an applied voltage and an amount of light absorption.

FIG. 7 illustrates another example of the optical communication unit 12A in the solid-state imager 1A. FIG. 8 is a plot representing the relationship between an applied voltage and an amount of light absorption. The optical communication unit 12A in the solid-state imager 1A includes an external-modulation type light modulator as the light transmitter 120. An electro-absorption light modulator 1203 is included as a light modulator. The electro-absorption light modulator 120B operates based on the phenomenon in which when an electric field is applied to an infinitesimal semiconductor structure called quantum well, a band structure of semiconductor changes and an amount of light absorption changes.

The electro-absorption light modulator 1203 includes a waveguide layer 501 having a multi-quantum well structure sandwiched between a p-type layer 502a and an n-type layer 502b. The amount of light absorption of the waveguide layer 501 of the electro-absorption light modulator 120B shifts the band thereof depending on a bias voltage as illustrated in FIG. 8. For example, if light having a wavelength of λ2 is incident on the waveguide layer 501, the light is absorbed if a voltage is applied, and is transmitted if no voltage is applied. The light incident on the waveguide layer 501 changes in loss in response to the applied voltage, and is thus intensity modulated.

The solid-state imager 1A performs light modulation by applying a voltage responsive to an electrical signal output from the analog-to-digital converter 11A to the electro-absorption light modulator 120B. The optical communication unit 12A is designed so that the voltage responsive to the electrical digital signal converted by the analog-to-digital converter 11A is applied between the p-type layer 502a and the n-type layer 502b of the electro-absorption light modulator 120B.

The optical communication unit 12A in the solid-state imager 1A modulates constant light input from the outside with the electrical signal Ds into which the analog-to-digital converter 11A analog-to-digital converts the signal read from the pixel unit 10A. The optical communication unit 12A then outputs the modulated signal as signal light Ls.

Figure 9:
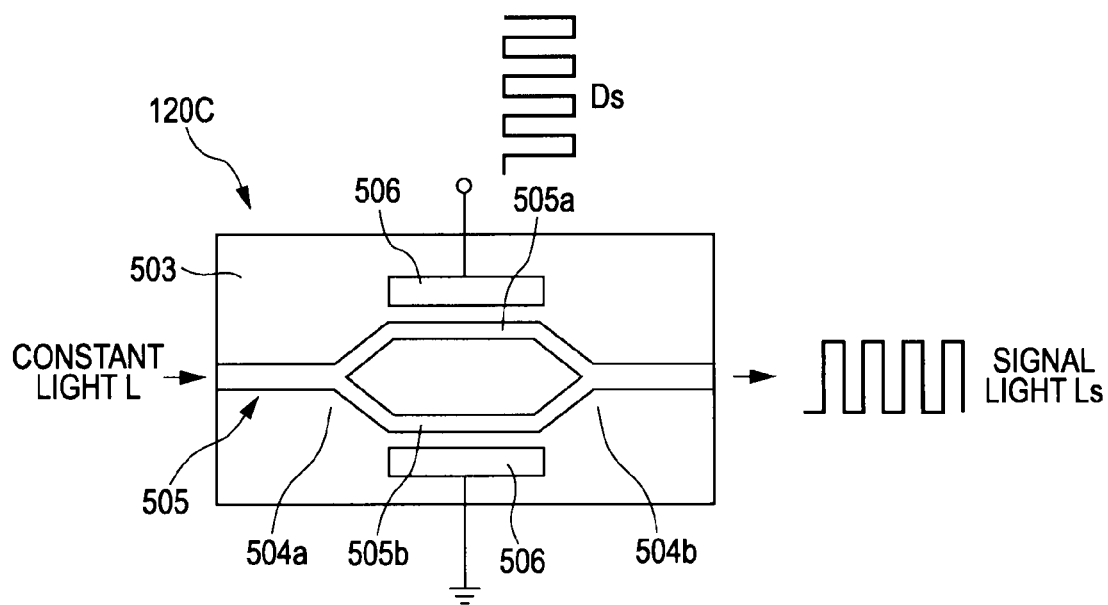
FIG. 9 illustrates yet another example of the optical communication unit of the solid-state imager.

FIG. 9 illustrates another example of the optical communication unit 12A in the solid-state imager 1A. The optical communication unit 12A in the solid-state imager 1A includes a Mach-Zehnder type light modulator 120C. The Mach-Zehnder type light modulator 120C operates on the electro-optical effect (Pockels effect) in which refraction index changes in response to an applied voltage. The light modulator based on the electro-optical effect can modulate light in phase in response to an applied voltage.

The Mach-Zehnder type light modulator 120C uses a phase difference of light based on the electro-optical effect. More specifically, the Mach-Zehnder type light modulator 120C causes an optical path difference between two waveguide paths forming a Mach-Zehnder interferometer, thereby causing light rays to interfere with each other. Light is then on and off controlled.

The Mach-Zehnder type light modulator 120C includes a substrate 503 made of a ferroelectric crystal such as lithium niobate ($LiNbO_3$), and a light guide 505 that is forked into a first light guide path 505a and a second light guide path 505b at a fork portion 504a and then merged at a merging portion 504b. Electrodes 506 are also arranged. The Mach-Zehnder type light modulator 120C may be manufactured of a semiconductor material such as gallium arsenide (GaAs) or indium phosphide (InP). The semiconductor Mach-Zehnder type light modulator 120C is produced on an indium phosphide substrate through a semiconductor process, and is set to be more miniature than a Mach-Zehnder type light modulator of lithium niobate.

A voltage V1 is applied to the Mach-Zehnder type light modulator 120C so that light rays passing through the first light guide path 505a and the second light guide path 505b shift from each other in phase by $\pi$, the light rays branched at the fork portion 504a are merged at the merging portion 504b with a phase difference of $\pi$. The light rays having a phase difference of $\pi$, if merged, cancel each other, thereby providing zero output.

If zero voltage is applied so that no phase difference takes place between the light rays passing through the first light guide path 505a and the second light guide path 505b, the light rays branched at the fork portion 504a are merged at the same phase at the merging portion 504b. The light rays of the same phase, if merged, intensify and provide an output of 1.

The Mach-Zehnder type light modulator 120C controls light on/off by applying the voltage for a phase difference of $\pi$.

The solid-state imager 1A modulates light by supplying to the Mach-Zehnder type light modulator 120C with the voltage responsive to the electrical signal output from the analog-to-digital converter 11A. The optical communication unit 12A in the solid-state imager 1A is so arranged that the voltage responsive to the electrical signal analog-to-digital converted and then output by the analog-to-digital converter 11A is applied to the electrodes 506 of the Mach-Zehnder type light modulator 120C.

The optical communication unit 12A in the solid-state imager 1A modulates the constant light L input from the outside with the electrical signal Ds into which the analog-to-digital converter 11A analog-to-digital converts the signal read from the pixel unit 10A. The optical communication unit 12A thus outputs the modulated signal as the signal light Ls.

Figure 10:
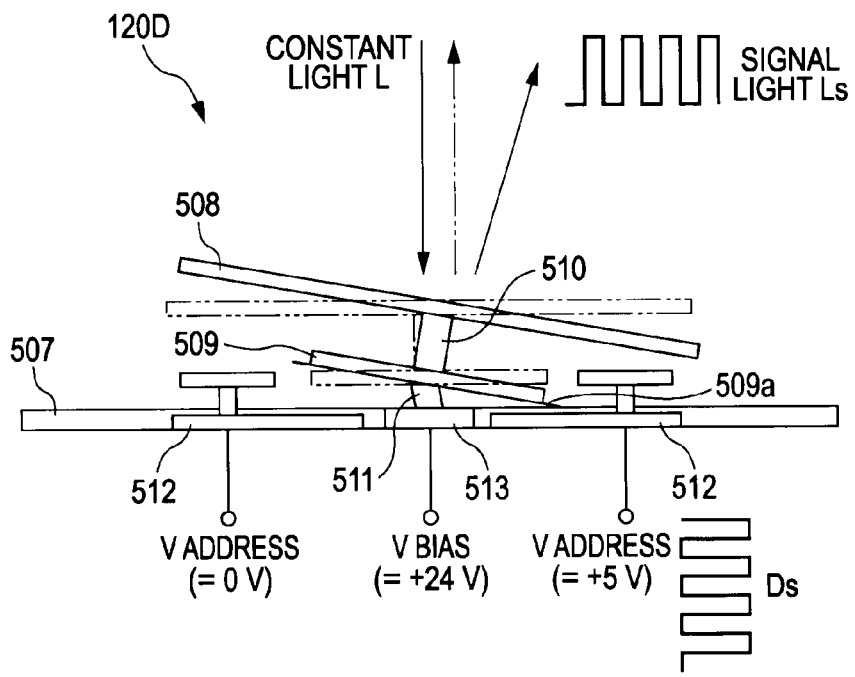
FIG. 10 illustrates still another example of the optical communication unit of the solid-state imager.

FIG. 10 illustrates another example of the optical communication unit 12A in the solid-state imager 1A. The optical communication unit 12A in the solid-state imager 1A includes a mirror device 120D as a light modulator. The mirror 120D is a digital micromirror device (DMD) produced using micro electro-mechanical system (MEMS) technique.

The mirror 120D includes on a silicon substrate 507 a reflective mirror 508, a yoke 509 mounted on the reflective mirror 508, and a mirror support post 510 for securing the reflective mirror 508 to the yoke 509. The reflective mirror 508 and the yoke 509 are supported on the substrate 507 by a hinge 511. A buffer plate 509a is arranged at the end portion of the yoke 509. The hinge 511 is elastic, and is thus deformed and returns to the original shape thereof. Address electrodes 512 are formed on the substrate 507. The address electrodes 512 face the yoke 509 and the reflective mirror 508. The yoke 509 and the reflective mirror 508 are mechanically and electrically connected to a bias reset bus 513.

A bias voltage is applied to the mirror device 120D and a voltage is applied to the address electrodes 512. Electrostatic attraction works between the reflective mirror 508 and the address electrode 512 and between the yoke 509 and the address electrode 512, thereby causing an electrostatic torque. The reflective mirror 508 and the yoke 509 pivot until the buffer plate 509a touches and stops on the substrate 507, and the reflective mirror 508 is inclined. If no bias voltage is applied, the restoring force of the hinge 511 causes the reflective mirror 508 and the yoke 509 to be back to a horizontal position and to be stabilized there.

The direction in which the light incident on the reflective mirror 508 is reflected changes in the mirror device 120D depending on the presence or absence of the applied voltage. An amount of received light changes on a light receiver side in response to the angle of the reflective mirror 508. Light on and off control is thus performed.

The solid-state imager 1A performs light modulation by applying to the mirror device 120D the voltage responsive to the electrical signal output from the analog-to-digital converter 11A. The optical communication unit 12A in the solid-state imager 1A is so arranged that the voltage responsive to the electrical signal analog-to-digital converted and then output by the analog-to-digital converter 11A is applied to the mirror device 120D.

The optical communication unit 12A in the solid-state imager 1A modulates the constant light L input from the outside with the electrical signal Ds into which the analog-to-digital converter 11A has analog-to-digital converted the signal read from the pixel unit 10A, and then outputs the resulting signal as the signal light Ls.

Structure of the Solid-State Imager of Second Embodiment

Figure 11:
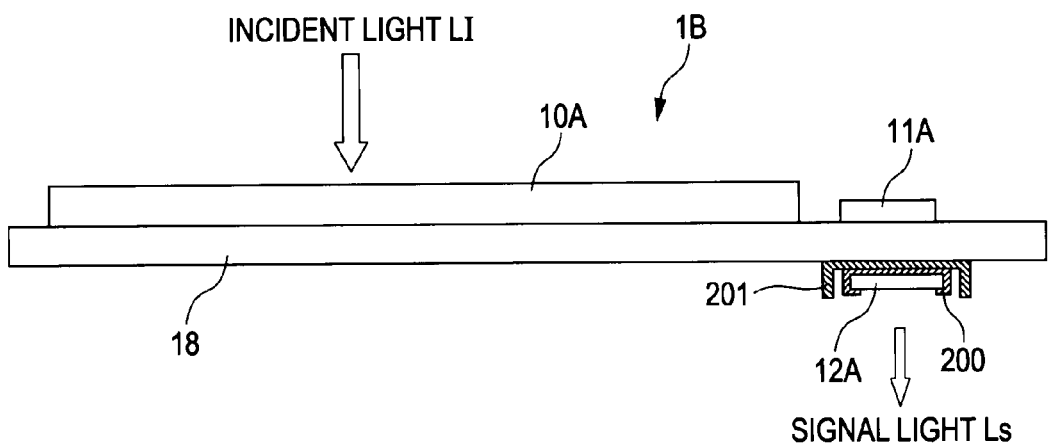
FIG. 11 is a side view diagrammatically illustrating a solid-state imager in accordance with a second embodiment of the present invention.
Figure 12:
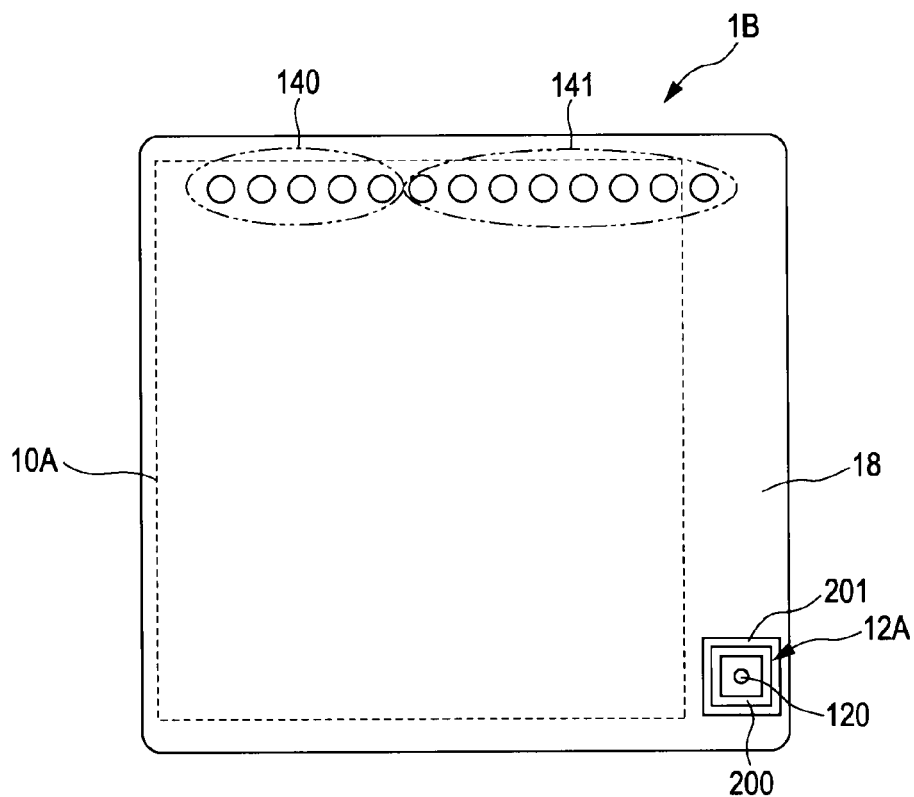
FIG. 12 is a plan view diagrammatically illustrating the solid-state imager in accordance with the second embodiment of the present invention.

FIGS. 11 and 12 illustrate a solid-state imager 1B in accordance with a second embodiment of the present invention. FIG. 11 is a side view diagrammatically illustrating the solid-state imager 1B of the second embodiment, and FIG. 12 is a plan view diagrammatically illustrating the solid-state imager 1B of the second embodiment.

The solid-state imager 1B of the second embodiment includes a light blocker 200 and/or a cooler 201 on the optical communication unit 12A arranged on the bottom surface of the substrate 18 for the pixel unit 10A.

(1) One Example of the Solid-State Imager Having the Light Blocker

Figure 13:
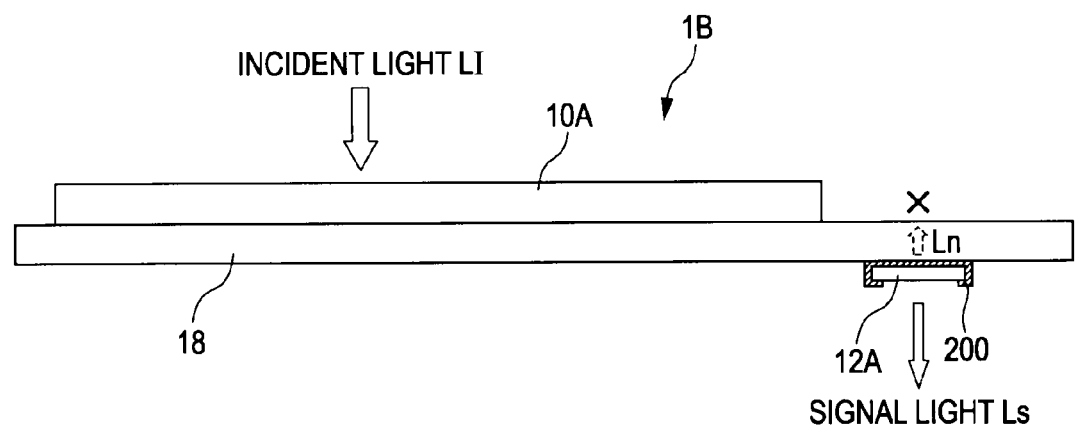
FIG. 13 is a side view diagrammatically illustrating one example of the solid-state imager having a light blocker.
Figure 14:
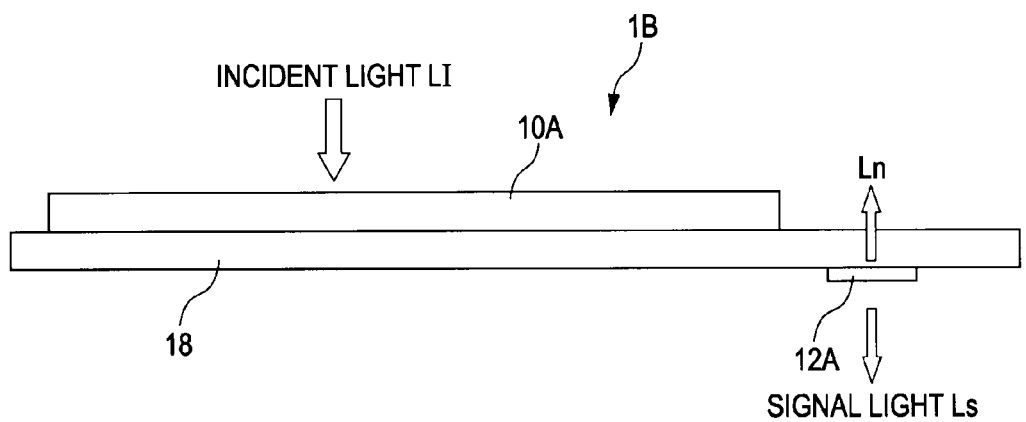
FIG. 14 is a side view diagrammatically illustrating a solid-state imager without light blocker.

FIG. 13 is a side view diagrammatically illustrating the solid-state imager 1B having the light blocker 200, and FIG. 14 is a side view diagrammatically illustrating a comparative solid-state imager having no light block unit. The structure and operation of the solid-state imager 113 having the light blocker 200 on the optical communication unit 12A are described below.

If the optical communication unit 12A includes as the light transmitter 120 the self-luminous light emitting element, the light blocker 200 is manufactured of a material that does not permit light having at least an oscillation wavelength to be transmitted therethrough. The light blocker 200 covers areas of the optical communication unit 12A other than the light emitting portion of the optical communication unit 12A and an electrode (if any) of the optical communication unit 12A exchanging signals with the outside.

For example, if the surface emitting semiconductor laser is used as a light emitting element, the light blocker 200 covers the underside of the optical communication unit 12A opposite the light emitting surface of the optical communication unit 12A. The light blocker 200 also covers the side face of the optical communication unit 12A and areas of the optical communication unit 12A other than the light emitting surface of the optical communication unit 12A.

Referring to FIG. 14, no light blocker covers the top surface of the optical communication unit 12A including the surface emitting semiconductor laser as a light emitting element. The optical communication unit 12A including the surface emitting semiconductor laser outputs a major portion of light from the bottom surface (serving the light emitting surface, but part of the light still leaks from the top surface of the optical communication unit 12A. In the arrangement illustrated in FIG. 14 where the top surface of the optical communication unit 12A is not covered with the light blocker, light Ln leaked from the optical communication unit 12A passes through the substrate 18 and is incident on the pixel unit 10A as stray light.

In contrast, the light blocker 200 illustrated in FIG. 13 covers the top surface and the side faces of the optical communication unit 12A and the underside of the optical communication unit 12A excluding the light emitting surface thereof. Light leaking through the top surface of the optical communication unit 12A is blocked so that the stray light does not pass through the substrate 18. This arrangement prevents the leak light Ln from straying into the pixel unit 10A. Light is also prevented from leaking the area other than the bottom surface of the optical communication unit 12A.

(2) Solid-State Imager Including Cooler

Figure 15:
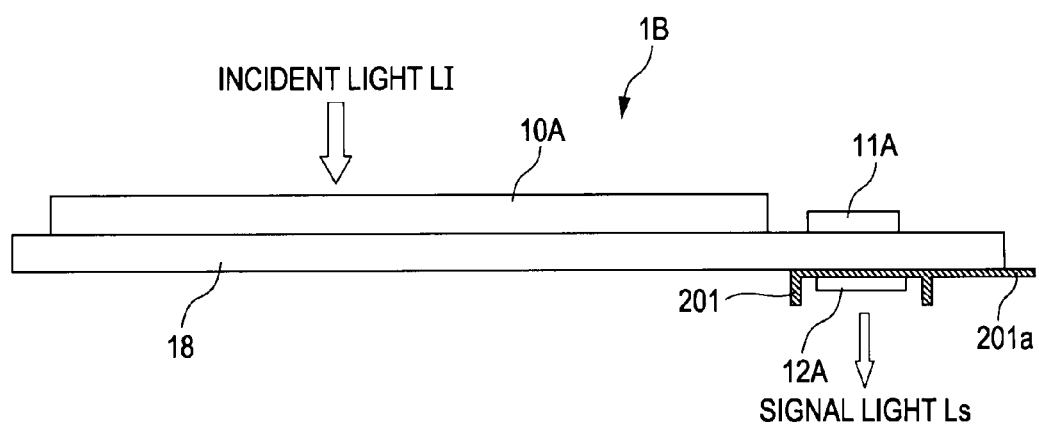
FIG. 15 is a side view diagrammatically illustrating one example of the solid-state imager having a cooler.

FIG. 15 is a side view diagrammatically illustrating a solid-state imager 1B including a cooler. The structure and operation of the solid-state imager 1B including the optical communication unit 12A having a cooler 201 are described below. The cooler 201 is manufactured of a material higher in heat conductivity than the material of the substrate 18. The light blocker 200 prevents heat generated by the optical communication unit 12A from being conducted to the substrate 18 and allows the generated heat to be radiated.

In the arrangement in which the surface emitting semiconductor laser is used for the light emitting element, the cooler 201 covers the top side and the side face of the optical communication unit 12A. The cooler 201 thus surrounds the entire surfaces of the optical communication unit 12A excluding the bottom surface serving as the light emitting surface thereof. Part of the cooler 201 partly projects out of the substrate 18, namely, out of the outline of the solid-state imager 1B, thereby forming a heat radiation portion 201a.

The solid-state imager 1B including the optical communication unit 12A having the cooler 201 causes the heat generated by the operative optical communication unit 12A to transfer not through the substrate 18 but through the cooler 201. The generated heat is mainly radiated outwardly through the heat radiation portion 201a. The heat generated by the optical communication unit 12A is prevented from reaching the pixel unit 10A, and the effect of the generated heat on the pixel unit 10A is substantially reduced. The cooler 201 includes the heat radiation portion 201a projected out of the outline of the solid-state imager 1B. Through the heat radiation portion 201a, the heat transferred from the optical communication unit 12A is radiated out of the solid-state imager 1B.

The solid-state imager 1B may also include a heat insulator between the optical communication unit 12A and the substrate 18 to prevent heat from transferring from the optical communication unit 12A to the substrate 18. A cooler may also be included to conduct the heat generated by the optical communication unit 12A. Such a cooler may allow heat to transfer via a medium such as a heat pipe or heat to transfer by means of the Peltier effect.

Specific Examples of the Solid-State Imager of Embodiments

Figure 16:
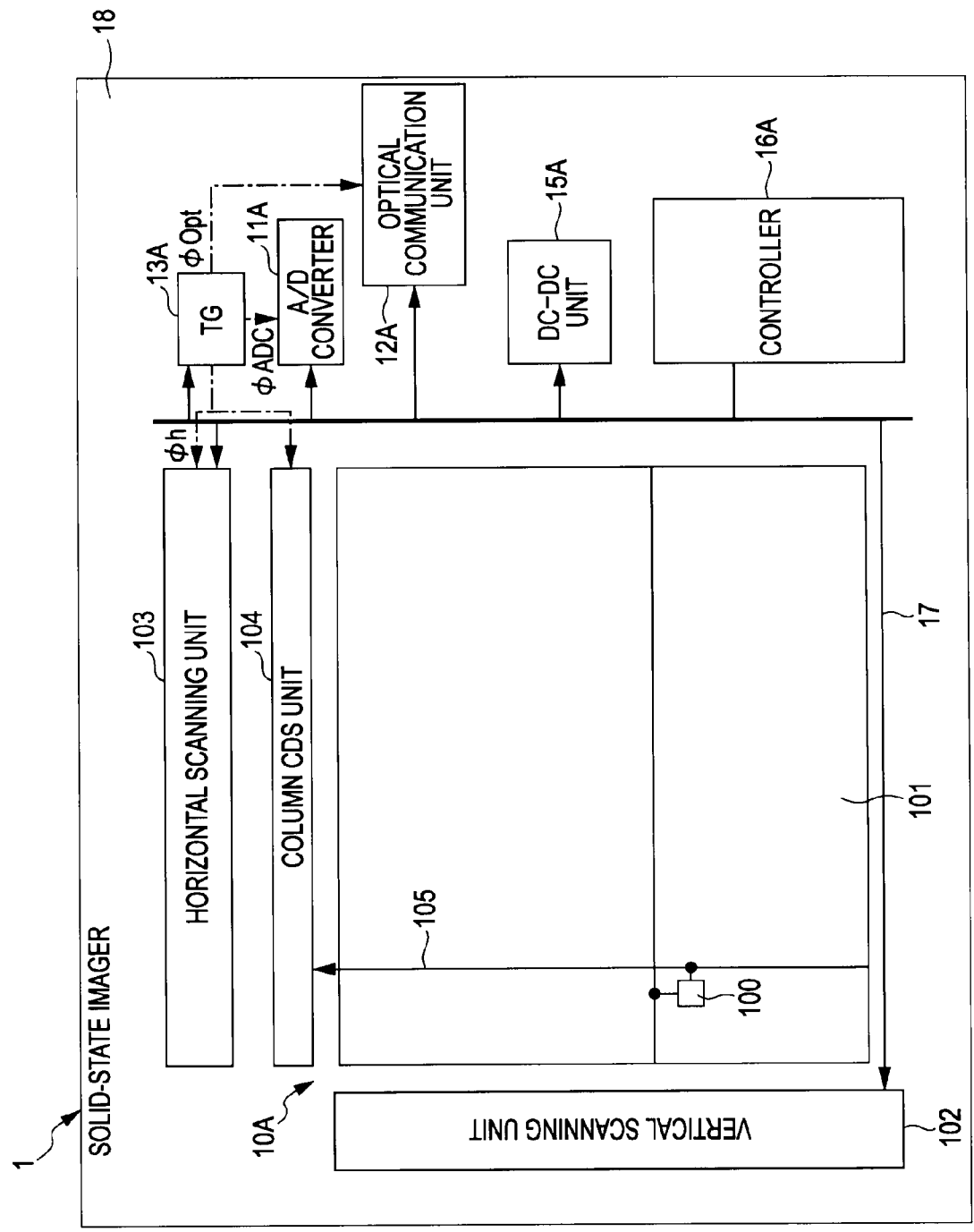
FIG. 16 is a specific functional block diagram of each of the solid-state imagers of each embodiment.

FIG. 16 is a functional block diagram illustrating the solid-state imager of each of the embodiments. Each of the solid-state imager 1A and the solid-state imager 1B illustrated in FIG. 16 is a CMOS image sensor. In the discussion that follows, the solid-state imager 1A and the solid-state imager 1B may also be collectively referred to as a solid-state imager 1.

The pixel unit 10A in the solid-state imager 1 forming the CMOS image sensor includes a pixel array 101 of two-dimensionally arranged pixels 100, a vertical scanning unit 102 and a horizontal scanning unit 103, each selecting in an XY addressing method the pixels 100 from which image is to be read.

The vertical scanning unit (row decoder/driver) 102 selects in a row direction of the pixel array 101 the pixels 100 from which the pixel data is to be read. The vertical scanning unit 102 generates a row selection pattern in each operation mode, and selects in response to the generated row selection pattern the pixels 100 from which the pixel data is to be read.

The horizontal scanning unit (column decoder/driver) 103 selects in a column direction of the pixel array 101 the pixels 100 from which the pixel data is to be read. The horizontal scanning unit 103 generates a column selection pattern in each operation mode, and selects in response to the generated column selection pattern the pixel 100 from which the pixel data is to be read. The horizontal scanning unit 103 further performs a horizontal pixel summing operation, thereby performing parallel-serial conversion operation on the signal output from the pixels 100.

The solid-state imager 1 includes a column correlated double sampling (CDS) unit 104 removing noise from the pixel data. The column CDS unit 104 samples a reset level and a signal level from a signal, and performs a subtraction operation to obtain a difference. The column CDS unit 104 is a CDS circuit connected to a column signal line 105 outputting the pixel data from the pixel array 101. The column CDS unit 104 removes variations in amplification from pixel to pixel. The column CDS unit 104 processes the signals in the analog form thereof.

The solid-state imager 1 includes on the pixel unit 10A the vertical scanning unit 102 and the horizontal scanning unit 103 connected to each other via a bus 17. The bus 17 connects to the analog-to-digital converter 11A, the optical communication unit 12A, the timing generator 13A, the DC-DC unit 15A, and the controller 16A.

A drive clock φH generated by the timing generator 13A is supplied to the horizontal scanning unit 103 and the column CDS unit 104. A drive clock φADC is also supplied to the analog-to-digital converter 11A. A drive clock φOpt is supplied to the optical communication unit 12A.

Figure 17:
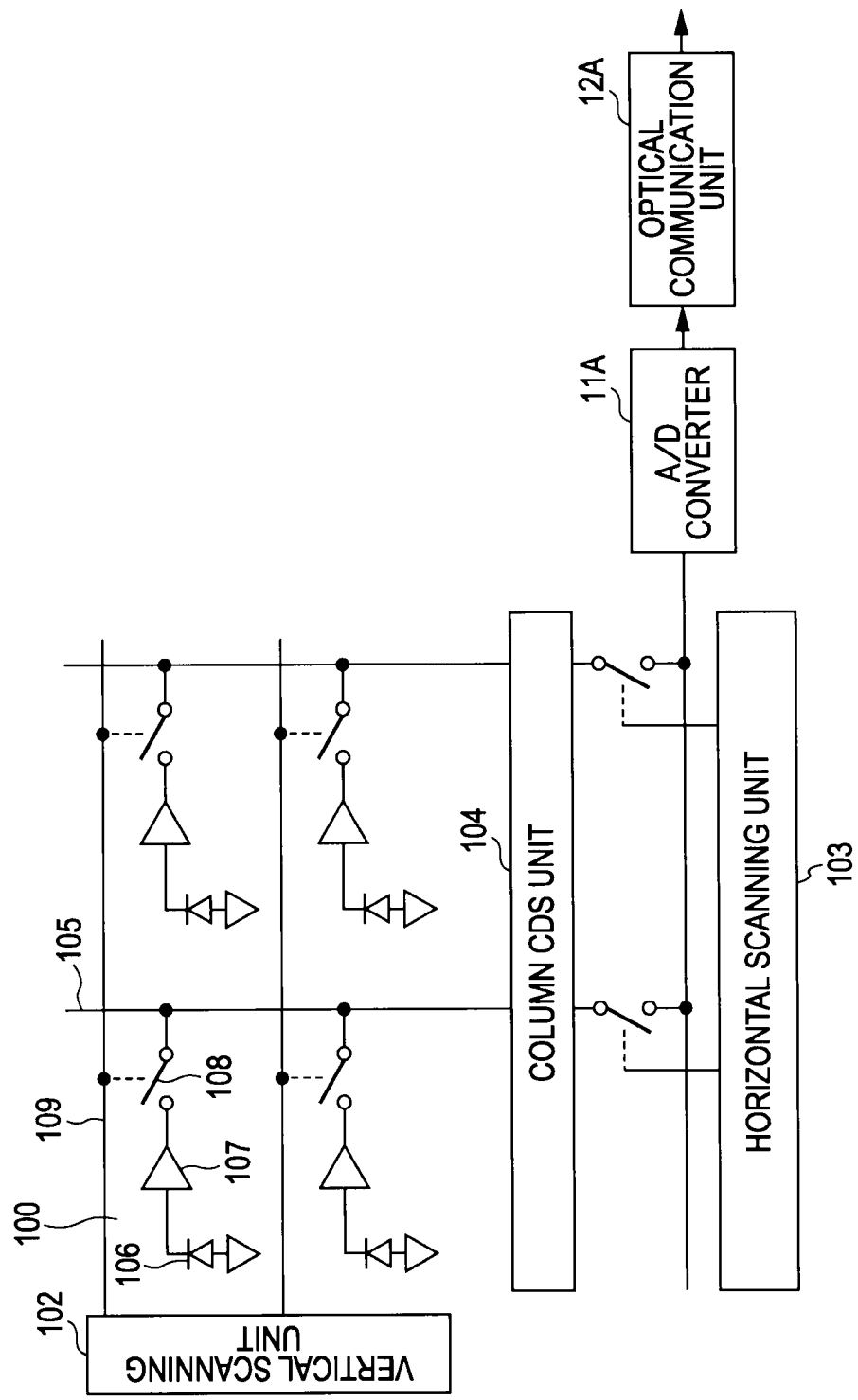
FIG. 17 is a circuit diagram illustrating a specific pixel array.
Figure 18:
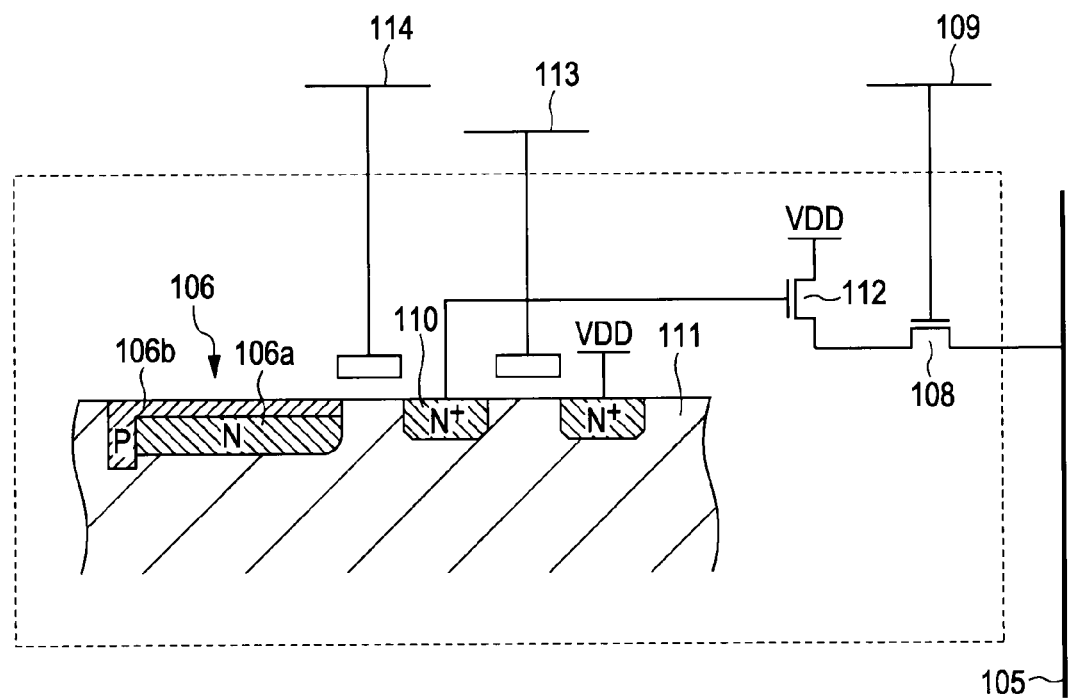
FIG. 18 is a sectional view of a structural model of each pixel.

FIGS. 17 and 18 illustrate the structure of each pixel and a mechanism of reading a pixel signal. FIG. 17 is a circuit diagram specifically illustrating the pixel array 101. FIG. 18 is a sectional view of a structural model of each pixel. The pixel 100 includes a photodiode (PD) 106 converting light into electricity (signal charge), a floating diffusion (FD) amplifier 107 amplifying an electrical signal, and a row selection transistor 108 forming a row selection switch. In each pixel 100, the row selection transistor 108 is turned on and off in response to the signal supplied via a row selection line 109 connected to the vertical scanning unit 102. An electrical signal amplified by the FD amplifier 107 is output via a column signal line 105.

The FD amplifier 107 includes a (FD) charge detector 110, a reset transistor 111, and an amplifier transistor 112. The FD amplifier 107 amplifies a charge photoelectrically converted during a storage period.

When the storage period ends in the FD amplifier 107, the charge detector 110 is reset by a reset line 113 forming a reset gate (Rst) before outputting the signal. The voltage of the charge detector 110 reset is connected to the gate of the amplifier transistor 112. The reset level in a signal-free state is output from the source of the amplifier transistor 112 to the column signal line 105.

Immediately subsequent to the output of the reset level, the signal charge is read into the charge detector 110 from the photodiode 106 via a row read line 114 forming a reading gate (Rd). When the row read line 114 is closed subsequent to the transfer of the signal charge, the voltage of the charge detector 110 changes by an excursion responsive to the intensity of light incident on the photodiode 106. The signal level in the signal present state is thus output from the amplifier transistor 112 to the column signal line 105.

The photodiode 106 illustrated in FIG. 18 is referred to as an embedded photodiode having a p-type region 106b formed on an n-type region 106a. The p-type region 106b controls the generation of a dark current, thereby reducing fixed pattern noise (FPN) caused by the dark current.

Summary of Signal Processing System Including the Solid-State Imager

Figure 19:
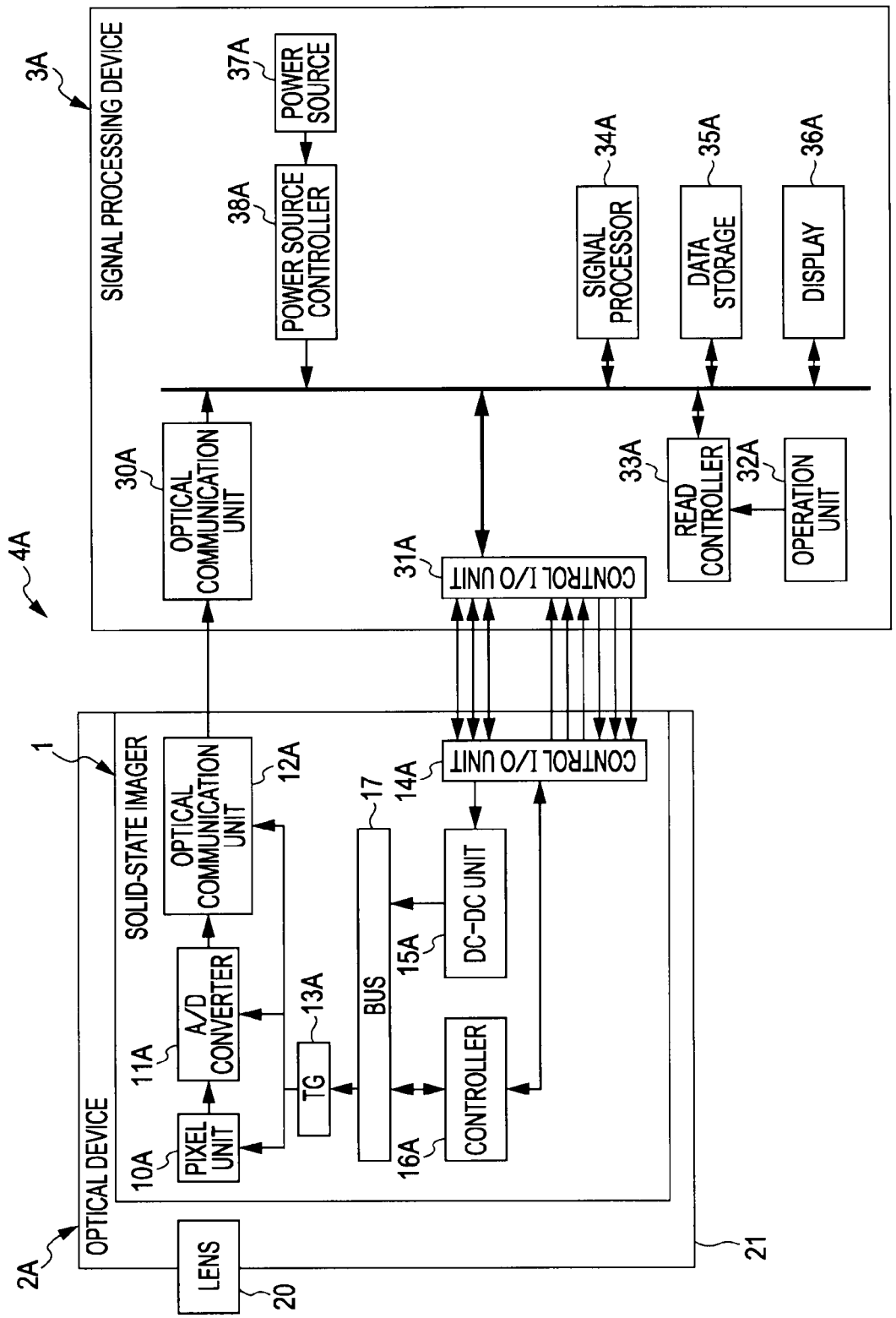
FIG. 19 is a functional block diagram diagrammatically illustrating a signal processing system including the solid-state imager.

FIG. 19 is a block diagram generally illustrating a signal processing system including the solid-state imager 1. An optical device 2A including the solid-state imager 1 is described first. The optical device 2A includes solid-state imager 1, lens section 20, and housing 21 containing the solid-state imager 1 and the lens section 20. The optical device 2A is a lens unit of a camera system, for example. The lens section 20 is one example of an optical element, and includes one lens or a combination of a plurality of lenses.

The optical device 2A is so arranged that the pixel unit 10A in the solid-state imager 1 is aligned with a focal point of the lens section 20. An image of light input through the lens section 20 is thus focused on the pixel unit 10A in the solid-state imager 1.

The optical device 2A places the focal point of the lens section 20 at the pixel unit 10A in the solid-state imager 1 regardless of the distance to an imaging target. The optical device 2A thus includes a mechanism to move the lens section 20 in an optical axis with respect to the solid-state imager 1.

A signal processing device 3A connected to the optical device 2A is described below. The signal processing device 3A includes an optical communication unit 30A converting a light signal into an electrical signal, and a control input/output unit 31A inputting and outputting control signals. The signal processing device 3A is a camera main unit of the camera system, for example. When the optical device 2A is connected to the signal processing device 3A, the optical communication unit 30A is optically coupled with the optical communication unit 12A in the solid-state imager 1. The control input/output unit 31A is also connected to the control input/output unit 14A in the solid-state imager 1.

The signal processing device 3A includes an operation unit 32A receiving a user operational input, and a read controller 33A instructing the solid-state imager 1 in the optical device 2A to read the pixel data in response to the operation of the operation unit 32A.

Through the control input/output unit 31A, the signal processing device 3A instructs the solid-state imager 1 in the optical device 2A to read the pixel data, and performs optical communications between the optical communication unit 30A of own device and the optical communication unit 12A in the solid-state imager 1 to acquire the pixel data from the solid-state imager 1.

The optical communication unit 30A includes a light receiving element such as a photodiode or the like, and receives the signal light Ls output from the optical communication unit 12A in the solid-state imager 1. The optical communication unit 30A converts the pixel data input in the form of the light signal into an electrical signal, and outputs the resulting electrical signal.

In the arrangement in which the optical communication unit 12A in the solid-state imager 1 includes a light modulator modulating the light input from the outside, the optical communication unit 30A in the signal processing device 3A includes a light emitter that outputs the light to be directed to the light modulator of the solid-state imager 1. The light emitter includes a light emitting element such as a semiconductor laser, and outputs continuous and constant light L.

The signal processing device 3A includes a signal processor 34A. The signal processor 34A performs a predetermined process on the pixel data acquired through optical communications with the solid-state imager 1, thereby producing image data. The signal processing device 3A also includes a data storage 35A storing the pixel data acquired from the solid-state imager 1 and a display 36A displaying an image responsive to the image data generated by the signal processor 34A.

The signal processing device 3A further includes a power source 37A supplying power to own device and the optical device 2A, and a power source controller 38A controlling the supplying of power. The power source controller 38A switches on and off the power to the signal processing device 3A. More specifically, the power source controller 38A performs power source supply control by switching between supplying power to the signal processing device 3A and supplying power to the optical device 2A.

A signal processing system 4A including the optical device 2A and the signal processing device 3A is described below. The signal processing system 4A is a camera system including the optical device 2A and the signal processing device 3A. In the camera system, the optical device 2A forming the lens unit is detachably mounted on the signal processing device 3A forming the camera main unit.

When the optical device 2A is connected to the signal processing device 3A in the signal processing system 4A, the optical communication unit 30A in the signal processing device 3A is optically coupled to the optical communication unit 12A in the solid-state imager 1 forming the optical device 2A. Also, the control input/output unit 31A in the signal processing device 3A is connected to the control input/output unit 14A in the solid-state imager 1.

The optical communication unit 12A in the solid-state imager 1 and the optical communication unit 30A in the signal processing device 3A in the signal processing system 4A cause data to be exchanged in the form of light signals between the optical device 2A and the signal processing device 3A.

The control input/output unit 31A in the signal processing device 3A and the control input/output unit 14A in the solid-state imager 1 in the signal processing system 4A cause the control signals to be exchanged between the signal processing device 3A and the optical device 2A. Moreover, the control input/output unit 31A in the signal processing device 3A and the control input/output unit 14A in the solid-state imager 1 in the signal processing system 4A cause the signal processing device 3A to supply power to the optical device 2A.

The operation unit 32A in the signal processing device 3A in the signal processing system 4A receives a user operation input. In response to the user operation input on the operation unit 32A, the read controller 33A in the signal processing device 3A outputs a control signal to read the pixel data.

The control input/output unit 31A in the signal processing device 3A and the control input/output unit 14A in the solid-state imager 1 in the signal processing system 4A inputs the control signal to read the pixel data to the solid-state imager 1 in the optical device 2A.

When the control signal to read the pixel data is input to the solid-state imager 1 in the optical device 2A in the signal processing system 4A, the controller 16A in the solid-state imager 1 causes the timing generator 13A to generate a drive clock.

The drive clock generated by the timing generator 13A is supplied to each of the pixel unit 10A, the analog-to-digital converter 11A, and the optical communication unit 12A. The pixel data is read from the pixel unit 10A as an electrical signal. The analog-to-digital converter 11A receives the pixel data read from the pixel unit 10A and converts the pixel data into a digital signal. The optical communication unit 12A receives the digital signal supplied by the analog-to-digital converter 11A and converts the digital signal into the signal light Ls and outputs the signal light Ls. In the arrangement where the optical communication unit 12A in the solid-state imager 1 modulates the light input from the outside, the optical communication unit 12A modulates the constant light input from the signal processing device 3A with the electrical digital signal supplied by the analog-to-digital converter 11A, and outputs the signal light Ls.

The optical communication unit 12A in the solid-state imager 1 and the optical communication unit 30A in the signal processing device 3A in the signal processing system 4A operate so that the pixel data read by the solid-state imager 1 is input to the signal processing device 3A through optical communications.

When the pixel data read by the solid-state imager 1 is input to the signal processing device 3A in the signal processing system 4A, the optical communication unit 30A in the signal processing device 3A converts the pixel data input as the light signal into an electrical signal and outputs the resulting electrical signal.

In the signal processing system 4A, the signal processor 34A in the signal processing device 3A performs the predetermined signal process on the electrical signal converted pixel data provided from the optical communication unit 30A in the signal processing device 3A, thereby generating the image data. The image responsive to the image data is thus displayed on the display 36A.

Internal Layout of Elements of the Optical Communication Unit of the Solid-State Imager The optical communication unit in the solid-state imager of each embodiment of the present invention includes as a light transmitter a self-luminous type light emitting element or an external-modulation type light modulator, and a driver for the light emitting element or the light modulator. An appropriate layout of the light emitting element or the light modulator and the driver thereof is described below.

Figure 20:
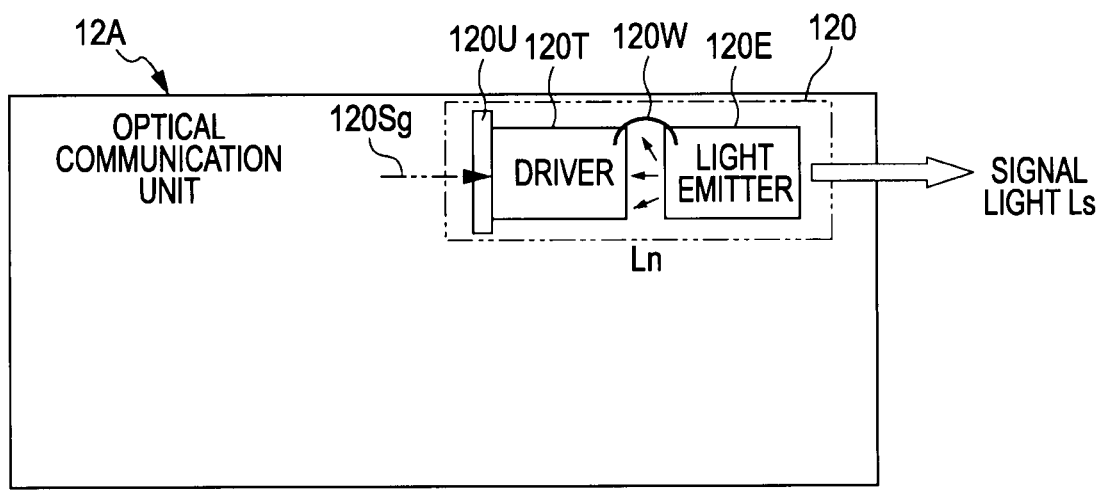
FIG. 20 is a plan view diagrammatically illustrating a first layout example of elements forming the optical communication unit.
Figure 21:
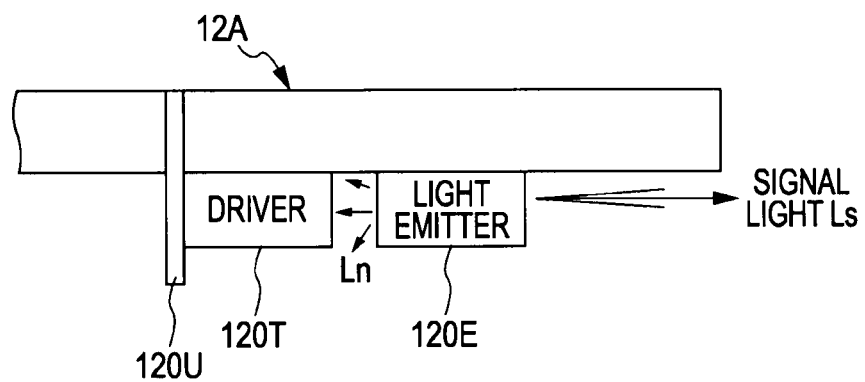
FIG. 21 is a side view diagrammatically illustrating the first layout example of the elements forming the optical communication unit.

(1) First Layout Example of One Light Transmitter Having Self-Luminous Light Emitting Element FIGS. 20 and 21 illustrate a first layout example of elements of the optical communication unit. FIG. 20 is a plan view diagrammatically illustrating the first layout example of the elements of the optical communication unit, and FIG. 21 is a side view diagrammatically illustrating the first layout example of the elements of the optical communication unit 12A.

Referring to FIGS. 20 and 21, the optical communication unit 12A in the solid-state imager 1 includes one self-luminous light emitting element as the light transmitter 120. The light transmitter 120 includes a light emitter 120E including an edge emitting semiconductor laser.

The light emitter 120E has a light emitting surface on one side face, and outputs the signal light Ls in a direction denoted by an arrow. The light emitter 120E emits a slight amount of leaked light Ln from the side face opposite the light emitting surface in a direction denoted by arrows.

The light transmitter 120 includes a driver 120T driving the light emitter 120E. The driver 120T is arranged in head-on alignment with the light emitter 120E in the output direction of the signal light Ls. The driver 120T thus faces the side face of the light emitter 120E through which the leaked light Ln is output. The driver 120T is supplied with an digital-signal converted electrical signal transferred via a signal line (not shown) from the top surface to the bottom surface of the substrate 18, for example, a drive signal line 120Sg denoted by an arrow-headed two-dot-and chain line opposite from the side of the light emitter 120E. If the light emitter 120E is separately arranged from the driver 120T in the light transmitter 120, the driver 120T and the light emitter 120E are connected to each other via a bonding wire 120W to exchange an electrical signal. If the light emitter 120E is integrated with the driver 120T in the light transmitter 120, the driver 120T is connected to the light emitter 120E via a wiring layer of aluminum or tungsten within a semiconductor body to exchange an electrical signal.

The optical communication unit 12A includes a light blocker 120U blocking leaked light Ln output from the light emitter 120E. The light blocker 120U is manufactured of a material that does not allow light rays at least having an light oscillation wavelength of the light emitter 120E to pass therethrough. The light blocker 120U faces the side face of the light emitter 120E outputting the leaked light Ln.

Since the driver 120T and the light emitter 120E are arranged in a head-on fashion, the light blocker 120U is placed next to the driver 120T opposite the side of the light emitter 120E. The leaked light Ln output from the light emitter 120E is thus blocked by the light blocker 120U.

The light blocker 120U may be manufactured of a material having not only the light blocking feature but also a predetermined heat conductivity. The light blocker 120U thus functions as a heat insulator for insulating and radiating heat generated by the light emitter 120E.

Referring to FIGS. 20 and 21, the light blocker 120U has the light blocking and heat insulation features to the light emitter 120E. The driver 120T is cascaded with the light emitter 120E in a head-on fashion in the direction of light emission. If the light transmitters 120 are arrayed with the light emitter 120E cascaded in a head-one fashion with the driver 120T, no driver 120T is arranged between adjacent light emitters 120E, and miniaturization may be implemented.

Figure 22:
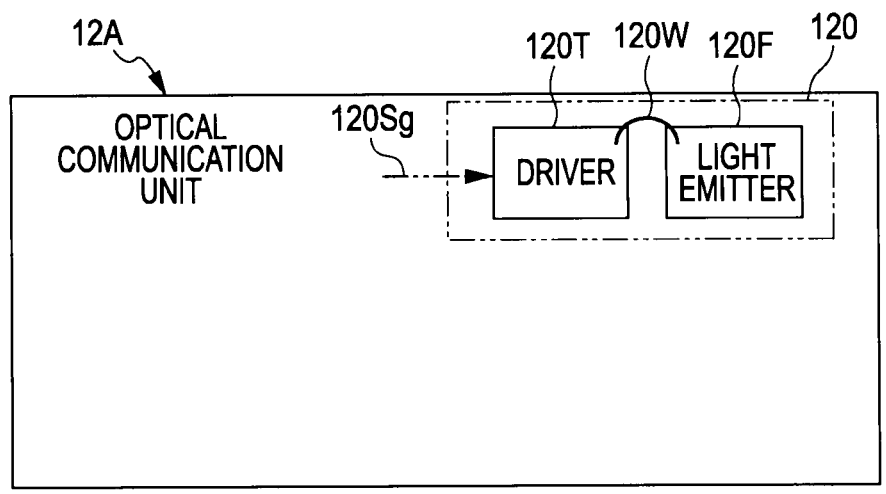
FIG. 22 is a plan view diagrammatically illustrating a second layout example of elements forming the optical communication unit.
Figure 23:
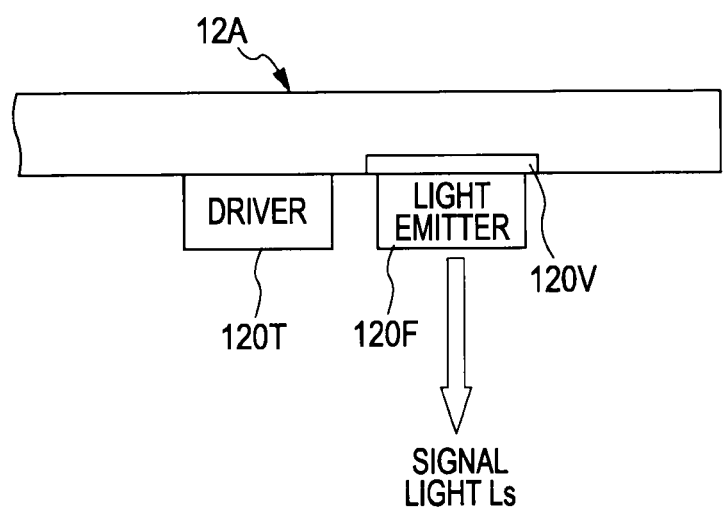
FIG. 23 is a side view diagrammatically illustrating the second layout example of the elements forming the optical communication unit.

(2) Second Layout Example of One Light Transmitter Having Self-Luminous Light Emitting Element FIGS. 22 and 23 illustrate a second layout example of elements of the optical communication unit 12A. FIG. 22 is a plan view diagrammatically illustrating the second layout of the elements the optical communication unit 12A and FIG. 23 is a side view diagrammatically illustrating the second layout of the elements of the optical communication unit 12A.

Referring to FIGS. 22 and 23, the optical communication unit 12A in the solid-state imager 1 includes one self-luminous light emitting element as the light transmitter 120. The light emitting element is a light emitter 120F formed of a surface emitting semiconductor laser such as the vertical cavity surface emitting laser (VCSEL) illustrated in FIG. 6.

The light emitter 120F has the emitting surface on the bottom surface thereof, and emits the signal light Ls in the direction denoted by an arrow as illustrated in FIG. 23. The light emitter 120F also emits a small amount of leaked light from the top surface thereof opposite the bottom surface thereof.

The light transmitter 120 includes the driver 120T driving the light emitter 120F. The driver 120T is cascaded with the light emitter 120F. The driver 120T is supplied with an digital-signal converted electrical signal transferred via a signal line (not shown) from the top surface to the bottom surface of the substrate 18, for example, a drive signal line 120Sg denoted by an arrow-headed two-dot-and chain line opposite the side of the light emitter 120F. If the light emitter 120F is separately arranged from the driver 120T in the light transmitter 120, the driver 120T and the light emitter 120E are connected to each other via a bonding wire 120W to exchange an electrical signal. If the light emitter 120E is integrated with the driver 120T in the light transmitter 120, the driver 120T is connected to the light emitter 120E via a wiring layer of aluminum or tungsten within a semiconductor body to exchange an electrical signal.

The optical communication unit 12A includes a light blocker 120V blocking leaked light Ln output from the light emitter 120F. The light blocker 120V is manufactured of a material that does not allow light rays at least having an light oscillation wavelength of the light emitter 120F to pass therethrough. The light blocker 120V faces the top surface of the light emitter 120f outputting the leaked light Ln. The leaked light output from the light emitter 120F is thus blocked by the light blocker 120V.

The light blocker 120V may be manufactured of a material having not only the light blocking feature but also a predetermined heat conductivity. The light blocker 120V thus functions as a heat insulator for insulating and radiating heat generated by the light emitter 120E.

Referring to FIGS. 22 and 23, the light blocker 120V has the light blocking and heat insulation features to the light emitter 120F. The driver 120T is cascaded with the light emitter 120F in a head-on fashion. If the light transmitters 120 are arrayed with the driver 120T cascaded with the light emitter 120F in a head-on fashion, no driver 120T is arranged between adjacent light emitters 120F, and miniaturization may be implemented.

Figure 24:
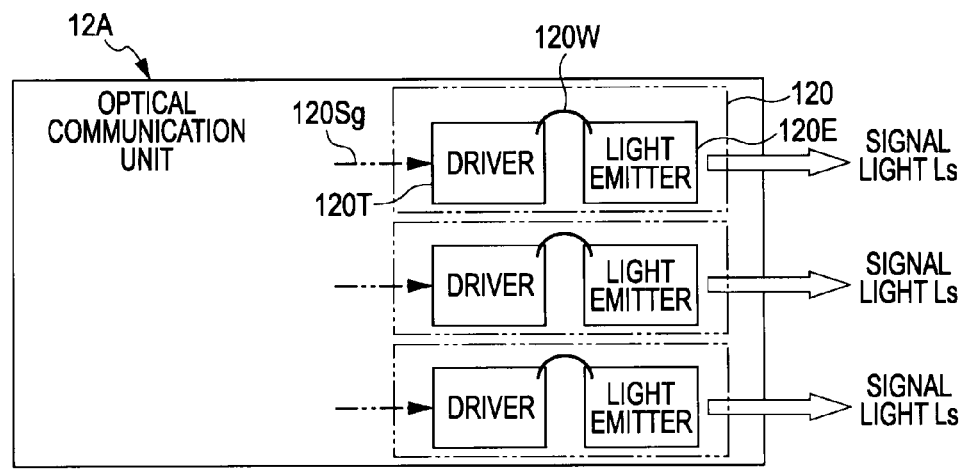
FIG. 24 is a plan view diagrammatically illustrating a third layout example of elements forming the optical communication unit.

(3) Third Layout Example of Array of the Light Transmitters Having Self-Luminous Light Emitting Elements FIG. 24 is a plan view diagrammatically illustrating a third layout example of the elements of the optical communication unit 12A. Referring to FIG. 24, the light emitter 120E of a self-luminous semiconductor laser is included as a light emitting element. The light transmitters 120, each including the light emitter 120E and the driver 120T, are arrayed.

As described above, the driver 120T is cascaded in the direction in which the light emitter 120E emits light. The light transmitters 120 are arrayed in parallel while the light emitter 120E and the driver 120T are cascaded in a head-on fashion.

In this arrangement, the light emitters 120E are arranged side by side, and the drivers 120T arranged side by side. No driver 120T is interposed between any two adjacent light emitters 120E. The optical communication unit 12A can be miniaturized. Even if the edge emitting semiconductor laser is replaced with the surface emitting semiconductor laser in FIG. 24, the same advantage is provided. Optionally, the light blocker blocking the leaked light output from the light emitter may be arranged as illustrated in FIG. 21 or 23 so that the light emitter is provided with the light blocking and heat insulation features.

Referring to FIG. 24, the optical communication unit 12A outputs a plurality of light rays Ls in parallel. The pitch of light rays Ls can be determined without taking into consideration the layout of the drivers 120T. The freedom of determining the pitch of arrayed light rays is increased.

Figure 25:
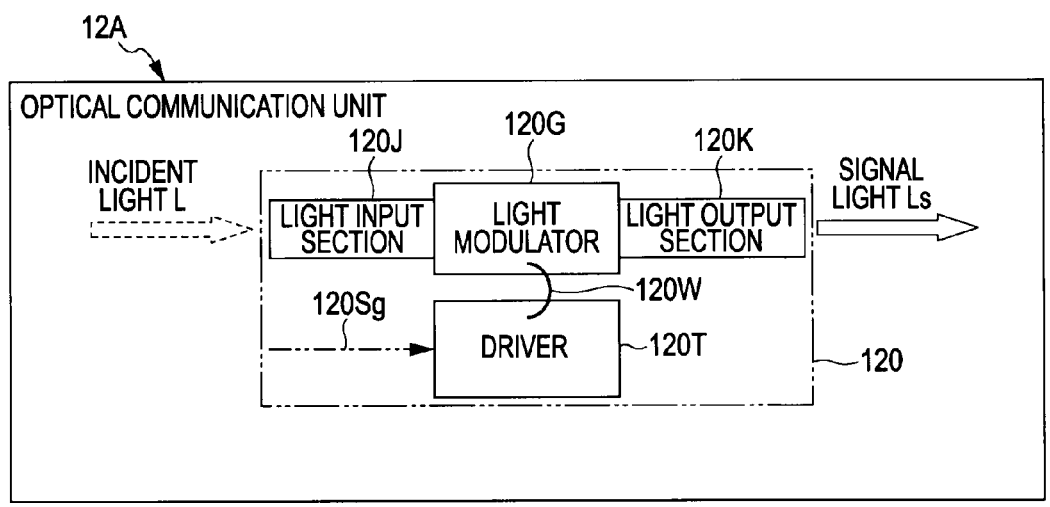
FIG. 25 is a plan view diagrammatically illustrating a fourth layout example of elements forming the optical communication unit.

(4) Fourth Layout Example of One Light Transmitter Including External-Modulation Type Light Modulator FIG. 25 is a plan view diagrammatically illustrating a fourth layout example of the elements forming the optical communication unit 12A. Referring to FIG. 25, the optical communication unit 12A in the solid-state imager 1 includes a single light modulator 120G of external-modulation type as the light transmitter 120. The light modulator 120G may be one of the electro-absorption light modulator 120B described with reference to FIG. 7 and the Mach-Zehnder type light modulator 120C described with reference to FIG. 9.

The light modulator 120G in the light transmitter 120 has one end face thereof serving as a light input terminal and the end face opposite the one end face serving as a light output terminal, and the light input terminal is connected to a light input section 120J formed of a light guide path or the like. The light output terminal is connected to a light output section 120K formed of a light guide path or the like.

The light input section 120J connected to the light modulator 120G receives the constant incident light L in a direction denoted by a broken-outlined arrow. Modulated light Ls is directed in the direction opposite from the direction of incidence of the incident light L and then output from the light output section 120K in the direction denoted by a solid-outlined arrow.

The light transmitter 120 includes the driver 120T driving the light modulator 120G. The driver 120T is arranged alongside the light modulator 120G and at a position perpendicular to the line in which the light modulator 120G receives the incident light L and outputs the signal light Ls. In this arrangement, the incident light L input to the light modulator 120G and the signal light Ls output from the light modulator 120G are not blocked by the driver 120T. The driver 120T is supplied with an digital-signal converted electrical signal transferred via a signal line (not shown) from the top surface to the bottom surface of the substrate 18, for example, a drive signal line 120Sg denoted by an arrow-headed two-dot-and chain line. If the light modulator 120G is separately arranged from the driver 120T in the light transmitter 120, the driver 120T and the light modulator 120G are connected to each other via a bonding wire 120W to exchange an electrical signal. If the light modulator 120G is integrated with the driver 120T in the light transmitter 120, the driver 120T is connected to the light modulator 120G via a wiring layer of aluminum or tungsten within a semiconductor body to exchange an electrical signal.

Figure 26:
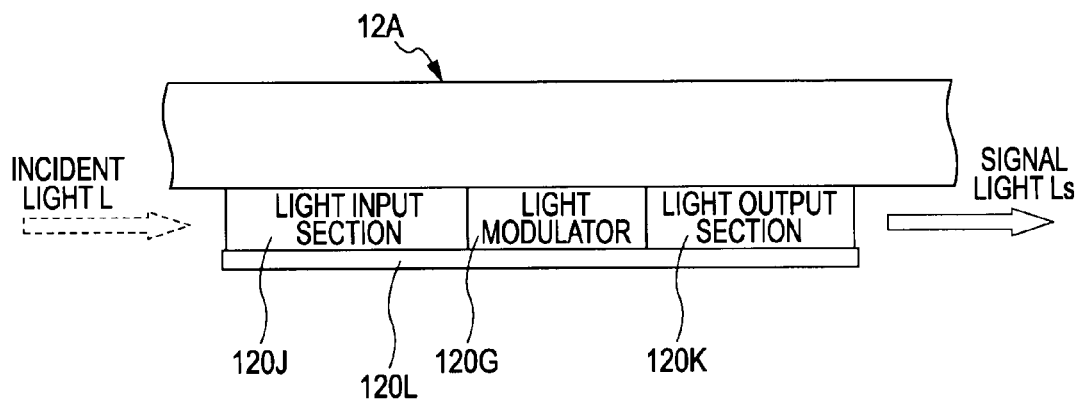
FIG. 26 is a side view diagrammatically illustrating a fifth layout example of elements forming the optical communication unit.
Figure 27:
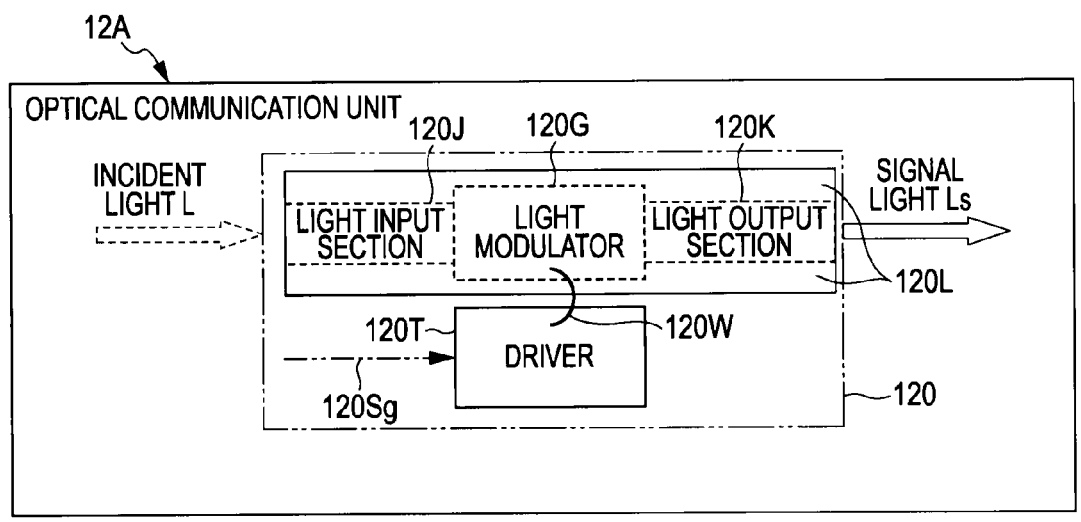
FIG. 27 is a plan view diagrammatically illustrating the fifth layout example of the elements forming the optical communication unit.

(5) Fifth Layout Example of External-Modulation Type Light Modulator with Light Blocker FIGS. 26 and 27 illustrate a fifth layout example of the elements of the optical communication unit 12A. FIG. 26 is a side view diagrammatically illustrating the fifth layout example of the elements of the optical communication unit 12A and FIG. 27 is a plan view diagrammatically illustrating the fifth layout example of the elements of the optical communication unit 12A.

Referring to FIGS. 26 and 27, the optical communication unit 12A in the solid-state imager 1 includes a single light modulator 120G of external-modulation type described above. The optical communication unit 12A includes the light input section 120J and the light output section 120K, connected to the light modulator 120G, and a light blocker 120L.

The light L from the outside is incident in a horizontal direction on the light input section 120J connected to the light modulator 120G. The modulated signal light Ls is output in a horizontal direction from the light output section 120K. The light blocker 120L covers the side face and bottom surface of the light input section 120J and the light output section 120K excluding the side faces serving as the light input area of the light input section 120J and the light output area of the light output section 120K.

The whole undersides of the light input section 120J and the light output section 120K may be covered with light blocker so that no leaked light is incident on the substrate forming the optical communication unit 12A. Moreover, the light input section 120J and the light output section 120K and the light modulator 120G may be covered with the light blocker 120L so that no light leaks from the junction between the light input section 120J and the light modulator 120G and the junction between the light output section 120K and the light modulator 120G.

This arrangement prevents the light L input to the light input section 120J and guided to the light modulator 120G from leaking from the light input section 120J. Furthermore, this arrangement prevents the signal light Ls output from the light modulator 120G and guided to the light output section 120K from leaking from an area other than the output area of the light output section 120K.

Figure 28:
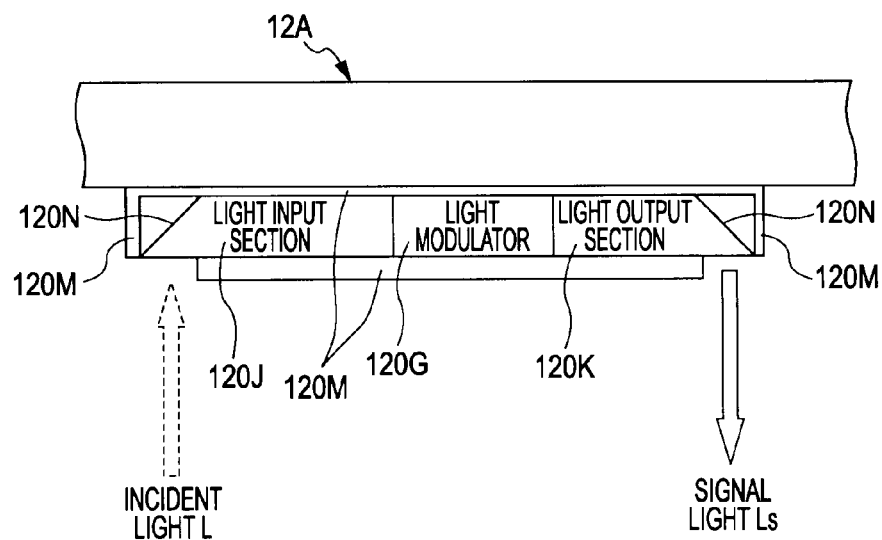
FIG. 28 is a side view diagrammatically illustrating a sixth layout example of elements forming the optical communication unit.
Figure 29:
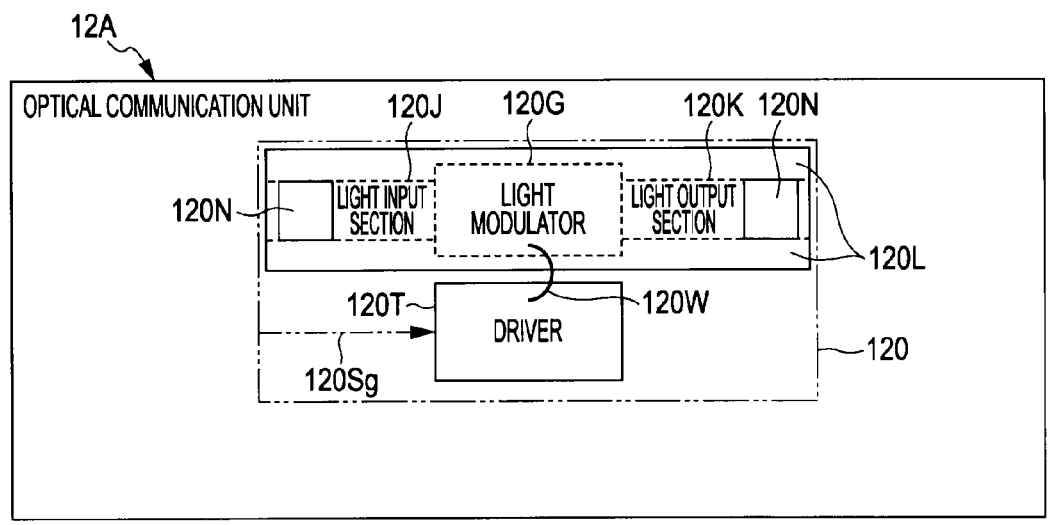
FIG. 29 is a plan view diagrammatically illustrating the sixth layout example of the elements forming the optical communication unit.

(6) Sixth Layout Example of the External-Modulation Type Light Modulator with Light Blocker FIGS. 28 and 29 illustrate a sixth layout example of the elements of the optical communication unit 12A. FIG. 28 is a side view diagrammatically illustrating the sixth layout example of the elements of the optical communication unit 12A and FIG. 29 is a plan view diagrammatically illustrating the sixth layout example of the elements of the optical communication unit 12A.

Referring to FIGS. 28 and 29, the optical communication unit 12A in the solid-state imager 1 includes a single light modulator 120G of external-modulation type described above. The optical communication unit 12A includes the light input section 120J and the light output section 120K, connected to the light modulator 120G, and a light blocker 120M.

A reflective surface 120N having a slant angle of 45° is formed in the light input portion of the light input section 120J. The light L from the outside is incident at a right angle on the light input section 120J. Similarly, another reflective surface 120N having a slant angle of 45° is formed in the light output portion of the light output section 120K. The modulated signal light Ls output at a right angle from the light output section 120K.

The light blocker 120M covers the side faces, the entire top surfaces, and the bottom surfaces of the light input section 120J and the light output section 120K excluding parts of the bottom surfaces as the light input area of the light input section 120J and the light output area of the light output section 120K.

The light input section 120J and the light output section 120K and the light modulator 120G may be covered with the light blocker 120L so that no light leaks from the junction between the light input section 120J and the light modulator 120G and the junction between the light output section 120K and the light modulator 120G.

This arrangement prevents the light L input to the light input section 120J and guided to the light modulator 120G from leaking from the light input section 120J as a result of reflection or other reasons. Furthermore, this arrangement prevents the signal light Ls output from the light modulator 120G and guided to the light output section 120K from leaking from an area other than the output area of the light output section 120K as a result of reflection or other reasons.

Figure 30:
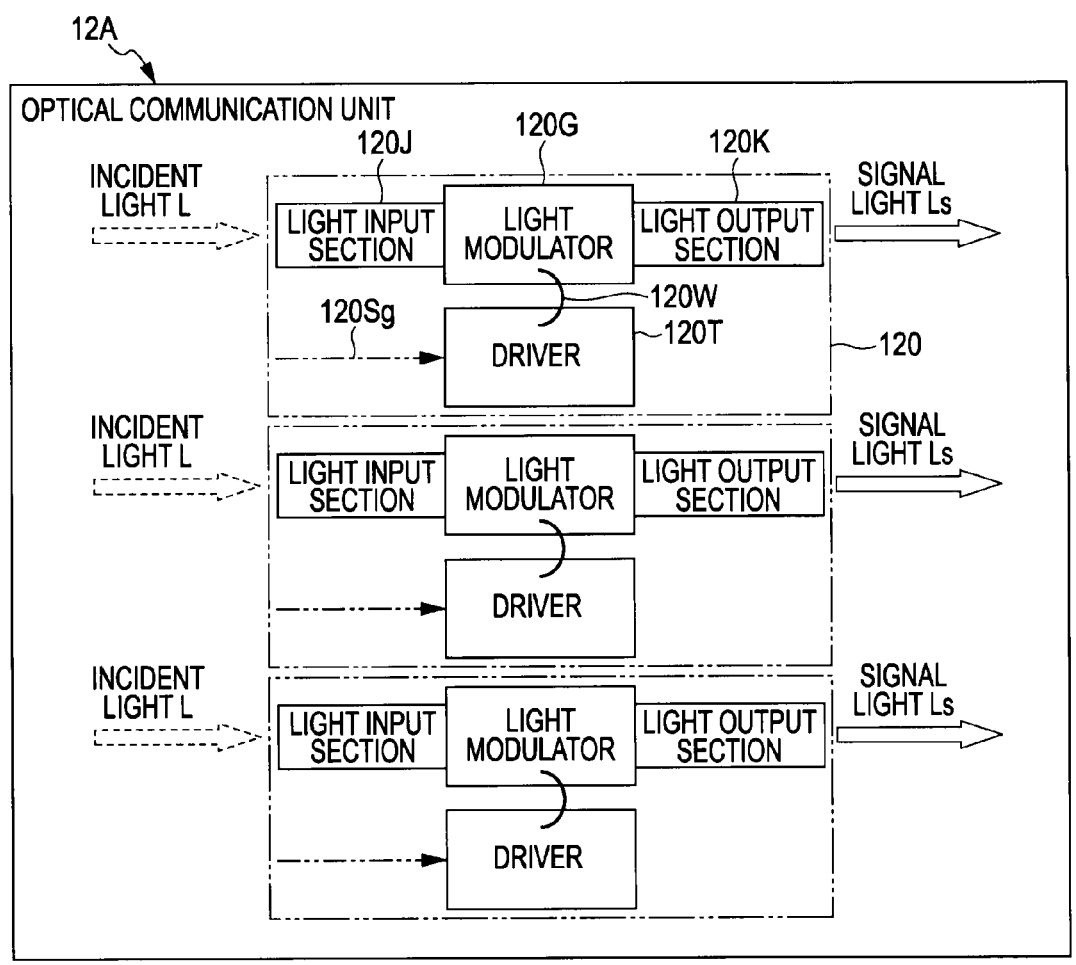
FIG. 30 is a plan view diagrammatically illustrating a seventh layout example of elements forming the optical communication unit.

(7) Seventh Layout Example of Arrayed Light Transmitters Including External-Modulation Type Light Modulators FIG. 30 is a plan view diagrammatically illustrating a seventh layout example of the elements of the optical communication unit 12A. Referring to FIG. 30, the optical communication unit 12A in the solid-state imager 1 includes the light modulator 120G of external-modulation type previously described. The light transmitters 120, each including the light modulator 120G and the driver 120T, are arrayed.

The light modulator 120G is connected to the light input section 120J at one end face thereof and to the light output section 120K at the other end face thereof. The driver 120T is thus arranged alongside the light modulator 120G. The light transmitters 120 are arrayed in a direction perpendicular to the line in which the light modulator 120G receives the incident light L and outputs the signal light Ls. The light modulator 120G and the driver 120T are alternately arranged alongside each other. In FIG. 30, the light blocker discussed with reference to FIGS. 26-29 may be used to prevent light from being leaked from the light input sections 120J and the light output sections 120K in an array structure.

(8) Eighth Layout Example of One Light Modulator of External-Modulation Type

Figure 31:
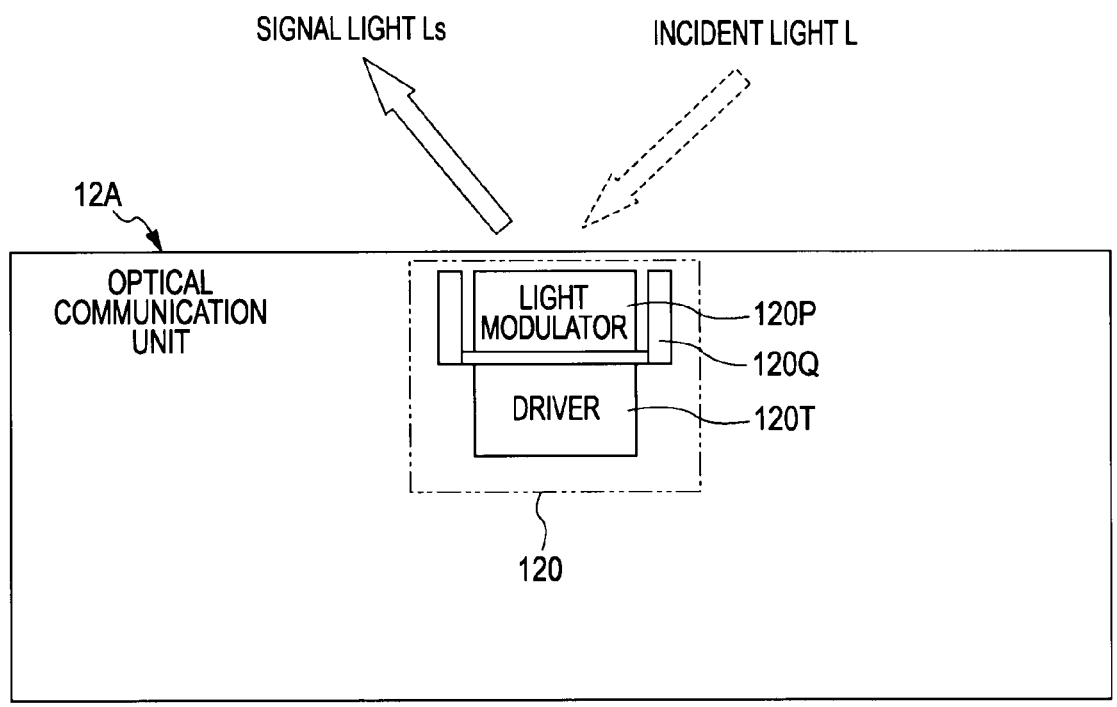
FIG. 31 is a plan view diagrammatically illustrating an eighth layout example of elements forming the optical communication unit.
Figure 32A:
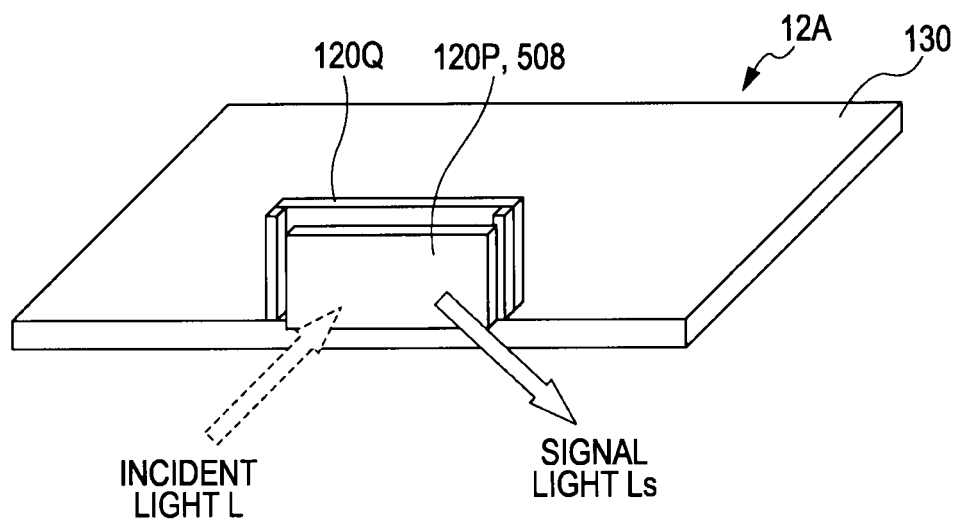
FIGS. 32A and 32B are perspective views diagrammatically illustrating the eighth layout example of the elements forming the optical communication unit.
Figure 32B:
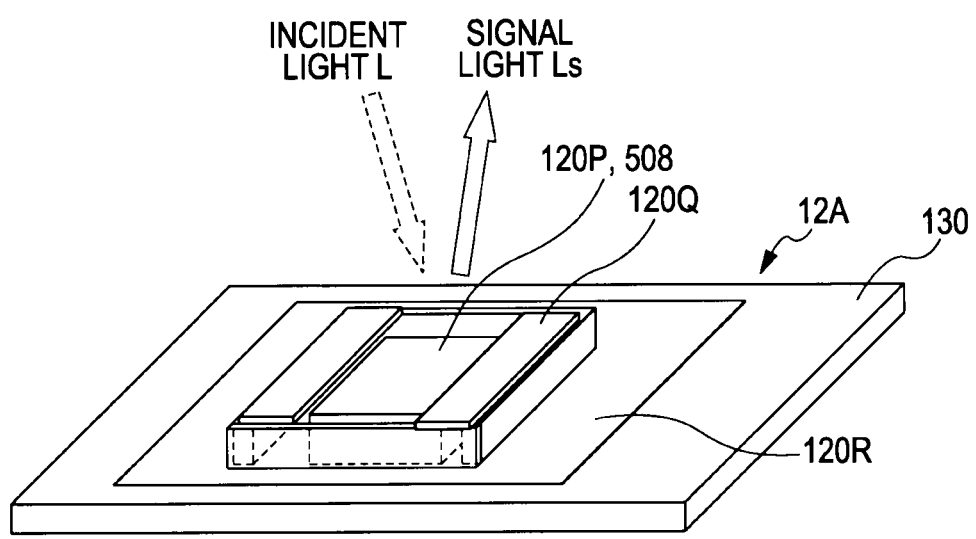

FIGS. 31 and 32A and 32B illustrate an eighth layout example of the elements of the optical communication unit 12A. FIG. 31 is a plan view diagrammatically illustrating the sixth layout example of the elements of the optical communication unit 12A and FIGS. 32A and 32B are a perspective views diagrammatically illustrating the eighth layout example of the elements of the optical communication unit 12A.

Referring to FIGS. 31 and 32A and 32B, the optical communication unit 12A in the solid-state imager 1 includes a light modulator 120P of external-modulation type as the light transmitter 120. The light modulator 120P includes the mirror device 120D discussed with reference to FIG. 10.

When the light modulator 120P receives and reflects the light L from the outside, the light modulator 120P switches the reflection direction of the signal light Ls. As illustrated in FIG. 32A, light is incident in a horizontal direction on a substrate 130 with the reflective mirror 508 discussed with reference to FIG. 10 being set in perpendicular to the substrate 130 forming the optical communication unit 12A. T light blocker 120Q is arranged around the light modulator 120P so that the light L incident on the light modulator 120P and the signal light Ls reflected from the light modulator 120P are not leaked in a direction different from a predetermined direction with respect to the light modulator 120P. The driver 120T of the light modulator 120P is arranged behind the light blocker 120Q. Referring to FIG. 32B, light is incident at a right angle on the substrate 130 with the reflective mirror 508 discussed with reference to FIG. 10 arranged in parallel with the substrate 130. The light blocker 120Q is arranged around the light modulator 120P and at a predetermined height from the substrate 130 so that the light L incident on the light modulator 120P and the signal light Ls reflected from the light modulator 120P are not leaked in a direction different from a predetermined direction with respect to the light modulator 120P. A peripheral light blocker 120R blocking light not incident on the light modulator 120P is arranged below an area surrounding the light modulator 120P.

Embodiments of the Optical Communication Unit in Each Signal Transmission Routing The analog-to-digital converted output signal of the analog-to-digital converter 11A discussed with reference to FIG. 3 and other drawings is a parallel signal having a bit number defined by the resolution of the analog-to-digital converter 11A in the solid-state imager 1. The optical communication units 12A supporting the signal transmission of a plurality of bit numbers in optical communications are described below.

Figure 33:
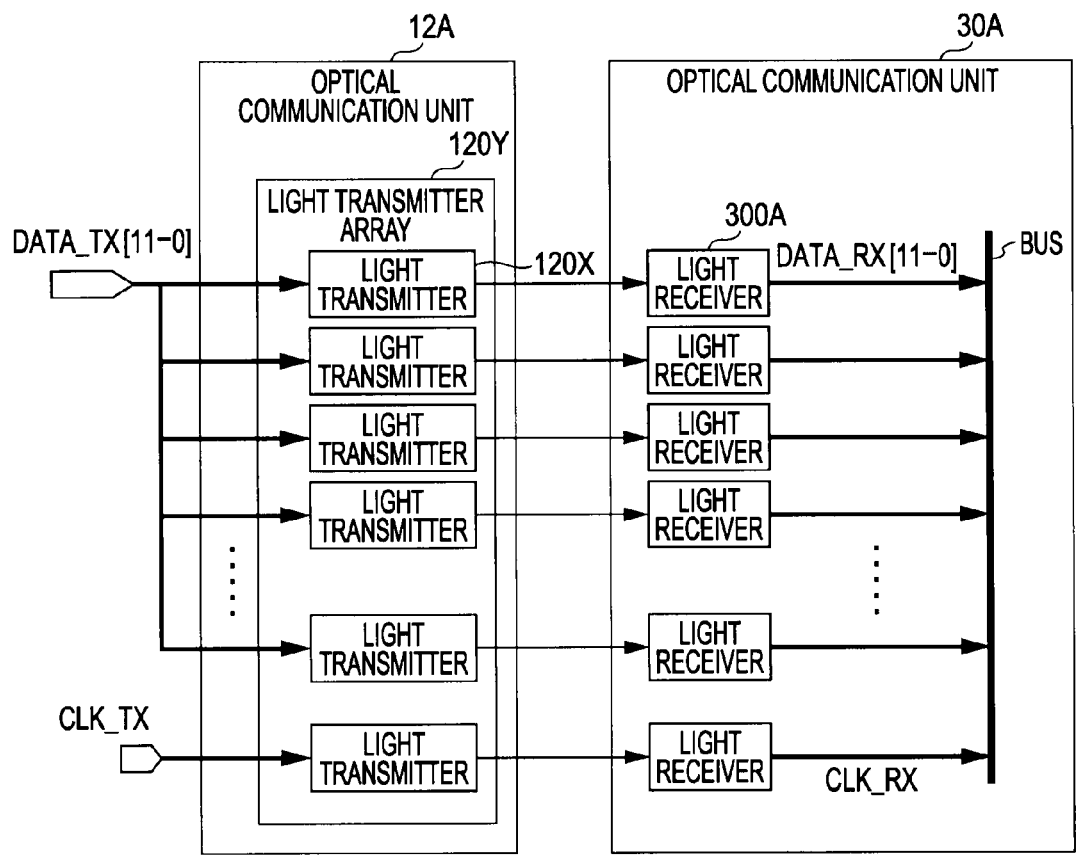
FIG. 33 is a functional block diagram diagrammatically illustrating an arrayed optical communication unit.
Figure 34:
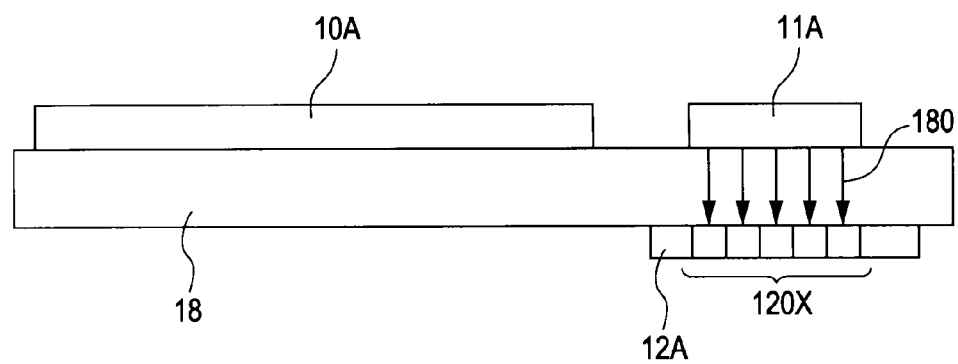
FIG. 34 is a side view diagrammatically illustrating one example of signal transmission routing to the arrayed optical communication unit.

(1) Parallel Transmission Based on the Optical Communication Unit Including Arrayed Light Transmitter FIG. 33 is a functional block diagram of one example of an arrayed optical communication unit 12A. FIG. 34 is a side view diagrammatically illustrating one example of signal transmission routing to the arrayed optical communication unit 12A. The optical communication units 12A supporting the parallel transmission and the signal transmission routing to the optical communication unit 12A are described below.

The optical communication unit 12A in the solid-state imager 1 includes a light transmitter array 120Y including a parallel arrangement of light transmitters 120X, each having a self-luminous light emitting element or an external-modulation type light modulator. The light transmitter array 120Y includes the parallel-arrayed light transmitters 120X of the number matching the number of data lines through which pixel data DATA_TX analog-to-digital converted by the analog-to-digital converter 11A and the number of light signal lines as clock lines through which a clock signal CLK_TX is output.

The solid-state imager 1 of the present embodiment includes the pixel unit 10A and the analog-to-digital converter 11A on the top surface of the substrate 18 and the optical communication unit 12A on the bottom surface of the substrate 18. In the solid-state imager 1 including the optical communication unit 12A composed of the arrayed light transmitters 120x, the digital signal provided by the analog-to-digital converter 11A is transferred to the optical communication unit 12A as a parallel signal. In the solid-state imager 1 having the optical communication unit 12A on the bottom surface of the substrate 18, a plurality of signal lines 180 conducting the digital signal provided by the analog-to-digital converter 11A as the parallel signal are routed from the analog-to-digital converter 11A to the optical communication unit 12A through the substrate 18.

As previously discussed, the solid-state imager 1 performs optical communications with the optical communication unit 30A in the signal processing device 3A discussed with reference to FIG. 19. The optical communication unit 30A in the signal processing device 3A includes light receivers 300A of the number equal to the number of light signal lines from the solid-state imager 1.

The optical communication unit 12A in the solid-state imager 1 receives the pixel data DATA_TX analog-to-digital converted by the analog-to-digital converter 11A and the clock signal CLK_TX generated by the timing generator 13A discussed with reference to FIG. 16. The pixel data DATA_TX as a digital signal and the clock signal CLK_TX are converted into light signals by the corresponding light transmitter 120X in the light transmitter array 120Y and the light signals are then output.

The light signal output from the optical communication unit 12A in the solid-state imager 1 is input to the optical communication unit 30A in the signal processing device 3A, and is then converted into an electrical signal by the corresponding light receiver 300A. The pixel data DATA_TX and the clock signal CLK_TX are then output.

(2) Serial Transmission with Data Serialized

Figure 35A:
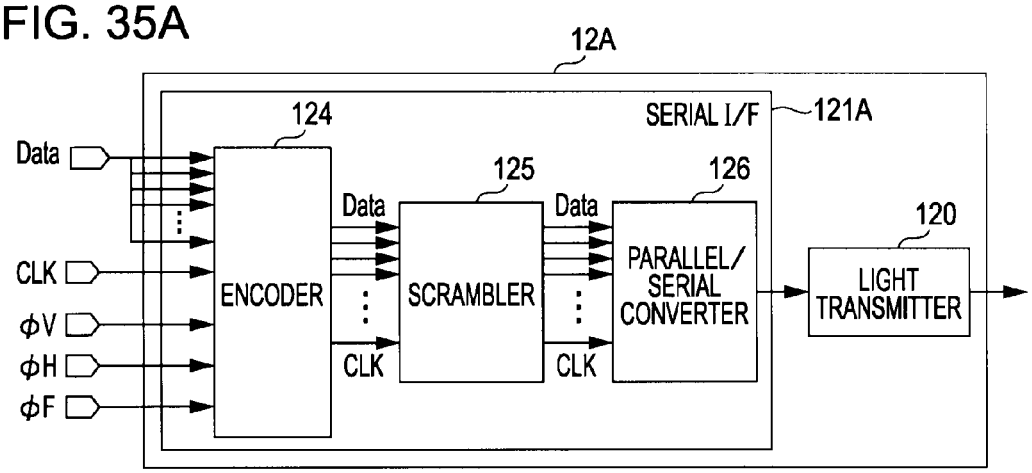
FIGS. 35A-35C are functional block diagrams illustrating one example of the optical communication unit that performs optical communications with pixel data serialized.
Figure 35B:
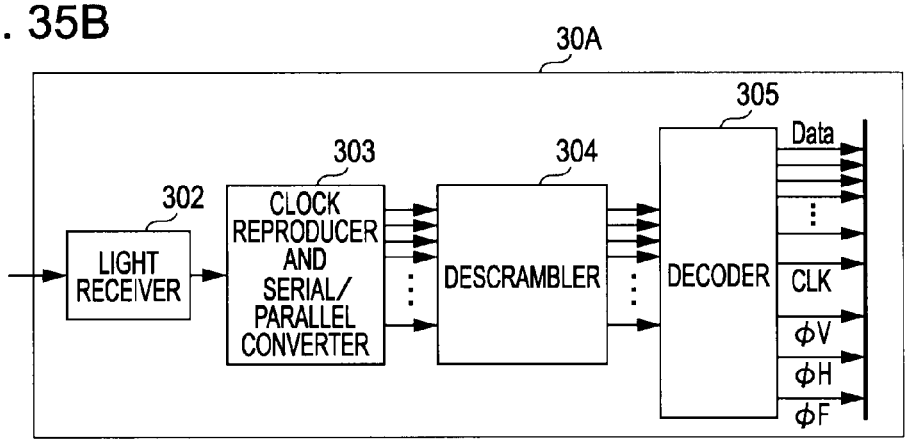
Figure 35C:
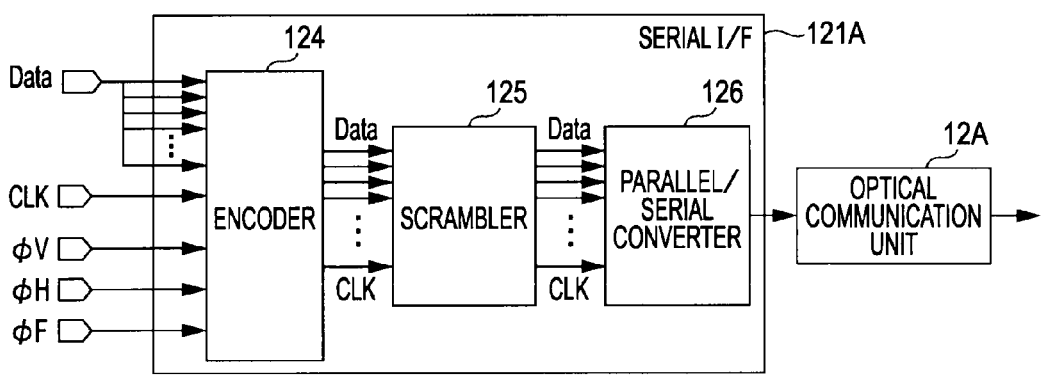
Figure 36A:
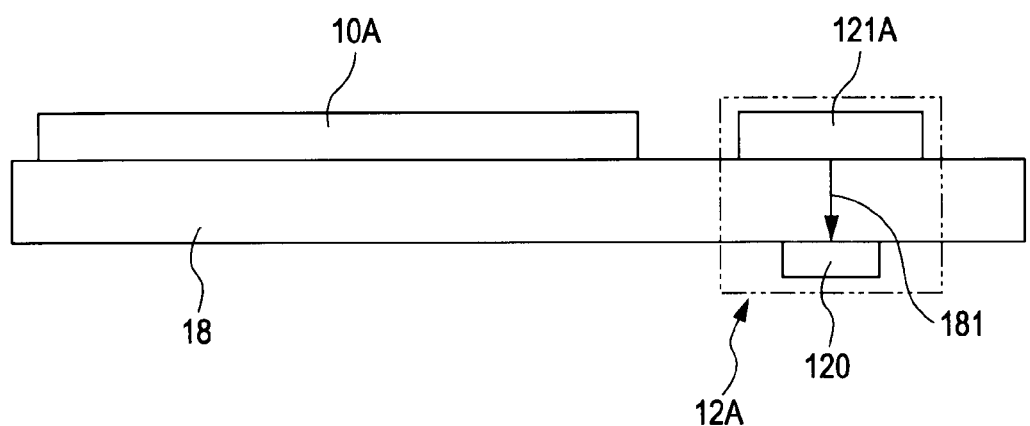
FIGS. 36A and 36B are side views diagrammatically illustrating one example of the signal transmission routing in which the serialized pixel data is transmitted in optical communications to the optical communication unit.
Figure 36B:
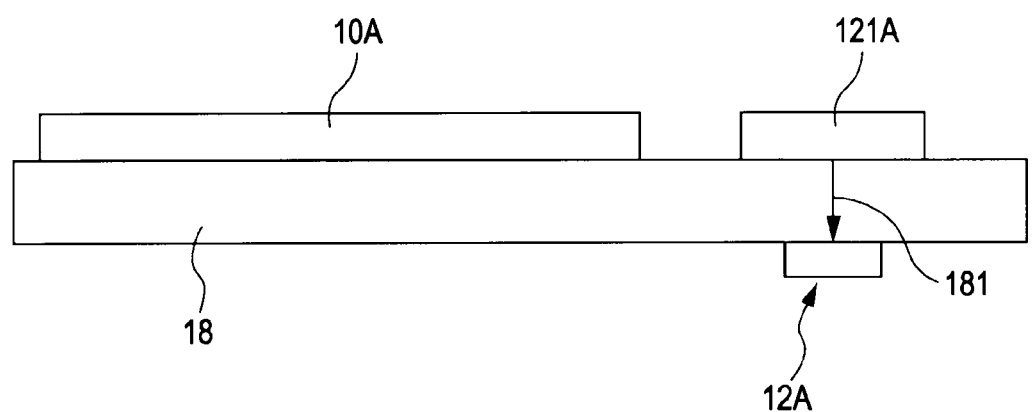

FIGS. 35A-35C are functional block diagrams of the optical communication units 12A and 30A that perform optical communications with the pixel data serialized. FIGS. 36A and 36B are side views of a signal transmission routing to the optical communication unit 12A that communicates the pixel data in a serial format in optical communications. The optical communication unit 12A for serial transmission and the signal transmission routing to the optical communication unit 12A are described below.

In the arrangement in which the digital pixel data provided by the analog-to-digital converter 11A is parallel-transmitted, the number of channels is determined by the number of bit count of the analog-to-digital converter 11A and the bit count of the pixel data defined by a pixel count. If the bit count of the pixel data increases in response to the number of pixels, the number of optical communication units can also increase. An increase in the number of optical communication units leads to a cost increase. In the arrangement in which the optical communication unit includes the light transmitter array supporting multi-bit pixel data, an amount of heat generated in the optical communication unit increases. If the optical communication unit having one light transmitter is arranged on the peripheral region of the substrate in a distributed fashion, the effect of heat and electromagnetic noise generated by the optical communication unit is reduced. On the other hand, however, a distributed source of heat and electromagnetic noise can mean a difficulty in the management of head and electromagnetic noise.

Data is serialized taking into consideration the degree of parallel of the signal transmission and the number of optical communication units mountable, and the wiring to the optical communication unit and the layout and structure of the optical communication unit are determined. The number of the optical communication units is reduced to control the generation of heat and electromagnetic noise.

The optical communication unit 12A in the solid-state imager 1 illustrated in FIGS. 35A and 36A includes a serial interface 121A that converts the digital pixel data provided by the analog-to-digital converter 11A into serial data.

The serial interface 121A includes an encoder 124 that superimposes the pixel data DATA analog-to-digital converted by the analog-to-digital converter 11A onto the synchronization signals generated by the timing generator 13A. The encoder 124 receives a clock signal CLK generated by the timing generator 13A. The encoder 124 also receives a vertical synchronization signal φV driving the vertical scanning unit 102, a horizontal synchronization signal φH driving the horizontal scanning unit 103, and a field signal F selecting a field, each of these signal generated by the timing generator 13A. The encoder 124 supports the 8 B/10 B encoding method, and superimposes the clock signal and the synchronization signals on a data line, and then transmits the resulting signal via a single signal line.

The serial interface 121A includes a scrambler 125 that scrambles the synchronization signal superimposed pixel data, and a parallel/serial converter 126 that converts the scrambled pixel data into serial data. The optical communication unit 12A further includes a light transmitter 120 that converts serialized pixel data and synchronization data into a light signal and outputs the light signal.

Referring to FIG. 35B, the optical communication unit 30A in the signal processing device 3A includes a light receiver 302. The light receiver 302 receives the light signal of the serialized pixel data and synchronization data and converts the input light signal into an electrical signal. The optical communication unit 30A includes a clock reproducer and serial/parallel converter 303. The clock reproducer and serial/parallel converter 303 reproduces a clock from the serialized pixel data and synchronization signal, and detects the pixel data. The optical communication unit 30A further includes a descrambler 304 descrambling the pixel data with the synchronization signal superimposed thereon and a decoder 305 detecting the synchronization signal.

In the solid-state imager 1 including the optical communication unit 12A performing optical communications with the pixel data serialized, the serial interface 121A superimposes the clock signal and the synchronization signals on the data line into a serial signal, and then supplies the serial signal to the light transmitter 120.

The solid-state imager 1 of the present embodiment includes the pixel unit 10A and the analog-to-digital converter 11A on the top surface of the substrate 18 and the light transmitter 120 on the bottom surface of the substrate 18. The serial interface 121A is formed on the top surface of the substrate 18. A single signal line 181 conducting the serial signal is routed from the serial interface 121A to the light transmitter 120 through the substrate 18. Referring to FIGS. 35C and 36B, optionally, the serial interface 121A may be arranged as a functional block separate from the optical communication unit 12A.

Figure 38A:
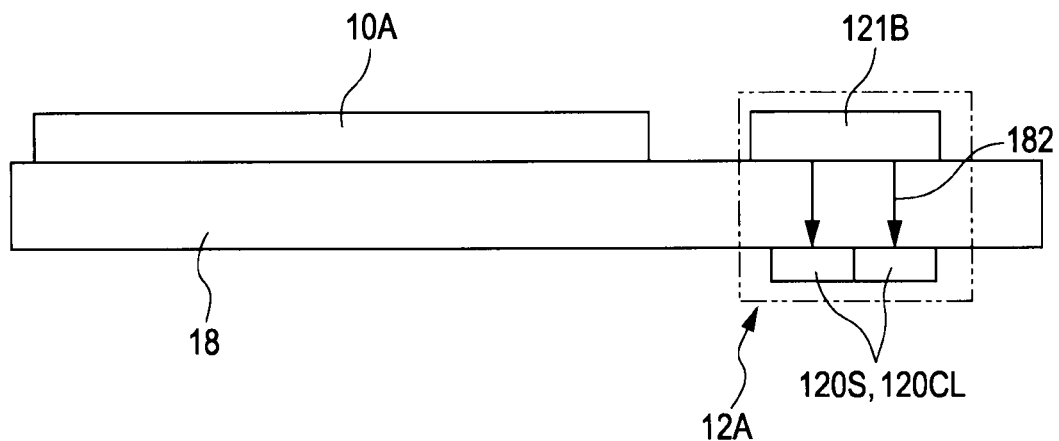
FIGS. 38A and 38B are side views diagrammatically illustrating one example of the signal transmission routing of the optical communication unit in which a plurality of light transmitter transmit the serialized pixel data in optical communications.
Figure 38B:
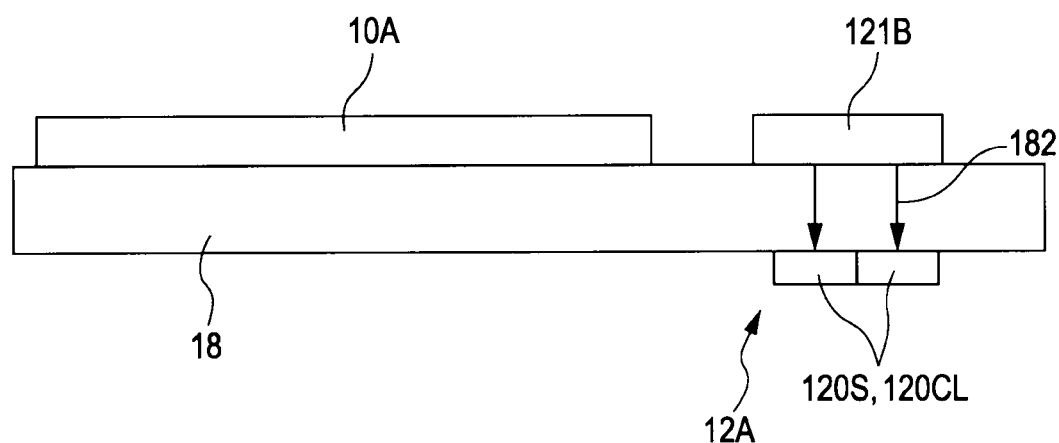

(3) Plurality of Transmissions by Plurality of Light Transmitters with Pixel Data Serialized FIGS. 37A and 37B are functional block diagrams of the optical communication unit 12A including a plurality of light transmitters that perform optical communications with the pixel data serialized. FIGS. 38A and 38B are side views diagrammatically illustrating the signal transmission routing to the optical communication unit including a plurality of light transmitters that perform optical communications with the pixel data serialized. The mounting of the optical communication unit 12A supporting multiple transmissions of the clock signal with the pixel data serialized, and the signal transmission routing to the optical communication unit 12A are described below.

The optical communication unit 12A in the solid-state imager 1 illustrated in FIGS. 37A and 38A includes a parallel/serial converter 121B that converts the pixel data DATA_TX analog-to-digital converted by the analog-to-digital converter 11A into serial data. The parallel/serial converter 121B receives the pixel data DATA_TX analog-to-digital converted by the analog-to-digital converter 11A and the clock signal CLK_TX generated by the timing generator 13A.

The optical communication unit 12A includes a light transmitter 120S that converts serial pixel data SDATA_TX into a light signal and outputs the light signal, and a light transmitter 120CL that converts a clock signal φSCLK_TX into a light signal and outputs the light signal.

The optical communication unit 30A in the signal processing device 3A includes a light receiver 300S. The light receiver 300S receives via a data line LsD the serial pixel data SDATA_TX as the light signal in optical communications, and converts the input light signal into serial pixel data SDATA_RX as an electrical signal. The optical communication unit 30A also includes a light receiver 300CL. The light receiver 300CL receives via a clock signal line LsCL a clock signal φSCLK_TX as a light signal in optical communications, and converts the input light signal into a clock signal φSCLK_RX as an electrical signal.

The optical communication unit 30A further includes a serial/parallel converter 301A. In response to the clock signal φSCLK_RX as the electrical signal provided by the light receiver 300CL, the serial/parallel converter 301A detects the pixel data DATA_RX from the pixel data SDATA_RX converted by the light receiver 300S as the electrical signal.

In the solid-state imager 1 including the optical communication unit 12A that performs optical communications with the pixel data serialized via the data line LsD and the clock line LsCL, the serial signal and the clock signal are transferred from the parallel/serial converter 121B to the optical communication unit 12A.

The solid-state imager 1 of the present embodiment includes the pixel unit 10A and the analog-to-digital converter 11A on the top surface of the substrate 18 and the light transmitter 120S and the light transmitter 120C on the bottom surface of the substrate 18. The parallel/serial converter 121B is formed on the top surface of the substrate 18. Two single signal lines 182 conducting the serial signal and the clock signal respectively are routed from the parallel/serial converter 121B to the light transmitters 120S and 120CL through the substrate 18. Optionally, the electro-absorption light modulator 120B may be arranged as a functional block separate from the optical communication unit 12A as illustrated in Figs. FIGS. 37B and 38B.

Layout Examples of the Optical Communication Unit in Accordance with the Pixel Group Arrangement The pixel unit 10A in the solid-state imager 1 may read the pixel data from the pixels on a per pixel group basis via multiple lines. The pixel group here is a group of pixels close to each other in characteristics. When the pixel data read via multiple lines is transmitted from the optical communication unit, a signal line conducting an analog-to-digital converted high-speed parallel signal from the pixel unit 10A is routed by a long distance to the optical communication unit. Such an electrical wiring generates much electromagnetic noise, thereby degrading the signal along the transmission line.

A shorter transmission line of the electrical signal to the optical communication unit is thus designed. The analog-to-digital converter 11A is arranged subsequent to a column CDS unit for multi-line reading, and the optical communication unit is arranged at the output of each analog-to-digital converter 11A. The transmission length to the optical communication unit is shortened in this way.

The optical communication unit may be collected on one terminal side of the solid-state imager 1. With this arrangement, heat generated at the optical communication unit 12A is efficiently cooled and radiated. In the discussion that follows, this function is incorporated in the optical communication unit if the serial interface or the parallel/serial converter is included.

Figure 39:
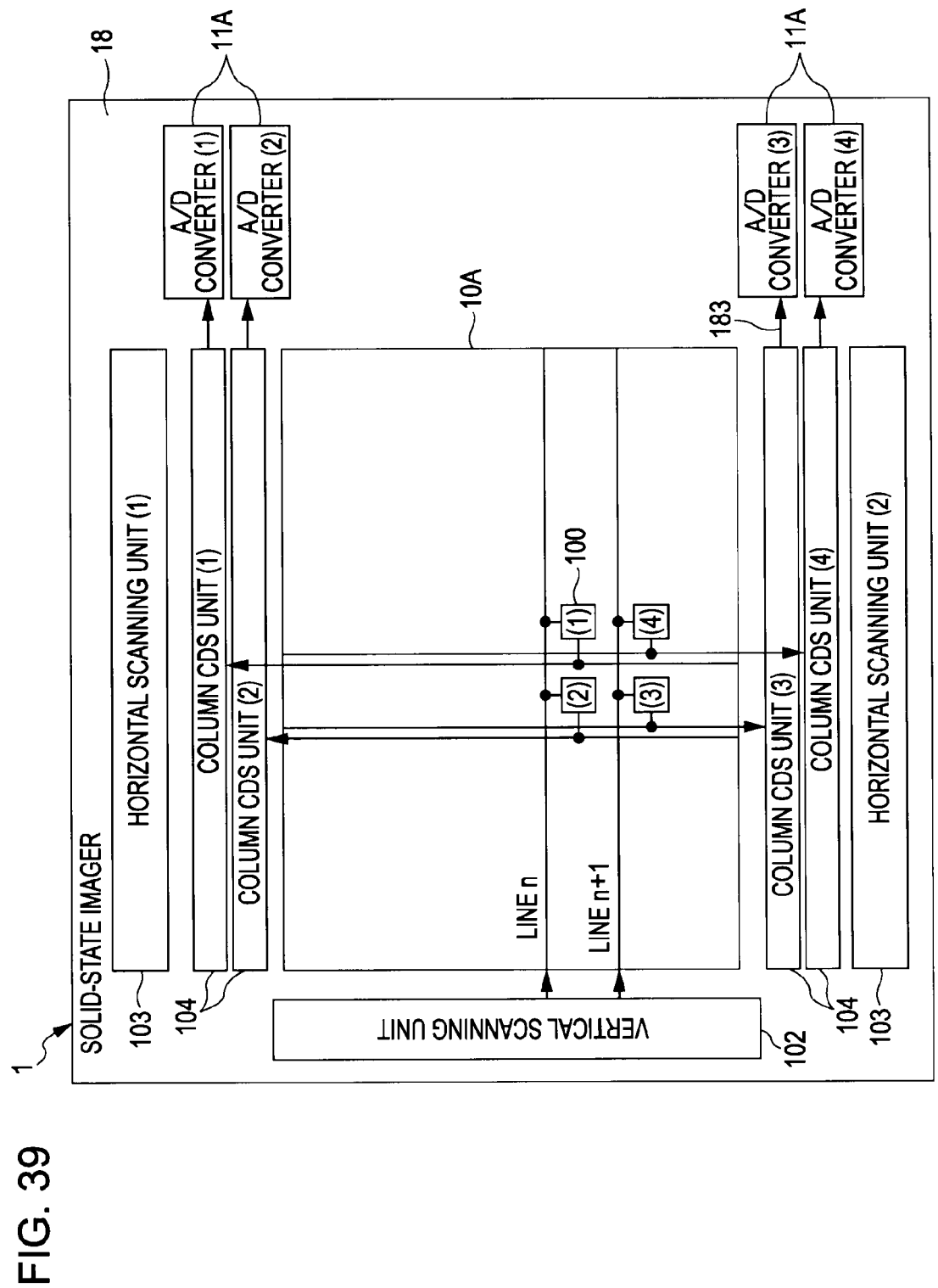
FIG. 39 is a plan view of a top surface of a substrate diagrammatically illustrating a layout example of the optical communication unit that performs a multi-line reading operation responsive to the structure of the pixel unit.
Figure 40:
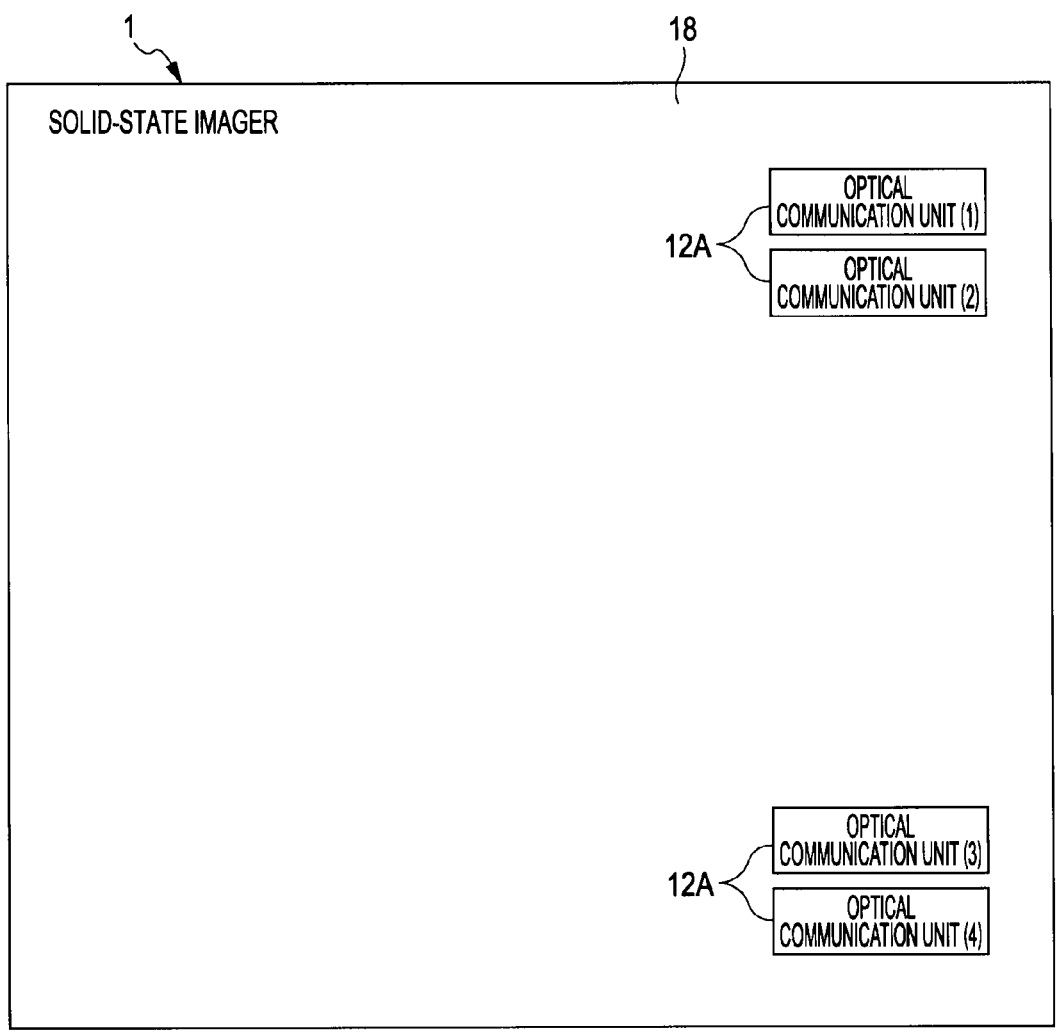
FIG. 40 is a plan view of the bottom surface of the substrate diagrammatically illustrating the layout example of the optical communication unit that performs a multi-line reading operation responsive to the structure of the pixel unit.

(1) Layout Example of the Optical Communication Unit for Multi-Line Reading Matching the Pixel Arrangement FIG. 39 is a plan view diagrammatically illustrating the top surface of the substrate with the optical communication unit mounted for multi-line reading matching the pixel arrangement. FIG. 40 is a plan view diagrammatically illustrating the bottom surface of the substrate with the optical communication unit mounted for multi-line reading matching the pixel arrangement.

The solid-state imager 1 may include a color filter for each pixel for color presentation. For example, pixels 100(1), 100(2), 100(3) and 100(4) includes respective color filters for different wavelengths. The color filters may include RGB filters, an infrared filter, an ultraviolet filter, etc. Referring to FIGS. 39 and 40, an optical communication unit is arranged for each pixel filter on a per color basis.

The pixel unit 10A corresponds to pixels 100(1)-100(4) having pixel filters of different colors, and four column CDS units 104(1), 104(2), 104(3), and 104(4) are employed. Subsequent to the four column CDS units 104(1)-104(4), analog-to-digital converter 11A(1)-11A(4) are employed, respectively. Optical communication units 12A(1)-12A(4) are respectively arranged for the outputs of the analog-to-digital converter 11A(1)-11A(4).

The column CDS units 104(1)-104(4) and the analog-to-digital converter 11A(1)-11A(4) are arranged on the top surface of the substrate 18. The column CDS units 104(1)-104(4) are respectively connected to the analog-to-digital converter 11A(1)-11A(4) via signal lines 183 as electrical wirings.

The optical communication units 12A(1)-12A(4) are arranged on the bottom surface of the substrate 18. The optical communication units 12A(1)-12A(4) are arranged respectively right below the analog-to-digital converter 11A(1)-11A(4). The analog-to-digital converter 11A(1)-11A(4) are respectively connected to the optical communication units 12A(1)-12A(4) via signal lines as electric wirings penetrating through the substrate 18. The transmission length from the analog-to-digital converter 11A(1)-11A(4) to the optical communication units 12A(1)-12A(4) is minimized. The analog-to-digital converter 11A(1)-11A(4) are arranged on one edge side of the substrate 18 for the column CDS units 104(1)-104(4). In this way, the optical communication units 12A(1)-12A(4) are also arranged on one edge side of the substrate 18.

Referring to FIGS. 39 and 40, the pixels are arranged in accordance with the type of the color filters. Alternatively, the pixels may be arranged in accordance with the characteristics of the photodiodes forming the respective pixels. More specifically, the pixels may be arranged in accordance with the material, receiving gain, or intensity-wavelength profile of the photodiode forming the pixel. The pixels may be also arranged in accordance with the structure of the photodiode, such as a pixel-embedded photodiode, or a lamination-type photodiode.

Figure 41:
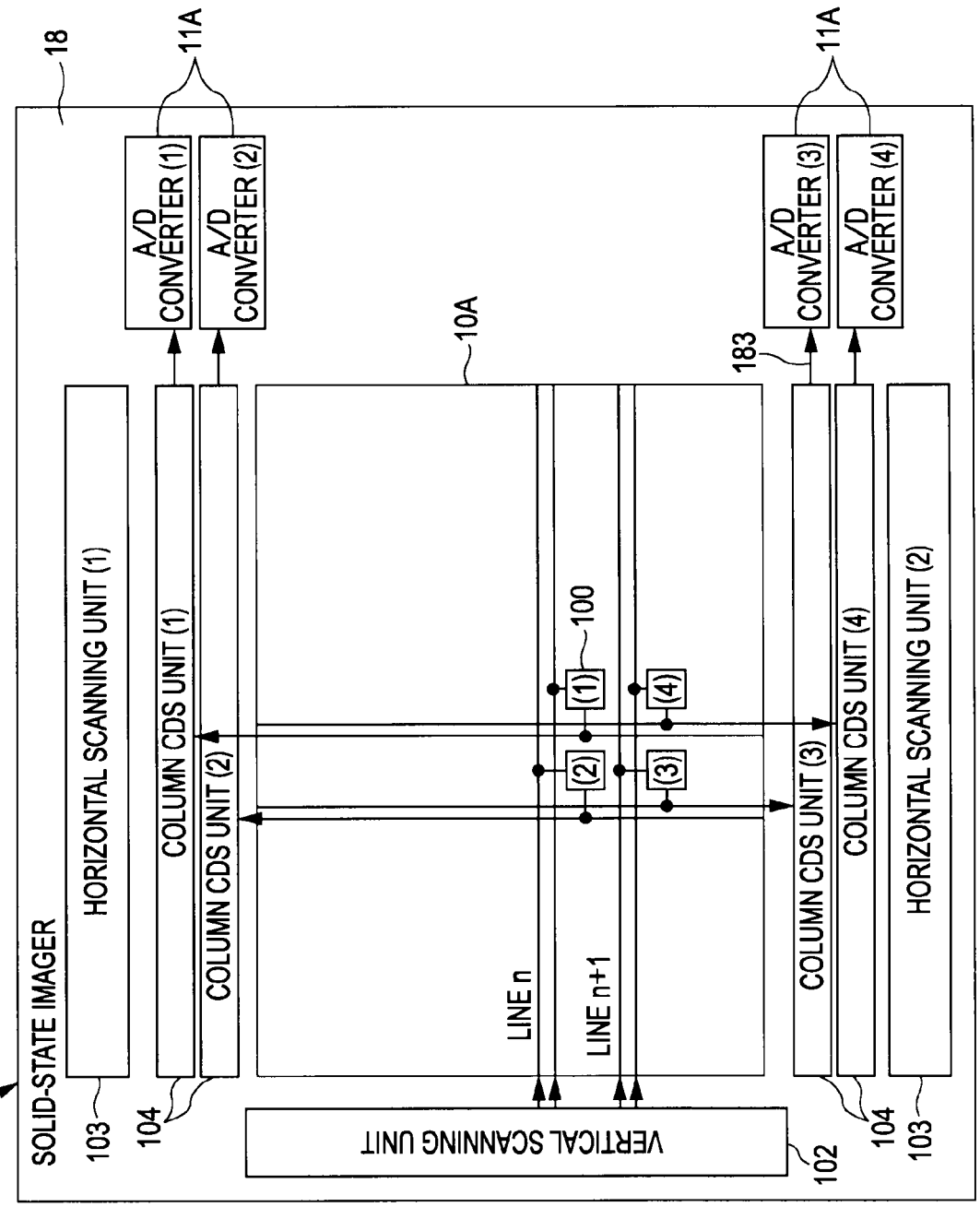
FIG. 41 is a plan view of the top surface of the substrate diagrammatically illustrating the layout example of the optical communication unit that performs the multi-line reading operation responsive to electronic shutter timing.
Figure 42:
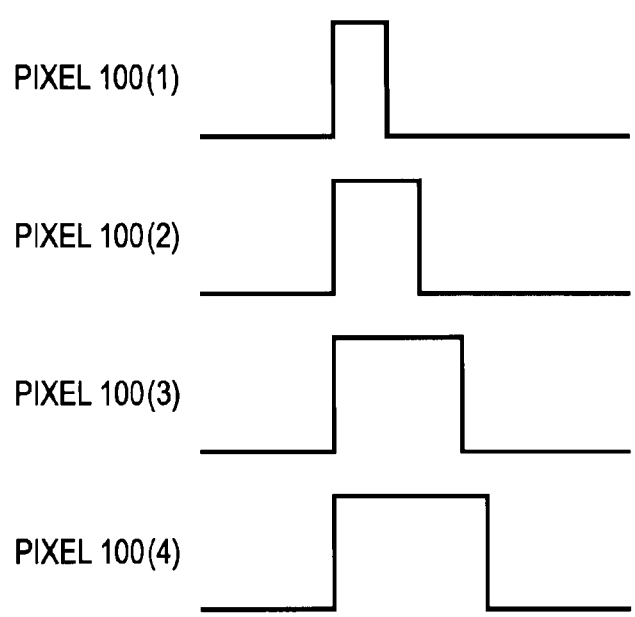
FIG. 42 is a timing diagram illustrating the electronic shutter timing and exposure time.

(2) Layout Example of the Optical Communication Unit for Multi-Line Reading Responsive to Electronic Shutter Timing FIG. 41 is a plan view diagrammatically illustrating the top surface of the substrate with the optical communication unit 12A performing multi-line reading in response to an electronic shutter timing. The wiring on the bottom surface of the substrate 18 remains unchanged from that in FIG. 40 with the optical communication unit 12A performing multi-line reading in response to the electronic shutter timing. FIG. 42 is a timing diagram illustrating the timing of an electronic shutter and exposure time.

Referring to FIG. 42, the pixels 100(1)-100(4) in the solid-state imager 1 are different in electronic shutter timing so that the exposure time in each pixel is individually adjusted. The optical communication unit 12A is arranged in accordance with the exposure time in FIG. 41.

The pixel unit 10A includes four column CDS unit 104(1)-104(4) for the pixels 100(1)-100(4) having the pixel filters different in exposure time. The analog-to-digital converter 11A(1)-11A(4) are arranged subsequent to the column CDS units 104(1)-104(4), respectively. The optical communication units 12A(1)-12A(4) are also arranged for the analog-to-digital converter 11A(1)-11A(4), respectively.

The column CDS units 104(1)-104(4) and the analog-to-digital converter 11A(1)-11A(4) are formed on the top surface of the substrate 18. The column CDS units 104(1)-104(4) are connected to the analog-to-digital converter 11A(1)-11A(4) via signal lines 183 as electronic wirings.

As previously described with reference to FIG. 40, the optical communication units 12A(1)-12A(4) are formed on the bottom surface of the substrate 18. The optical communication units 12A(1)-12A(4) are arranged right below the analog-to-digital converter 11A(1)-11A(4) so that the transmission length between the analog-to-digital converter 11A(1)-11A(4) and the optical communication units 12A(1)-12A(4) is minimized. The optical communication units 12A(1)-12A(4) are also arranged close to one edge side of the solid-state imager 1.

The layout of the optical communication units 12A may be determined taking into consideration the read speed of each pixel, an amplifier (FD amplifier) of each pixel, a capacitance and shape of each pixel, a lens of each pixel, a waveguide structure, etc.

Figure 43:
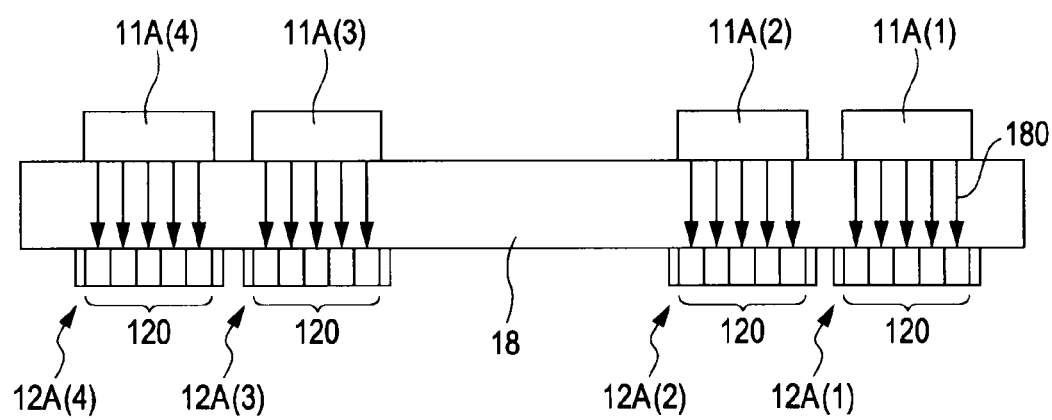
FIG. 43 is a side view diagrammatically illustrating one example of the signal transmission routing to the optical communication unit that is arranged in accordance with the structure of each pixel unit.

FIG. 43 is a side view diagrammatically illustrating the signal transmission routing to the optical communication unit 12A that is arranged in accordance with the pixel arrangement. The signal transmission routing is discussed with reference to the layout of the optical communication unit 12A that performs multi-line reading in accordance with the pixel arrangement discussed with reference to FIGS. 39 and 40.

The outputs of the read lines of the column CDS units 104(1)-104(4) arranged in accordance with the pixel arrangement are analog-to-digital converted into parallel signals by the respective analog-to-digital converter 11A(1)-11A(4). Each of the optical communication units 12A(1)-12A(4) has an array of light transmitters 120. A plurality of signal lines 180 conducting the parallel digital signals are routed from the analog-to-digital converter 11A(1)-11A(4) to the optical communication units 12A(1)-12A(4) through the substrate 18.

A plurality of optical communication units 12A, each including a plurality of light transmitters 120, are mounted in a plurality of locations, four locations in this example, and the four locations are close to one edge side of the solid-state imager 1. This mounting is referred to a collectively distributed mounting.

Layout of the Optical Communication Unit in Accordance with Pixel Reading Method The pixel unit 10A in the solid-state imager 1 may be partitioned into a plurality of areas, and a reading operation may be performed on a per area basis. In such a case, multi-line reading is performed to read the pixel data. If the pixel data read via multiple lines is transmitted by a single analog-to-digital converter 11A and a single optical communication unit 12A, analog transmission along a long length or high-speed parallel digital transmission along a long length is to be performed. An electric wiring, if arranged for such an application, suffers from electromagnetic noise, thereby causing signal degradation.

The transmission length is optimized by mounting the optical communication units 12A around the pixel unit 10A. More specifically, the analog-to-digital converter 11A is arranged subsequent the column CDS unit 104 supporting multi-line reading, and the optical communication unit 12A is arranged for the output of each the analog-to-digital converter 11A. The transmission length to the optical communication unit 12A is thus minimized.

The optical communication units 12A are distributed on the peripheral area of the solid-state imager 1, and the effect of heat and electromagnetic noise, generated by the optical communication units 12A, is dispersed.

Figure 44:
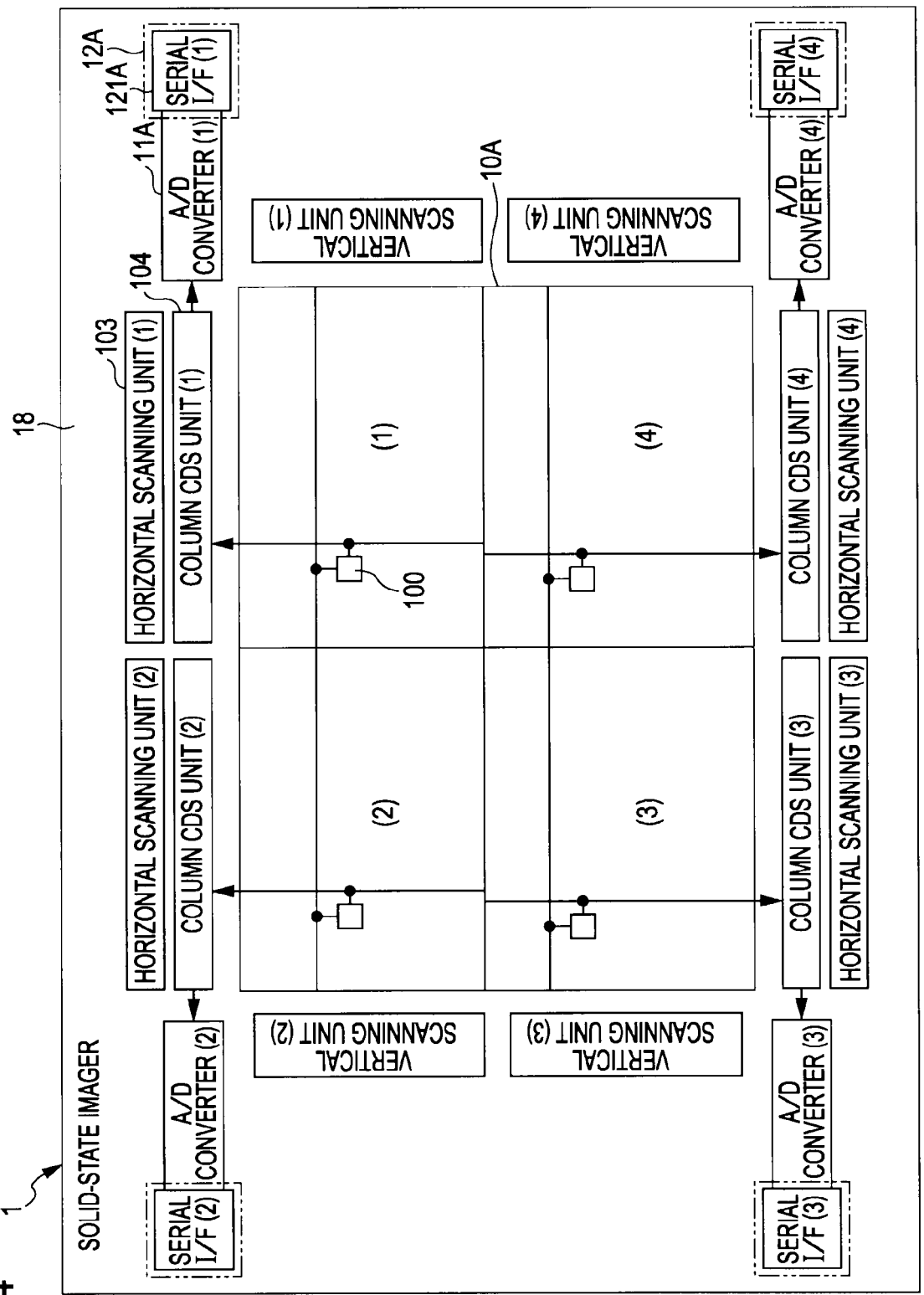
FIG. 44 is a plan view of the top surface of the substrate diagrammatically illustrating the optical communication unit that performs the multi-line reading operation in an area reading mode.
Figure 45:
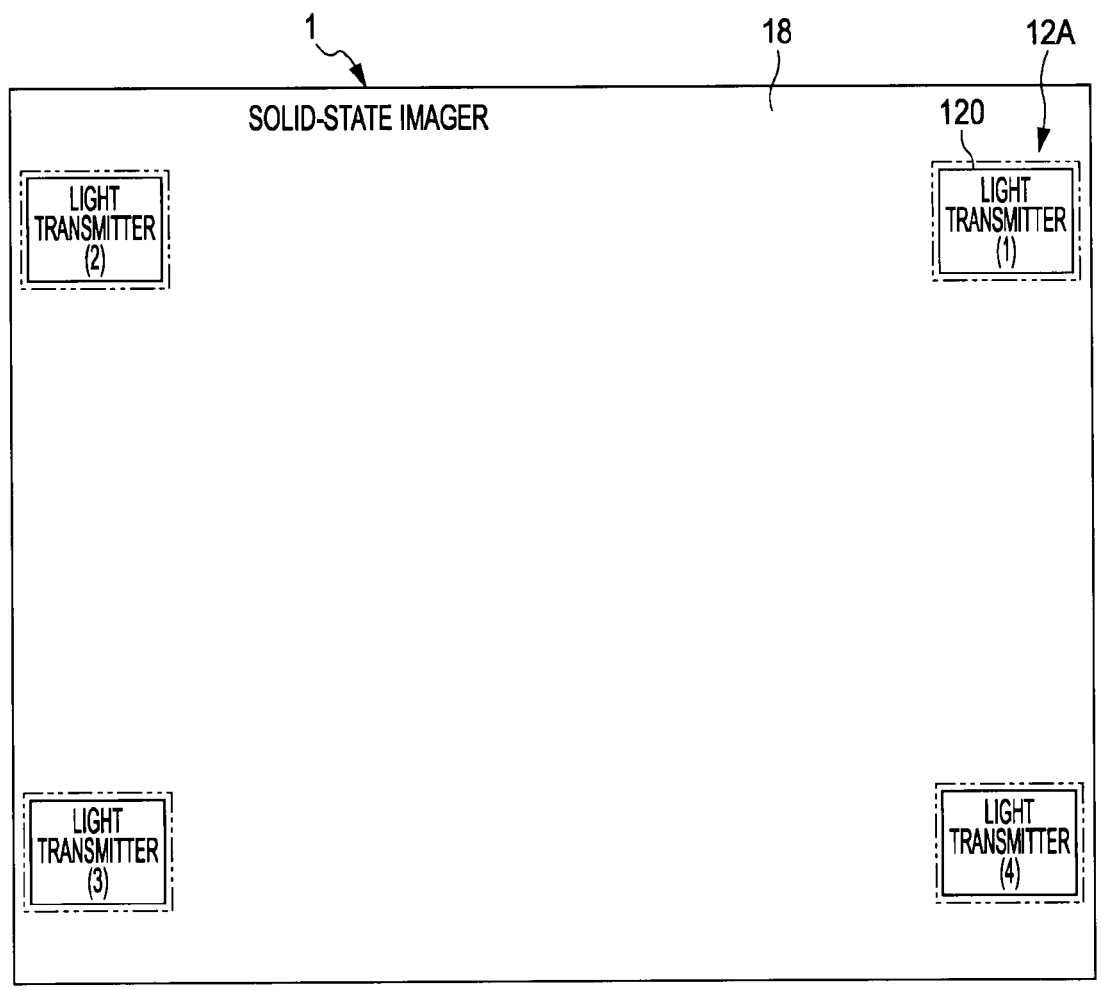
FIG. 45 is a plan view of the bottom surface of the substrate diagrammatically illustrating the optical communication unit that performs the multi-line reading operation in the area reading mode.

(1) Layout Example of the Optical Communication Units that Perform Multi-Line Reading in an Area Reading Mode FIG. 44 is a plan view diagrammatically illustrating the top surface of the substrate 18 bearing the optical communication units 12A that perform a multi-line reading operation in an area reading mode. FIG. 45 is a plan view diagrammatically illustrating the bottom surface of the substrate 18 bearing the optical communication units 12A that perform the multi-line reading operation in the area reading mode.

The solid-state imager 1 performs the reading operation with the pixel unit 10A partitioned into four areas (1)-(4). The pixel unit 10A includes four vertical scanning units 102(1)-102(4) and four horizontal scanning unit 103(1)-103 (4) for the four areas (1)-(4).

The solid-state imager 1 further includes four column CDS units 104(1)-104(4). The solid-state imager 1 further includes analog-to-digital converter 11A(1)-11A(4) arranged subsequent to the column CDS units 104(1)-104(4), respectively. Serial interfaces 121A(1)-121A(4) respectively forming the optical communication units 12A are arranged at the output stages of the analog-to-digital converter 11A(1)-11A(4). Light transmitters 120(1)-120(4) forming the respective optical communication units 12A are arranged at the output stages of the serial interfaces 121A(1)-121A(4).

The column CDS units 104(1)-104(4), the analog-to-digital converter 11A(1)-11A(4), and the serial interfaces 121A(1)-121A(4) are arranged on the top surface of the substrate 18. The light transmitters 120(1)-120(4) are arranged on the bottom surface of the substrate 18. The light transmitters 120(1)-120(4) forming the respective optical communication units 12A are arranged right below the serial interfaces 121A(1)-121A(4), respectively.

The serial interfaces 121A(1)-121A(4) are connected to the light transmitters 120(1)-120(4) by signal lines of electric wirings penetrating through the substrate 18. The transmission length between the serial interfaces 121A(1)-121A(4) and the light transmitters 120(1)-120(4) is thus minimized. In the area reading mode, the reading operation is performed from the four areas in the pixel unit 10A. If the optical communication units 12A are collected at one location, wiring thereof becomes difficult. For this reason, the optical communication units 12A are arranged subsequent to the analog-to-digital converters 11A. Since an amount of pixel data to be read is one quarter, serialization design is implemented instead of an array design. If one optical communication unit 12A having one light transmitter 120 is arranged for one area, cost reduction is achieved.

If the column CDS units 104(1) and 104(4) are arranged on the right hand edge portion of the solid-state imager 1, the analog-to-digital converters 11A(1) and 11A(4) and the serial interfaces 121A(1)-121A(4) are also arranged at the opposed ends of the right hand edge portion of the solid-state imager 1. If the column CDS units 104(2) and 104(3) are arranged on the left hand edge portion of the solid-state imager 1, the analog-to-digital converters 11A(2) and 11A(3) and the serial interfaces 121A(2)-121A(3) are arranged at the opposed ends of the right hand edge portion of the solid-state imager 1. The optical communication units 12A(1)-12A(4) respectively include the light transmitters 120(1)-120(4) arranged right below the serial interfaces 121A(1)-121A(4) and are thus mounted on the peripheral area of the solid-state imager 1, i.e., distributed at the four corners of the solid-state imager 1.

Figure 46:
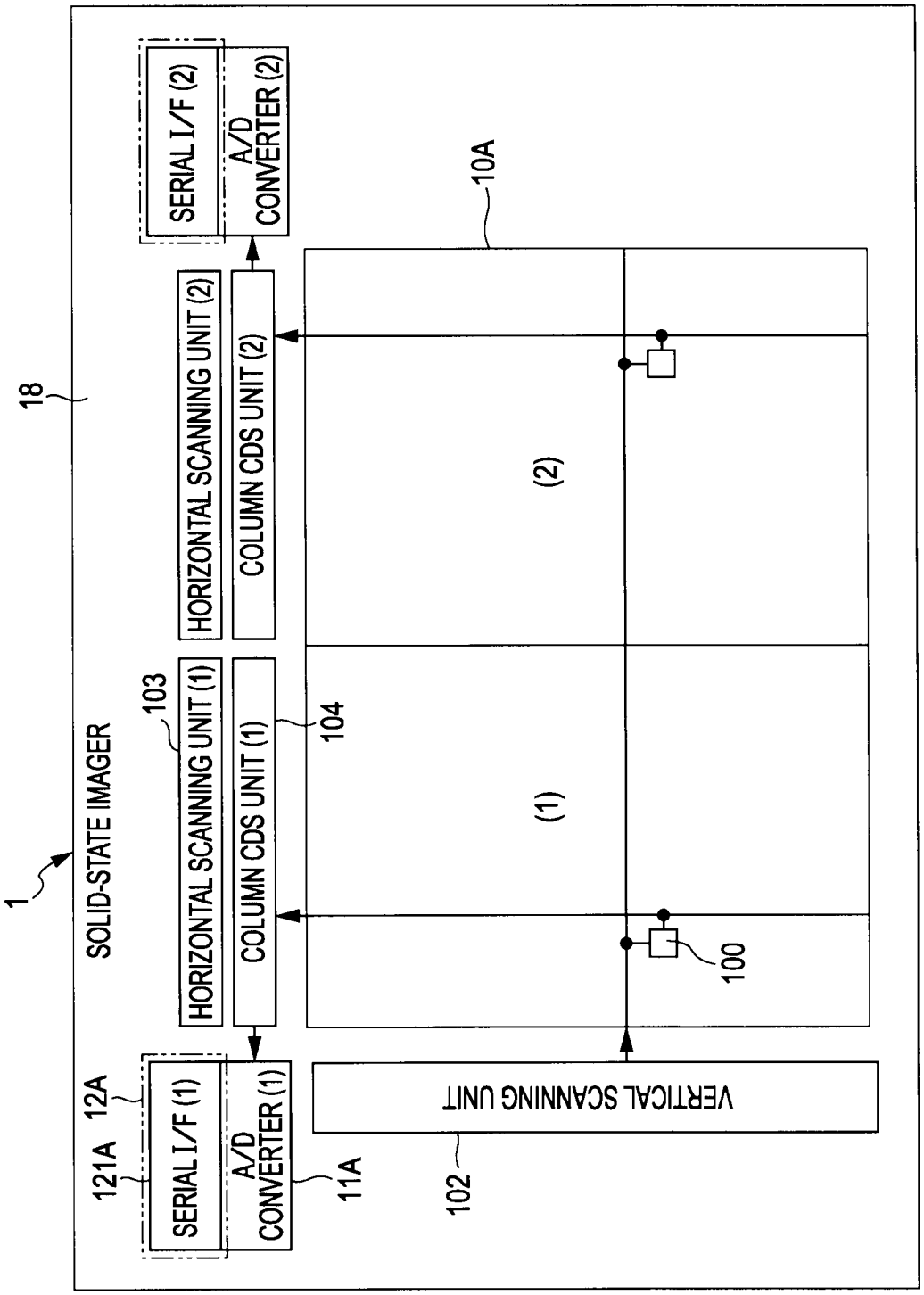
FIG. 46 is a plan view of the top surface of the substrate diagrammatically illustrating the optical communication unit that performs the multi-line reading operation in a double-door reading mode.
Figure 47:
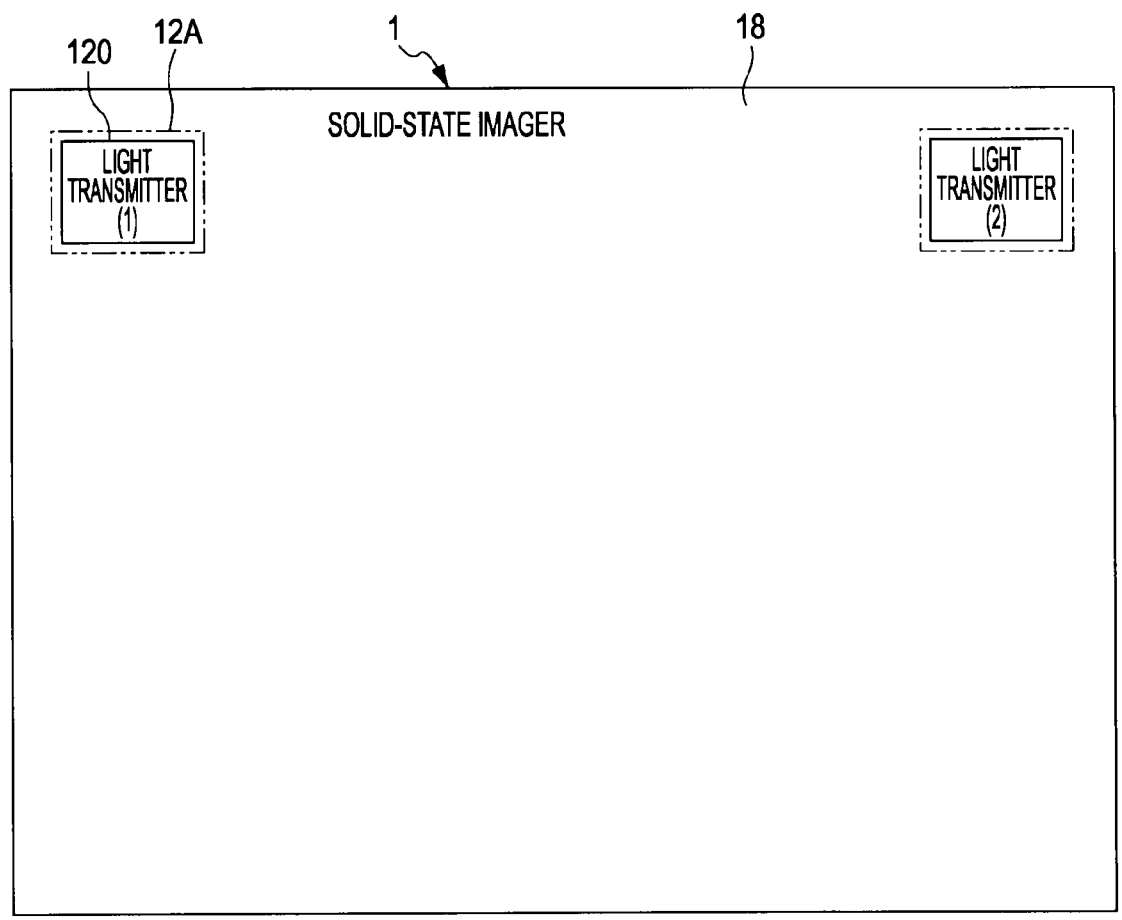
FIG. 47 is a plan view of the bottom surface of the substrate diagrammatically illustrating the optical communication unit that performs the multi-line reading operation in the double-door reading mode.

(2) Layout Example of the Optical Communication Units that Perform the Multi-Line Reading Operation in a Double-Door Reading Mode FIG. 46 is a plan view diagrammatically illustrating the top surface of the substrate 18 bearing the optical communication units 12A that perform a multi-line reading operation in a double-door reading mode. FIG. 47 is a plan view diagrammatically illustrating the bottom surface of the substrate 18 bearing the optical communication units 12A that perform the multi-line reading operation in the double-door reading mode.

The solid-state imager 1 performs the reading operation with the pixel unit 10A partitioned into two areas, namely, left and right areas (1) and (2). This mode is referred to as the double-door reading mode. The solid-state imager 1 includes two horizontal scanning units 103(1) and 103(2) for the two reading areas (1) and (2) of the pixel unit 10A.

The solid-state imager 1 further includes two column CDS units 104(1) and 104(2). The solid-state imager 1 further includes analog-to-digital converter 11A(1) and 11A(2) arranged subsequent to the column CDS units 104(1) and 104(2), respectively. Serial interfaces 121A(1) and 121A(2) respectively forming the optical communication units 12A are arranged at the output stages of the analog-to-digital converter 11A(1) and 11A(2). Light transmitters 120(1) and 120(2) forming the respective optical communication units 12A are arranged at the output stages of the serial interfaces 121A(1) and 121A(2).

The column CDS units 104(1) and 104(2), the analog-to-digital converter 11A(1) and 11A(2), and the serial interfaces 121A(1) and 121A(2) are arranged on the top surface of the substrate 18.

The light transmitters 120(1) and 120(2) are arranged on the bottom surface of the substrate 18 so that the light transmitters 120(1) and 120(2) come right below the serial interfaces 121A(1) and 121A(2). The serial interfaces 121A(1) and 121A(2) are respectively connected to the light transmitters 120(1) and 120(2) via signal lines of electric wirings penetrating through the substrate 18. The transmission length between the serial interfaces 121A(1) and 121A(2) and the light transmitters 120(1) and 120(2) is minimized.

If the column CDS unit 104(1) is arranged on the left portion of the solid-state imager 1, the analog-to-digital converter 11A(1) and the serial interface 121A(1) are arranged at the end of the left portion of the solid-state imager 1. If the column CDS unit 104(2) is arranged on the right portion of the solid-state imager 1, the analog-to-digital converter 11A(2) and the serial interface 121A(2) are arranged at the end of the right portion of the solid-state imager 1. The optical communication units 12A(1) and 12(2) respectively including the light transmitters 120(1) and 120(2) arranged right below the serial interfaces 121A(1) and 121A(2) are thus distributed on the peripheral area of the solid-state imager 1, for example, both edge portions of the solid-state imager 1.

Figure 48:
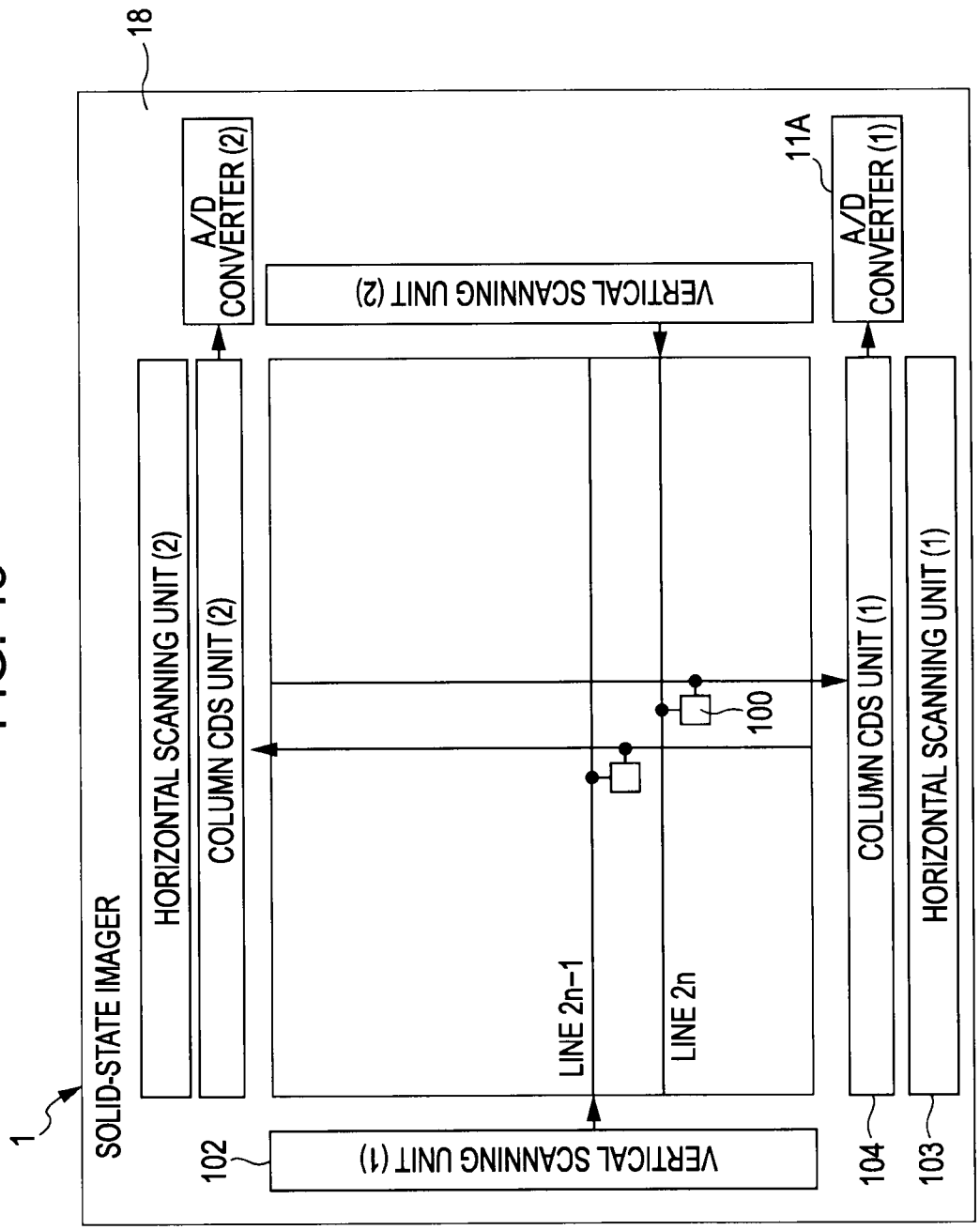
FIG. 48 is a plan view of the top surface of the substrate diagrammatically illustrating the optical communication unit that performs the multi-line reading operation in a field reading mode.
Figure 49:
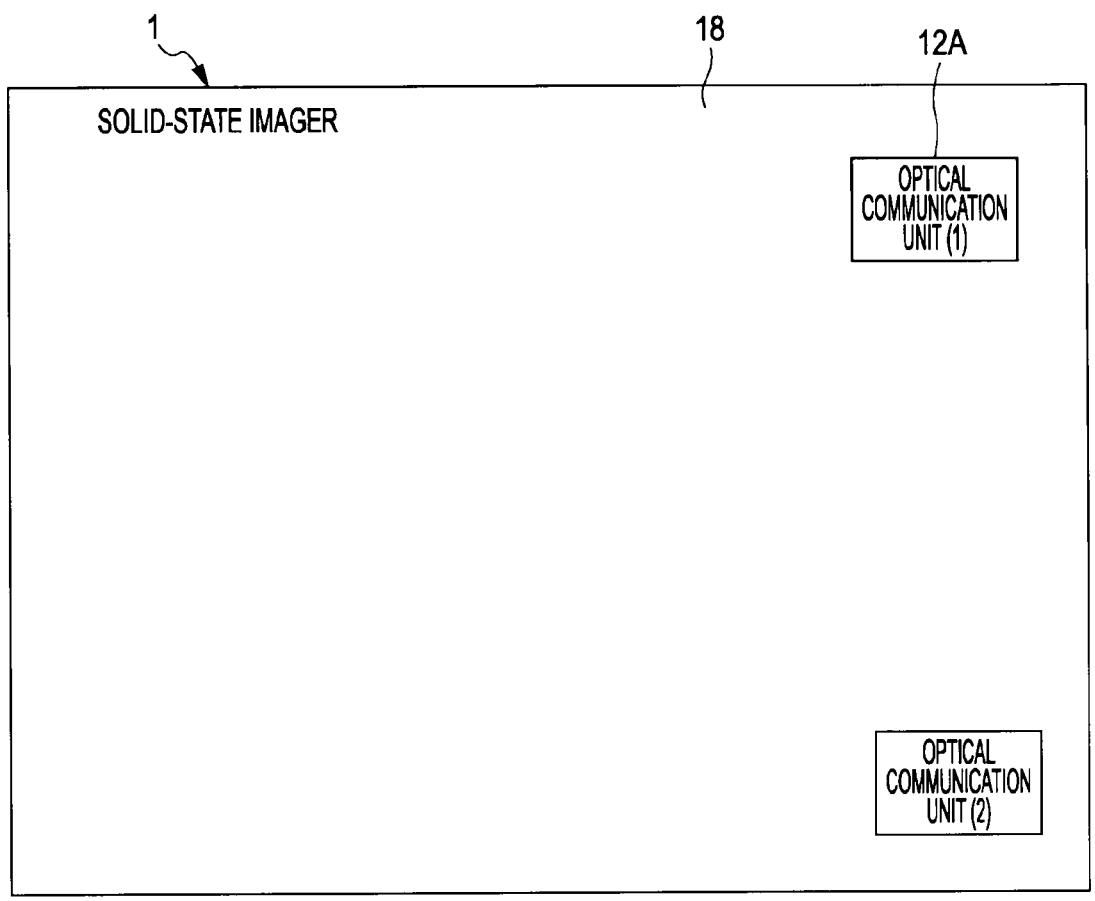
FIG. 49 is a plan view of the bottom surface of the substrate diagrammatically illustrating the optical communication unit that performs the multi-line reading operation in the field reading mode.

(3) Layout Example of the Optical Communication Units that Perform the Multi-Line Reading Operation in a Field Reading Mode FIG. 48 is a plan view diagrammatically illustrating the top surface of the substrate 18 bearing the optical communication units 12A that perform a multi-line reading operation in a field reading mode. FIG. 49 is a plan view diagrammatically illustrating the bottom surface of the substrate 18 bearing the optical communication units 12A that perform the multi-line reading operation in the field reading mode.

The solid-state imager 1 performs the reading operation with an even line 2n and an odd line 2n−1 of the pixel unit 10A read independently. This mode is referred to as a field reading mode. The solid-state imager 1 includes two vertical scanning units 102(1) and 102(2) and two horizontal scanning units 103(1) and 103(2), respectively corresponding to an even field and an odd field.

The solid-state imager 1 also includes two column CDS units 104(1) and 104(2). The solid-state imager 1 further includes analog-to-digital converter 11A(1) and 11A(2) arranged subsequent to the column CDS units 104(1) and 104(2), respectively. Optical communication units 12A(1) and 12A(2), each including an array of light transmitters 120, are arranged at the output stage of the analog-to-digital converter 11A(1) and 11A(2), respectively.

The column CDS units 104(1) and 104(2) and the analog-to-digital converter 11A(1) and 11A(2) are arranged on the surface side of the substrate 18.

The optical communication units 12A(1) and 12A(2) are arranged on the bottom surface of the substrate 18 so that the optical communication units 12A(1) and 12A(2) come right below the analog-to-digital converter 11A(1) and 11A(2), respectively. The analog-to-digital converter 11A(1) and 11A(2) are connected to the optical communication units 12A(1) and 12A(2), respectively, via signal lines penetrating as s electric wirings through the substrate 18. The transmission length between the analog-to-digital converter 11A(1) and 11A(2) and the optical communication units 12A(1) and 12A(2) is thus minimized.

The column CDS unit 104(1) is arranged below the pixel unit 10A in the solid-state imager 1 while the analog-to-digital converter 11A(1) is arranged on the right side of the column CDS unit 104(1) as illustrated in FIG. 48. The column CDS unit 104(2) is arranged above the pixel unit 10A in the solid-state imager 1 while the analog-to-digital converter 11A(2) is arranged on the right side of the column CDS unit 104(2) as illustrated in FIG. 48. In this way, the optical communication units 12A(1) and 12A(2) are distributed on the peripheral area of the solid-state imager 1, for example, on the right edge portion of the solid-state imager 1.

Figure 50:
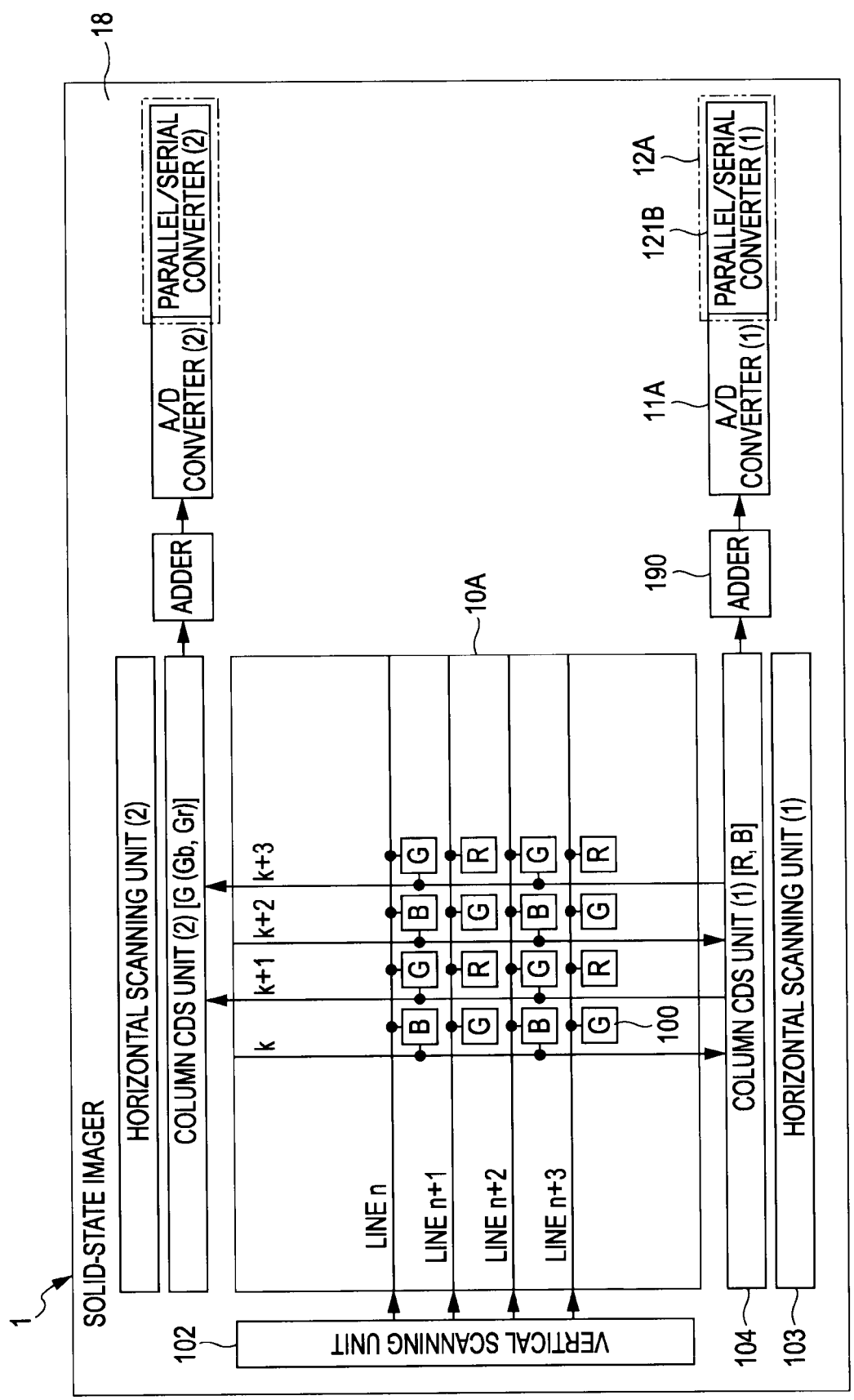
FIG. 50 is a plan view of the top surface of the substrate diagrammatically illustrating the optical communication unit that performs the multi-line reading operation in a four-pixel addition reading mode.
Figure 51:
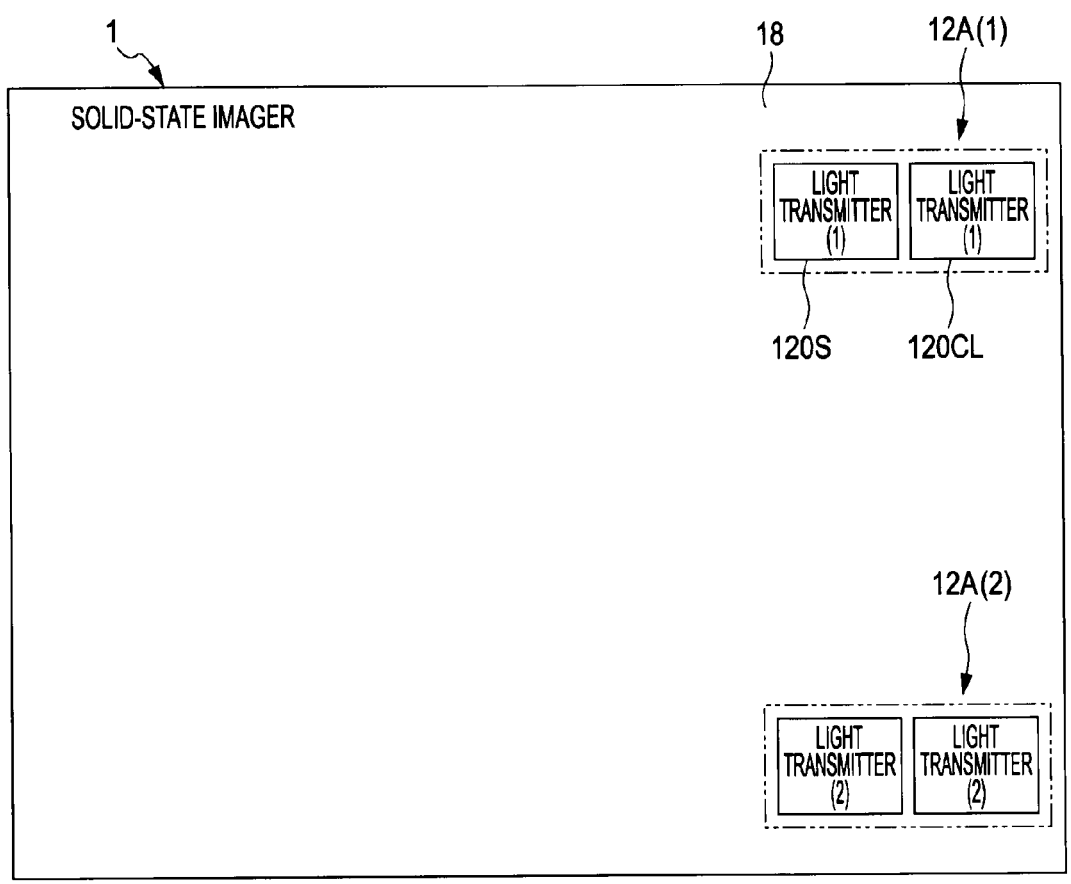
FIG. 51 is a plan view of the bottom surface of the substrate diagrammatically illustrating the optical communication unit that performs the multi-line reading operation in the four-pixel addition reading mode.

(4) Layout Example of the Optical Communication Units that Perform the Multi-Line Reading Operation in a Four-Pixel Addition Reading Mode FIG. 50 is a plan view diagrammatically illustrating the top surface of the substrate 18 bearing the optical communication units 12A that perform a multi-line reading operation in a four-pixel addition reading mode. FIG. 51 is a plan view diagrammatically illustrating the bottom surface of the substrate 18 bearing the optical communication units 12A that perform the multi-line reading operation in the four-pixel addition reading mode.

The solid-state imager 1 includes the pixel unit 10A having R, Gb, Gr, and B color filters for color presentation. The solid-state imager 1 reads the pixel data with pixel signals of pixels of a particular wavelength (color) added. During the four-pixel addition reading mode, the number of pixels actually to be read is reduced by performing an averaging operation through decimating pixels and adding the pixel signals of surrounding pixels. As for pixels 100R, 100G, and 100B, pixel signals read from 100B pixels at positions (n,k), (n,k+2), (n+2,k), and (n+2,k+2) are summed and then output. Similarly, the pixel signals from pixels 100R and 100G at the positions (n,k), (n,k+2), (n+2,k), and (n+2,k+2) are summed and output. The horizontal scanning units 103(1) and 103(2) are arranged for the pixels 100R and 100B, and the pixel 100G(Gb,Gr).

The solid-state imager 1 also includes column CDS units 104(1) and 104(2). An adder 190 and an analog-to-digital converter 11A(1) are arranged subsequent to the column CDS unit 104(1). An adder 190 and an analog-to-digital converter 11A(2) are arranged subsequent to the column CDS unit 104(2). Parallel/serial converters 121B(1) and 121B(2) forming the respective optical communication units 12A are arranged at the output stages of the analog-to-digital converter 11A(1) and 11A(2). Two light transmitters 120(1) and 120(2) respectively forming the optical communication units 12A are arranged at the output stages of the parallel/serial converters 121B(1) and 121B(2). The light transmitters 120(1) and 120(2) are arranged as the light transmitter 120S and the light transmitter 120C discussed with reference to FIGS. 37 and 38.

The column CDS units 104(1) and 104(2), the analog-to-digital converter 11A(1) and 11A(2), and the parallel/serial converters 121B(1) and 121B(2) are arranged on the bottom surface of the substrate 18.

The light transmitters 120(1) and 120(2) are arranged on the bottom surface of the substrate 18 so that the light transmitters 120(1) and 120(2) comes right below the parallel/serial converters 121B(1) and 121B(2), respectively. The parallel/serial converters 121B(1) and 121B(2) are connected to the light transmitters 120(1) and 120(2), respectively, via signal lines penetrating as electric wirings through the substrate 18. The transmission length between the parallel/serial converters 121B(1) and 121B(2) and the light transmitters 120(1) and 120(2) is thus minimized.

The column CDS unit 104(1) is arranged below the pixel unit 10A in the solid-state imager 1 while the analog-to-digital converter 11A(1) and the parallel/serial converter 121B(1) are arranged on the right side of the column CDS unit 104(1) as illustrated in FIG. 50. The column CDS unit 104(2) is arranged above the pixel unit 10A in the solid-state imager 1 while the analog-to-digital converter 11A(2) and the parallel/serial converter 121B(2) is arranged on the right side of the column CDS unit 104(2) as illustrated in FIG. 50. In this way, the optical communication units 12A(1) and 12A(2) including the light transmitters 120(1) and 120(2) are arranged on the peripheral area of the solid-state imager 1, for example, distributed on the right edge portion of the solid-state imager 1.

Figure 52:
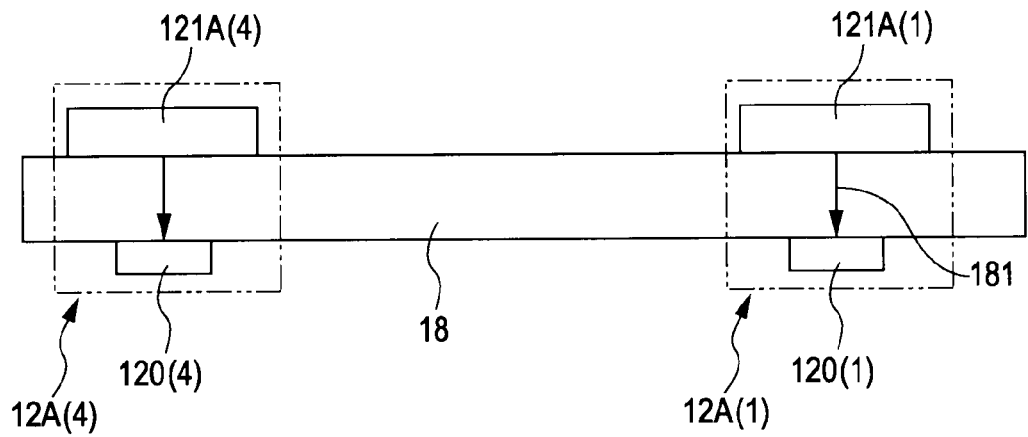
FIG. 52 is a side view diagrammatically illustrating one example of the signal transmission routing to the optical communication unit that is arranged in accordance with the pixel reading mode.

FIG. 52 is a side view diagrammatically illustrating the signal transmission routing to the optical communication unit 12A that is arranged in accordance with the pixel reading mode. The signal transmission routing is described also with reference to the layout example of the optical communication unit 12A that performs the multi-line reading in the area reading mode described with reference to FIGS. 44 and 45.

The serial interfaces 121A(1)-121A(4) of the optical communication units 12A arranged in a distributed fashion generate serial signals by superimposing the clock signal and the synchronization signals on the data line. The serial signals are then supplied to the light transmitters 120(1)-120(4). A single signal line 181 conducting the serial signal is routed from each of the serial interfaces 121A(1)-121A(4) to each of the light transmitters 120(1)-120(4) via the substrate 18.

Figure 53:
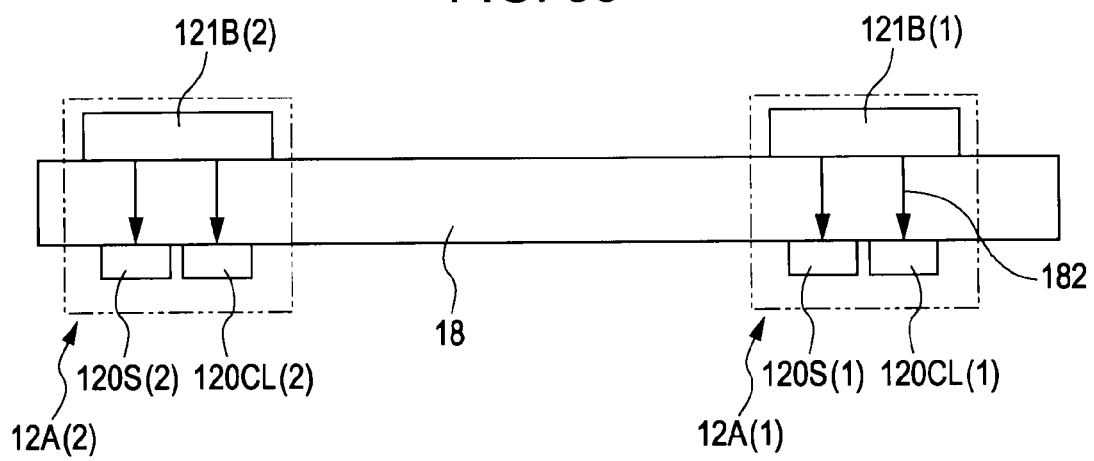
FIG. 53 is a side view diagrammatically illustrating another example of the signal transmission routing to the optical communication unit that is arranged in accordance with the pixel reading mode.

FIG. 53 is a side view diagrammatically illustrating another signal transmission routing to the optical communication unit 12A that is arranged in accordance with the pixel reading mode. The signal transmission routing is described also with reference to the layout example of the optical communication unit 12A that performs the multi-line reading in the four-pixel addition reading mode described with reference to FIGS. 50 and 51.

The digital signal, into which the analog-to-digital converter 11A analog-to-digital converts the signal read from the pixel unit 10A, is serialized by the parallel/serial converters 121B(1) and 121B(2) in the optical communication units 12A. The serial signal provided by the parallel/serial converters 121B(1) and 121B(2) and the clock signal are transmitted via two signal lines, namely, the data line and the clock line. The two signal lines 182 conducting the serial signal and the clock signal are routed from the parallel/serial converters 121B(1) and 121B(2) to the light transmitters 120S(1) and 120CL(1), and 120S(2) and 120CL(2) via the substrate 18.

Layout Examples of Cooler in Accordance with the Layout of the Optical Communication Unit Heat generated by the optical communication unit 12A in the solid-state imager 1 can affect image capturing units including the pixel unit 10A, analog processing circuits such as scanning units, and the analog-to-digital converter 11A. The optical communication unit 12A is cooled in a localized fashion. A heat radiator for radiating the heat generated by the optical communication unit 12A in a direction opposite a direction of the pixel unit 10A is arranged to reduce the effect of the generated heat. The heat generated by the optical communication unit 12A is reduced and heat generated by the pixel unit 10A, the analog-to-digital converter 11A, etc. is also radiated. As previously discussed, the optical communication unit 12A includes the light transmitter 120 on the bottom surface of the substrate 18. The optical communication unit 12A may include the serial interface on the top surface of the substrate 18. In the discussion that follows, the light transmitter 120 arranged on the bottom surface of the substrate 18 is cooled, and the light transmitter 120 having no elements on the top surface of the substrate 18 is referred to as the optical communication unit 12A.

(1) First Layout Example of the Cooler

Figure 54:
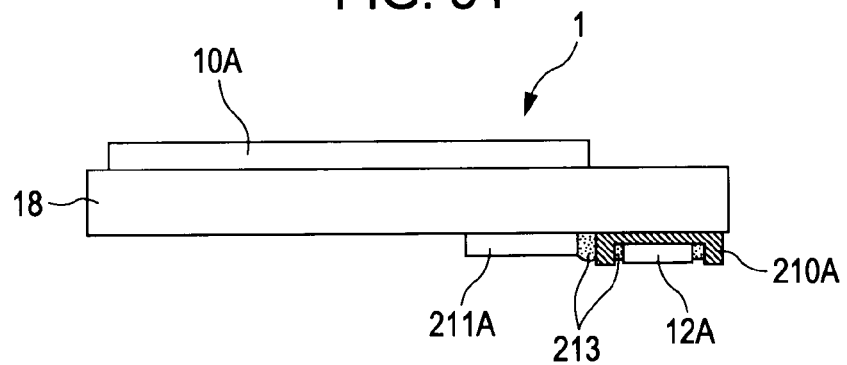
FIG. 54 is a side view diagrammatically illustrating the solid-state imager with the cooler arranged in a first layout example.
Figure 55:
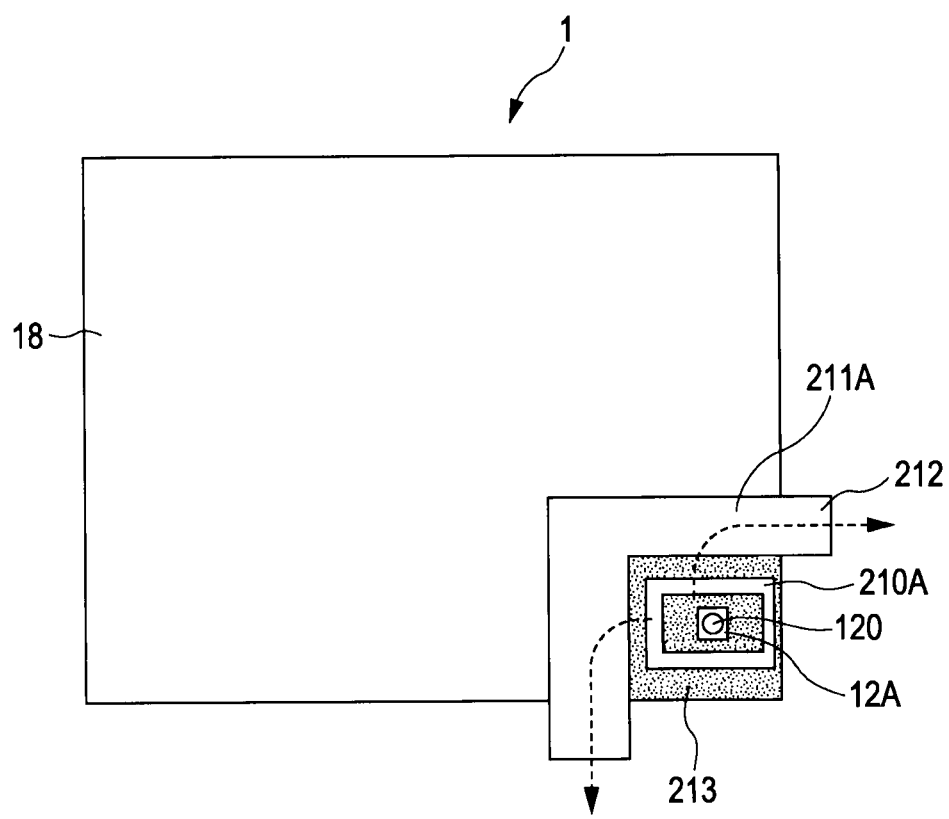
FIG. 55 is a plan view diagrammatically illustrating the solid-state imager with the cooler arranged in the first layout example.

FIG. 54 is a side view diagrammatically illustrating the solid-state imager 1 having a cooler arranged in a first layout. FIG. 55 is a plan view of the solid-state imager 1 of the solid-state imager 1 having the cooler arranged in the first layout. The solid-state imager 1 supports serialization of the pixel data. A single optical communication unit 12A having a single light transmitter 120 is arranged on one corner of the bottom surface of the substrate 18. The solid-state imager 1 includes a cooler 210A surrounding the optical communication unit 12A. The cooler 210A is manufactured of a material higher in heat conductivity than the material forming the substrate 18. The cooler 210A has the function of not transferring heat generated by the optical communication unit 12A to the substrate 18 but radiating the generated heat.

If the surface emitting semiconductor laser is used as a light emitting element, the cooler 210A is a planar member covering the top and side face of the optical communication unit 12A except the bottom surface of the optical communication unit 12A that serves a light emitting surface.

The solid-state imager 1 includes a heat radiator 211A surrounding the cooler 210A. The heat radiator 211A is manufactured of a material higher in heat conductivity than the material forming the substrate 18. The heat radiator 211A has a function of radiating heat, transferred to the cooler 210A from the optical communication unit 12A, instead of transferring the heat to the substrate 18. The heat radiator 211A partly projects outside the outline of the solid-state imager 1, forming an external heat radiation portion 212.

If the optical communication unit 12A is arranged on the peripheral portion of the solid-state imager 1, such as on one corner of the substrate 18 as illustrated in FIG. 55, the heat radiator 211A is formed so that the heat radiator 211A surrounds the two inner side of the cooler 210A on the substrate 18. This layout prevents the heat from being transferred inwardly into the substrate 18 bearing the pixel unit 10A and the like on the top surface thereof.

The solid-state imager 1 also includes a heat conductive member 213 between the cooler 210A and the heat radiator 211A. As the cooler 210A and the heat radiator 211A, the heat conductive member 213 is manufactured of a high heat-conductivity material. The heat conductive member 213 fills the gap between the cooler 210A and the heat radiator 211A. The heat conductive member 213 may also fill the region between the cooler 210A and the surfaces of the optical communication unit 12A excluding the light emitting surface of the optical communication unit 12A. The heat conductive member 213 is manufactured of a material high in both heat conductivity and heat resistance, and further high in light blocking capability so that the leaked light from the optical communication unit 12A is blocked. For example, the heat conductive member 213 may be manufactured of high heat-conductivity epoxy resin or the like.

The cooler 210A and the heat radiator 211A are arranged in this way in the solid-state imager 1 having the optical communication unit 12A mounted at one location on the bottom surface of the substrate 18. The heat generated by the operating optical communication unit 12A is transferred to the cooler 210A rather than to the substrate 18. The heat transferred to the cooler 210A is transferred to the heat radiator 211A and mainly radiated outwardly via the external heat radiation portion 212 as denoted by arrow-headed broken lines.

The heat generated by the optical communication unit 12A is thus transferred in a direction opposite a direction looking, on the bottom surface of the substrate 18, toward the formation region of the pixel unit 10A, and is then radiated outwardly outside the solid-state imager 1. The effect of the heat generated by the optical communication unit 12A on the pixel unit 10A is substantially reduced. The heat conductive member 213 fills the gap between the cooler 210A and the heat radiator 211A, and the gap between the optical communication unit 12A and the cooler 210A. Heat radiation efficiency is high in comparison with a structure in which heat is convected by air.

(2) Second Layout Example of the Cooler

Figure 56:
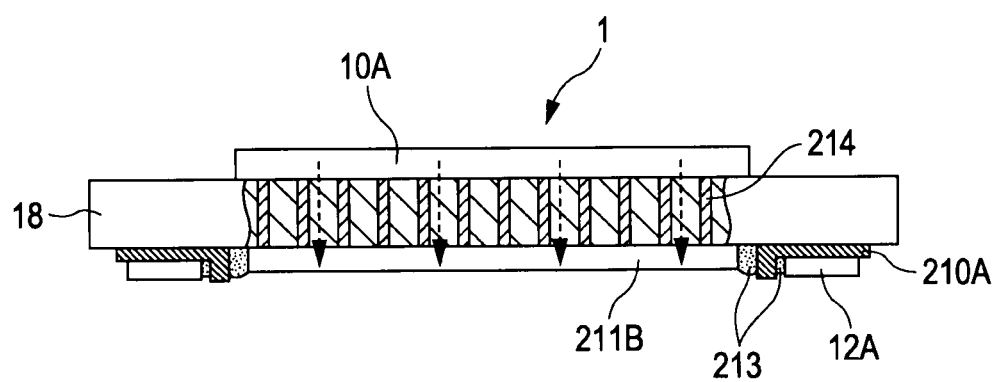
FIG. 56 is a side view diagrammatically illustrating the solid-state imager with the cooler arranged in a second layout example.
Figure 57:
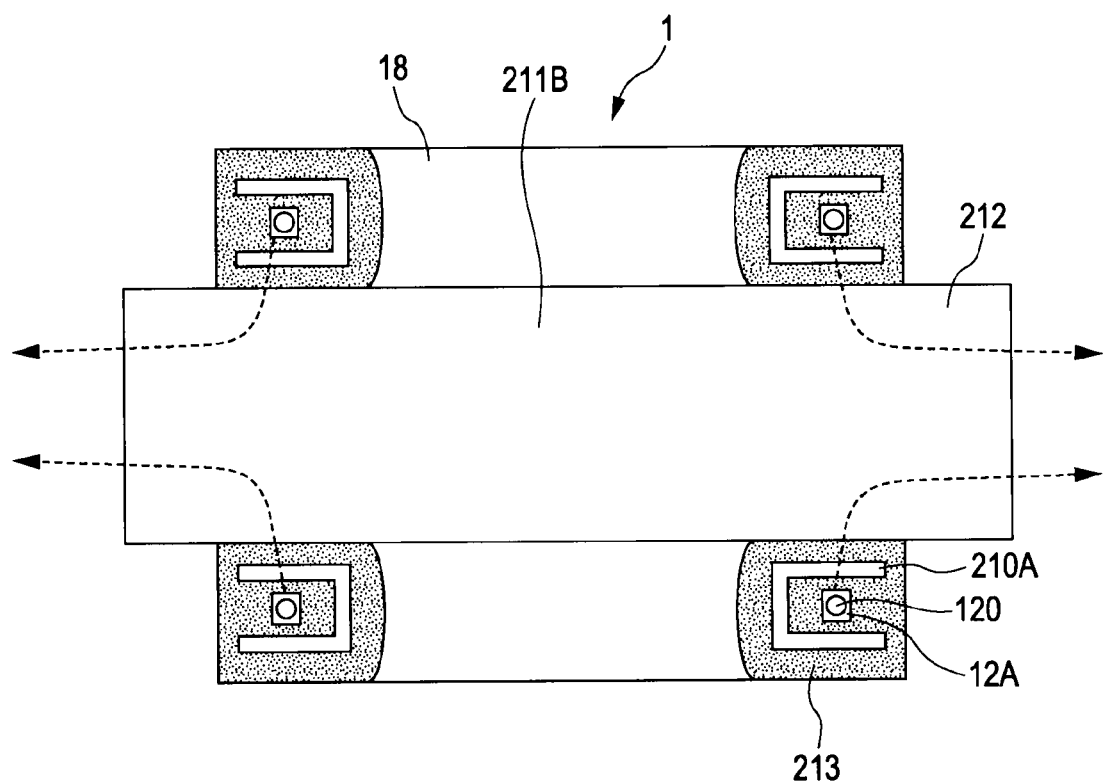
FIG. 57 is a plan view diagrammatically illustrating the solid-state imager with the cooler arranged in the second layout example.

FIG. 56 is a side view diagrammatically illustrating the solid-state imager 1 having the coolers in a second layout. FIG. 57 is a plan view diagrammatically illustrating the solid-state imager 1 having the coolers in the second layout. The solid-state imager 1 includes the optical communication units 12A respectively including the light transmitters 120, arranged at four corners on the bottom surface of the substrate 18. The solid-state imager 1 thus supports the area reading mode discussed with reference to FIG. 44. In the solid-state imager 1, the cooler 210A is arranged surrounding the optical communication unit 12A. The cooler 210A is manufactured of a material higher in heat conductivity than the material forming the substrate 18. The cooler 210A has the function of radiating the heat generated by the optical communication unit 12A rather than transferring the heat to the substrate 18.

If the edge emitting semiconductor laser is used as a light emitting element, the cooler 210A is a planar member covering the top surface and three side faces of the optical communication unit 12A except one side face of the optical communication unit 12A that serves a light emitting surface.

The solid-state imager 1 includes a heat radiator 211B covering the entire bottom surface of the substrate 18, between the coolers 210A. The heat radiator 211B is manufactured of a material higher in heat conductivity than the material of the substrate 18. The heat radiator 2119 has the function of radiating the heat transferred from the optical communication unit 12A to the cooler 210A rather than transferring the heat to the substrate 18. The heat radiator 211B is large enough in size to cover the area between the coolers 210A and right below the pixel unit 10A formed on the top surface of the substrate 18. The heat radiator 211B partly projects outside the outline of the substrate 18 of the solid-state imager 1, thereby forming external heat radiation portions 212. The heat radiator 211B is connected to the pixel unit 10A formed on the top surface of the substrate 18 via heat conductive members 214. The heat conductive members 214 are produced by metalizing through-holes opened in the substrate 18 with a high heat-conductivity material.

The solid-state imager 1 also includes a heat conductive member 213 between the cooler 210A and the heat radiator 211B. As the cooler 210A and the heat radiator 211B, the heat conductive member 213 is manufactured of a high heat-conductivity material. The heat conductive member 213 fills the gap between the cooler 210A and the heat radiator 211B. The heat conductive member 213 may also fill the region between the cooler 210A and the surfaces of the optical communication unit 12A excluding the light emitting surface of the optical communication unit 12A. For example, the heat conductive member 213 may be manufactured of high heat-conductivity epoxy resin or the like.

The coolers 210A and the heat radiator 211B are arranged in the solid-state imager 1 in which the optical communication units 12A are arranged at a plurality of locations on the bottom surface of the substrate 18. The heat generated by the operating optical communication unit 12A is transferred to the cooler 210A rather than to the substrate 18. The heat transferred to the cooler 210A is transferred to the heat radiator 211B and mainly radiated outwardly via the external heat radiation portions 212 as denoted by arrow-headed broken lines. The heat generated by the pixel unit 10A and the analog-to-digital converter 11A on the top surface of the substrate 18 is transferred to the heat radiator 211B via the heat conductive members 214 and then radiated outwardly mainly via the external heat radiation portion 212.

The heat generated by the optical communication unit 12A is thus transferred in a direction opposite a direction looking, on the bottom surface of the substrate 18, toward the formation region of the pixel unit 10A, and is then radiated outwardly outside the solid-state imager 1. The heat generated by the pixel unit 10A and the like on the top surface of the substrate 18 is transferred to the bottom surface of the substrate 18 and then radiated outwardly. The effect of the heat generated by the optical communication unit 12A on the pixel unit 10A is substantially reduced. The heat conductive member 213 fills the gap between the cooler 210A and the heat radiator 211B, and the gap between the optical communication unit 12A and the cooler 210A. Heat radiation efficiency is high in comparison with a structure in which heat is convected by air. Since the optical communication units 12A are arranged at the four corners of the solid-state imager 1, the heat radiator 211B covers the entire bottom surface of the substrate 18. This arrangement efficiently radiates not only the heat generated by the optical communication unit 12A but also the heat generated by the pixel unit 10A and the like.

(3) Third Layout Example of the Cooler

Figure 58:
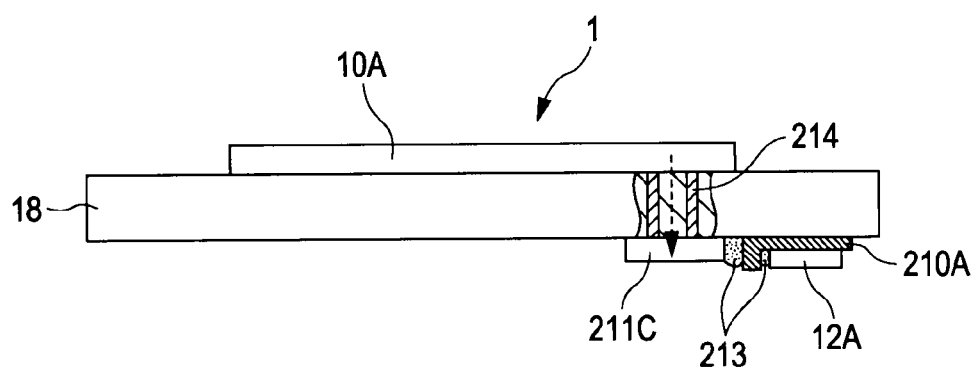
FIG. 58 is a side view diagrammatically illustrating the solid-state imager with the cooler arranged in a third layout example.
Figure 59:
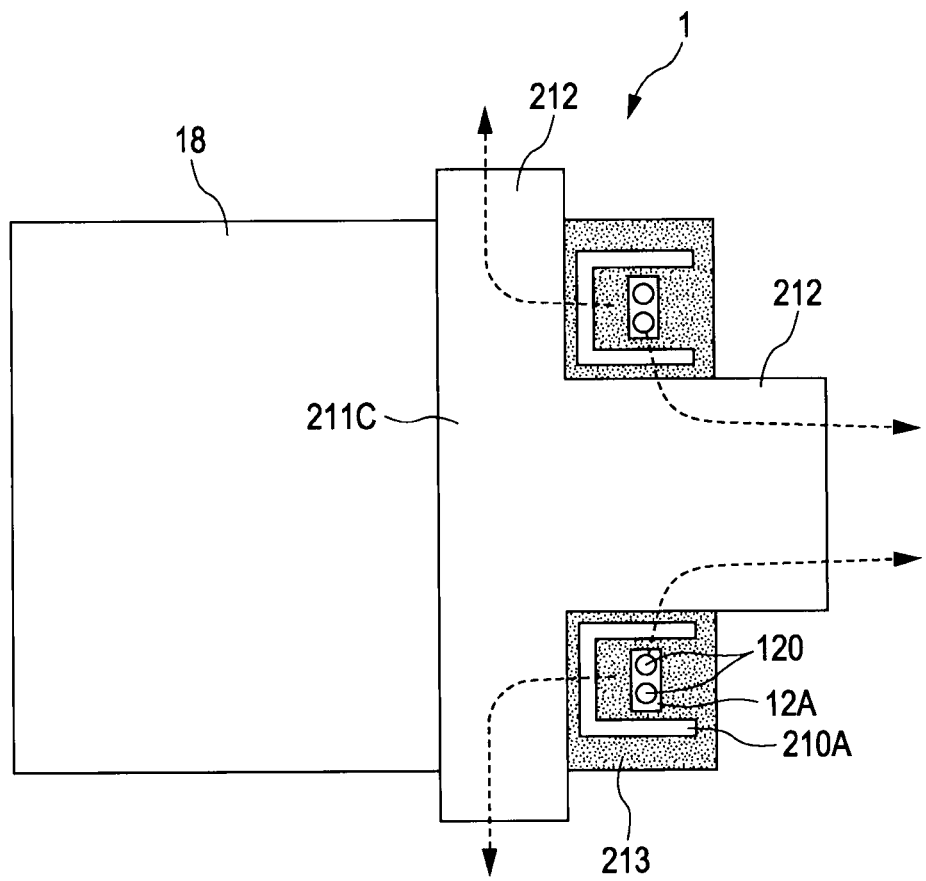
FIG. 59 is a plan view diagrammatically illustrating the solid-state imager with the cooler arranged in the third layout example.

FIG. 58 is a side view diagrammatically illustrating the solid-state imager 1 having the coolers in a third layout. FIG. 59 is a plan view diagrammatically illustrating the solid-state imager 1 having the coolers in the third layout. The solid-state imager 1 includes the optical communication units 12A respectively including the light transmitters 120, arranged at two corners at the opposed ends of the side edge portion of the bottom surface of the substrate 18. The solid-state imager 1 thus supports the four-pixel addition reading mode discussed with reference to FIG. 50. In the example discussed with reference to FIGS. 50 and 51, the optical communication units 12A, each including two light transmitters 120, output the serial signal and the clock signal. The solid-state imager 1 includes the cooler 210A surrounding the optical communication unit 12A. The cooler 210A is manufactured of a material higher in heat conductivity than the material forming the substrate 18. The cooler 210A has the function of radiating the heat generated by the optical communication unit 12A rather than transferring the heat to the substrate 18. In the structure of the solid-state imager 1 in which a plurality of optical communication units 12A are arranged at one location, the coolers 210A cover the top surface and the side faces of the optical communication units 12A. The coolers 210A thus covers the two optical communication units 12A.

The solid-state imager 1 includes a heat radiator 211C covering the area alongside and between the coolers 210A on the bottom surface of the substrate 18. The heat radiator 211C is manufactured of a material higher in heat conductivity than the material of the substrate 18. The heat radiator 211C has the function of radiating the heat transferred from the optical communication unit 12A to the cooler 210A rather than transferring the heat to the substrate 18. The heat radiator 211C is large enough in size to cover the area along and between the coolers 210A and right below part of the pixel unit 10A formed on the top surface of the substrate 18. The heat radiator 211C partly projects outside the outline of the substrate 18 of the solid-state imager 1, thereby forming external heat radiation portions 212. The heat radiator 211C is connected to the pixel unit 10A formed on the top surface of the substrate 18 via heat conductive members 214.

The solid-state imager 1 also includes a heat conductive member 213 between the cooler 210A and the heat radiator 211C. As the cooler 210A and the heat radiator 211C, the heat conductive member 213 is manufactured of a high heat-conductivity material. The heat conductive member 213 fills the gap between the cooler 210A and the heat radiator 211C. The heat conductive member 213 may also fill the region between the cooler 210A and the surfaces of the optical communication unit 12A excluding the light emitting surface of the optical communication unit 12A. For example, the heat conductive member 213 may be manufactured of high heat-conductivity epoxy resin or the like.

The coolers 210A and the heat radiator 211C are arranged in the solid-state imager 1 in which the optical communication units 12A are arranged collectively at a plurality of locations on the bottom surface of the substrate 18. The heat generated by the operating optical communication unit 12A is transferred to the cooler 210A rather than to the substrate 18. The heat transferred to the cooler 210A is transferred to the heat radiator 211C and mainly radiated outwardly via the external heat radiation portions 212 as denoted by arrow-headed broken lines. The heat generated by the pixel unit 10A and the analog-to-digital converter 11A on the top surface of the substrate 18 is transferred to the heat radiator 211C via the heat conductive members 214 and then radiated outwardly mainly via the external heat radiation portions 212.

The heat generated by the optical communication unit 12A is thus transferred in a direction opposite a direction looking, on the bottom surface of the substrate 18, toward the formation region of the pixel unit 10A, and is then radiated outwardly outside the solid-state imager 1. The heat generated by the pixel unit 10A and the like on the top surface of the substrate 18 is transferred to the bottom surface of the substrate 18 and then radiated outwardly. The effect of the heat generated by the optical communication unit 12A on the pixel unit 10A is substantially reduced. The heat conductive member 213 fills the gap between the cooler 210A and the heat radiator 211C, and the gap between the optical communication unit 12A and the cooler 210A. Heat radiation efficiency is high in comparison with a structure in which heat is convected by air. Since the optical communication units 12A are arranged at the locations at the opposed ends of the one edge portion of the solid-state imager 1, the heat radiator 211C is arranged along the optical communication units 12A. The heat radiator 211C having a large area efficiently radiates not only the heat generated by the optical communication unit 12A but also the heat generated by the pixel unit 10A and the like.

(4) Fourth Layout Example of the Cooler

Figure 60:
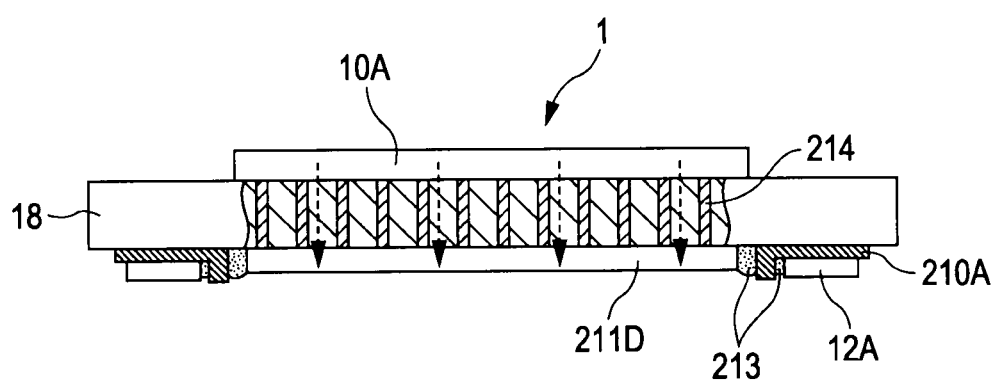
FIG. 60 is a side view diagrammatically illustrating the solid-state imager with the cooler arranged in a fourth layout example.
Figure 61:
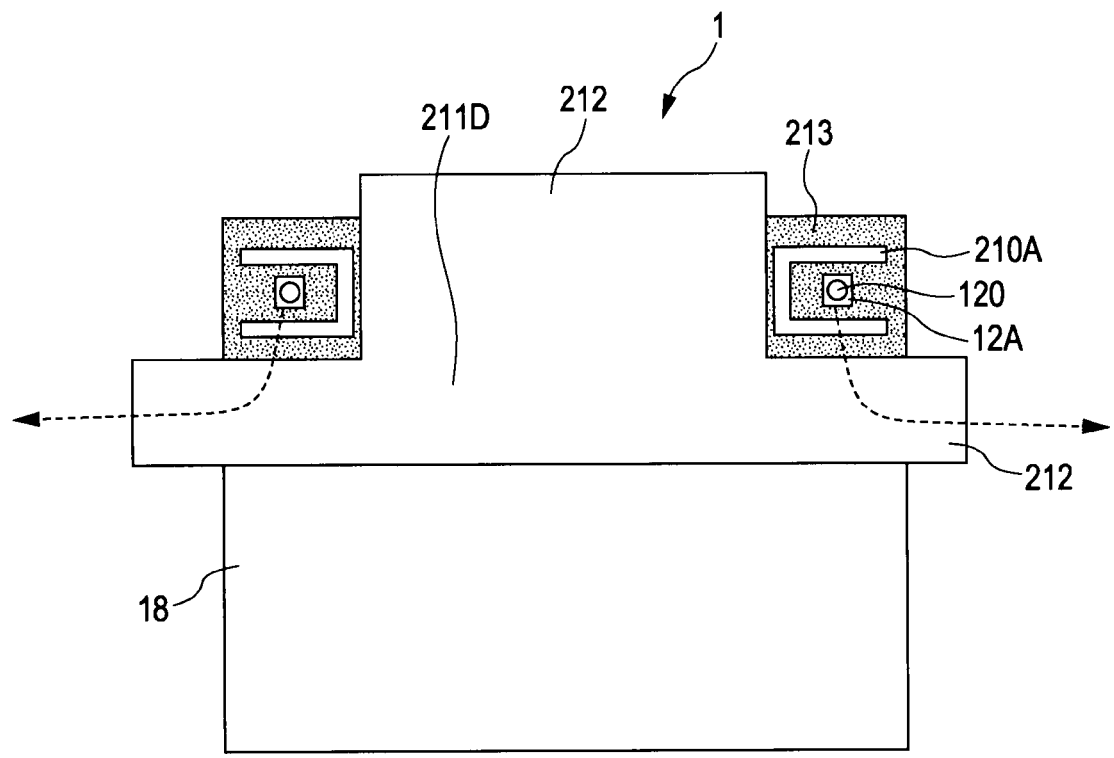
FIG. 61 is a plan view diagrammatically illustrating the solid-state imager with the cooler arranged in the fourth layout example.

FIG. 60 is a side view diagrammatically illustrating the solid-state imager 1 having the coolers in a fourth layout. FIG. 61 is a plan view diagrammatically illustrating the solid-state imager 1 having the coolers in the fourth layout. The solid-state imager 1 includes the optical communication units 12A arranged at two corners at the top edge portion or the bottom edge portion on the bottom surface of the substrate 18 as illustrated in FIG. 61. The solid-state imager 1 thus supports the double-door reading mode discussed with reference to FIG. 46. In the example discussed with reference to FIGS. 46 and 47, the optical communication units 12A, each including one light transmitter 120, output the serial signal with the synchronization signal superimposed thereon. The solid-state imager 1 includes the cooler 210A surrounding the optical communication unit 12A. The cooler 210A is manufactured of a material higher in heat conductivity than the material forming the substrate 18. The cooler 210A has the function of radiating the heat generated by the optical communication unit 12A rather than transferring the heat to the substrate 18.

The solid-state imager 1 includes a heat radiator 211D covering the area along and between the coolers 210A on the bottom surface of the substrate 18. The heat radiator 211D is manufactured of a material higher in heat conductivity than the material of the substrate 18. The heat radiator 211D has the function of radiating the heat transferred from the optical communication unit 12A to the cooler 210A rather than transferring the heat to the substrate 18. The heat radiator 211D is large enough in size to cover the area along and between the coolers 210A and right below part of the pixel unit 10A formed on the top surface of the substrate 18. The heat radiator 211D partly projects outside the outline of the substrate 18 of the solid-state imager 1, thereby forming external heat radiation portions 212. The heat radiator 211D is connected to the pixel unit 10A formed on the top surface of the substrate 18 via heat conductive members 214.

The solid-state imager 1 also includes a heat conductive member 213 between the cooler 210A and the heat radiator 211D. As the cooler 210A and the heat radiator 211D, the heat conductive member 213 is manufactured of a high heat-conductivity material. The heat conductive member 213 fills the gap between the cooler 210A and the heat radiator 211D. The heat conductive member 213 may also fill the region between the cooler 210A and the surfaces of the optical communication unit 12A excluding the light emitting surface of the optical communication unit 12A. For example, the heat conductive member 213 may be manufactured of high heat-conductivity epoxy resin or the like.

The coolers 210A and the heat radiator 211D are arranged in the solid-state imager 1 in which the optical communication units 12A are arranged at the opposed ends of the lower edge portion or the upper edge portion of the bottom surface of the substrate 18. The heat generated by the operating optical communication unit 12A is transferred to the cooler 210A rather than to the substrate 18. The heat transferred to the cooler 210A is transferred to the heat radiator 211D and mainly radiated outwardly via the external heat radiation portions 212 as denoted by arrow-headed broken lines. The heat generated by the pixel unit 10A, the analog-to-digital converter 11A, and the like on the top surface of the substrate 18 is transferred to the heat radiator 211D via the heat conductive members 214 and then radiated outwardly mainly via the external heat radiation portions 212.

The heat generated by the optical communication unit 12A is thus transferred in a direction opposite a direction looking, on the bottom surface of the substrate 18, toward the formation region of the pixel unit 10A, and is then radiated outwardly outside the solid-state imager 1. The heat generated by the pixel unit 10A and the like on the top surface of the substrate 18 is transferred to the bottom surface of the substrate 18 and then radiated outwardly. The effect of the heat generated by the optical communication unit 12A on the pixel unit 10A is substantially reduced. The heat conductive member 213 fills the gap between the cooler 210A and the heat radiator 211D, and the gap between the optical communication unit 12A and the cooler 210A. Heat radiation efficiency is high in comparison with a structure in which heat is convected by air. Since the optical communication units 12A are arranged at the opposed ends of the upper edge portion or the lower edge portion of the solid-state imager 1, the heat radiator 211D is arranged along the optical communication units 12A. The heat radiator 211D having a large area efficiently radiates not only the heat generated by the optical communication unit 12A but also the heat generated by the pixel unit 10A and the like.

Layout Examples of Light Blocker in Accordance with the Layout of Optical Communication Unit The signal light output from the optical communication unit 12A or the light leaked from the optical communication unit 12A can stray around the substrate 18 or travel within the substrate 18, thereby being incident on the pixel unit 10A in the solid-state imager 1. Image capturing can be adversely affected by such stray light. A light block is arranged to prevent the light from the optical communication unit 12A from traveling within the substrate 18 and being incident on the pixel unit 10A. Moreover, a light blocker is also arranged to prevent the light from the optical communication unit 12A from being reflected from a mirror or the like and straying into the pixel unit 10A. With this arrangement, the light from the optical communication unit 12A is prevented from mixing into the light to input to the pixel unit 10A. In the discussion that follows, the light transmitter 120 including no elements arranged on the top surface of the substrate 18 is referred to as the optical communication unit 12A in the same way as in the discussion of the cooler.

(1) First Layout Example of the Light Blocker

Figure 62:
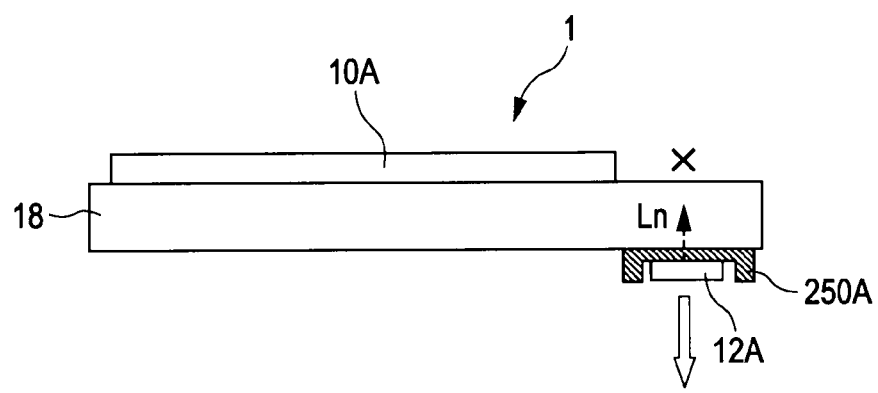
FIG. 62 is a side view diagrammatically illustrating the solid-state imager with the light blocker arranged in a first layout example.
Figure 63:
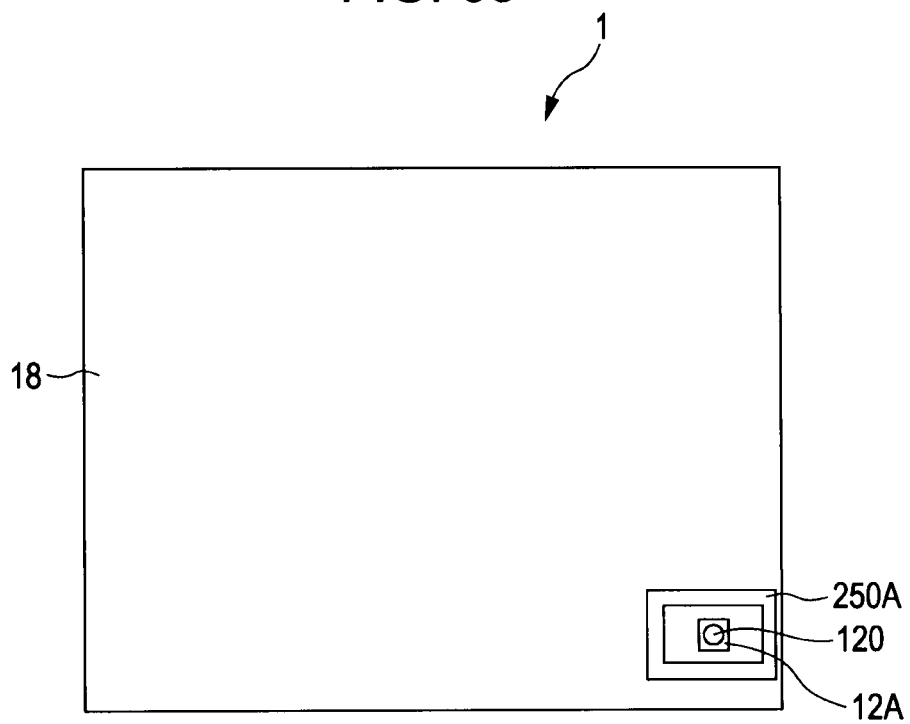
FIG. 63 is a plan view diagrammatically illustrating the solid-state imager with the light blocker arranged in the first layout example.

FIG. 62 is a side view diagrammatically illustrating the solid-state imager 1 having a light blocker in a first layout. FIG. 63 is a plan view diagrammatically illustrating the solid-state imager 1 having the light blocker in the first layout. The solid-state imager 1 includes one optical communication unit 12A including one light transmitter 120 arranged at one corner of the bottom surface of the substrate 18. The solid-state imager 1 handles serialized pixel data. The solid-state imager 1 also includes a light blocker 250A surrounding the optical communication unit 12A. The light blocker 250A is manufactured of a material that does not permit light having at least the wavelength of oscillated light to be transmitted therethrough in the structure in which the optical communication unit 12A includes a self-luminous light emitting element.

If the previously described surface emitting semiconductor laser is used as a light emitting element, the light blocker 250A is a planar member covering the top side and the end faces of the optical communication unit 12A excluding the bottom surface of the optical communication unit 12A serving as a light emitting surface. If the edge emitting semiconductor laser is used as a light emitting element, the light blocker 250A is a planar member covering the top surface and three sides faces of the optical communication unit 12A excluding one side face serving as a light emitting surface.

The light blocker 250A is arranged in the solid-state imager 1 in which the optical communication unit 12A is arranged at one location on the bottom surface of the substrate 18. The light blocker 250A blocks the light leaked from the optical communication unit 12A and prevents the light from passing through the substrate 18. If the surface emitting semiconductor laser is used as the optical communication unit 12A, the stray light Ln from the top surface of the optical communication unit 12A is reflected from the light blocker 250A and is thus prevented from traveling through the substrate 18. The light blocker 250A is not arranged on the bottom surface of the optical communication unit 12A and the signal light Ls is output in a direction perpendicular to the substrate 18. The light blocker 250A thus prevents the leaked light Ln from the optical communication unit 12A from being incident on the pixel unit 10A as stray light. Similarly, the light leaked from the area of the optical communication unit 12A other than the top surface of the optical communication unit 12A is blocked. The light blocker 250A thus prevents the light leaked from the optical communication unit 12A from reflecting from the lens or the like, and straying into the pixel unit 10A.

(2) Second Layout Example of the Light Blocker

Figure 64:
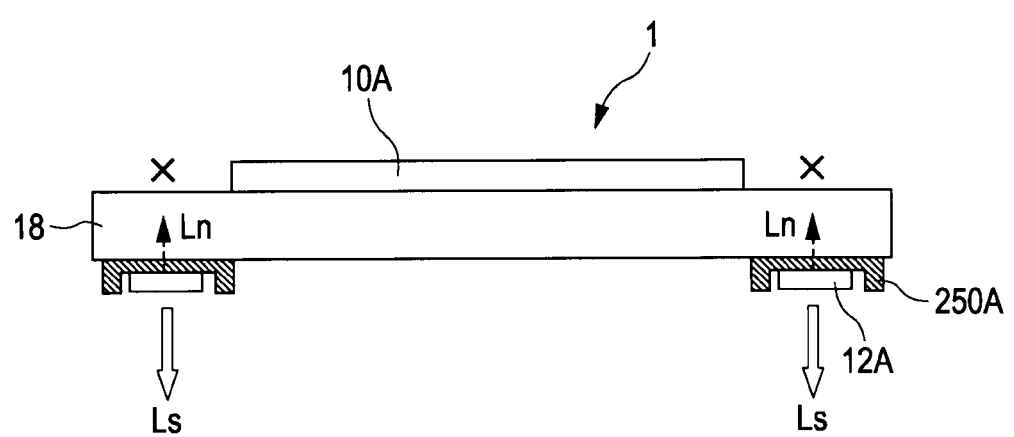
FIG. 64 is a side view diagrammatically illustrating the solid-state imager with the light blocker arranged in a second layout example.
Figure 65:
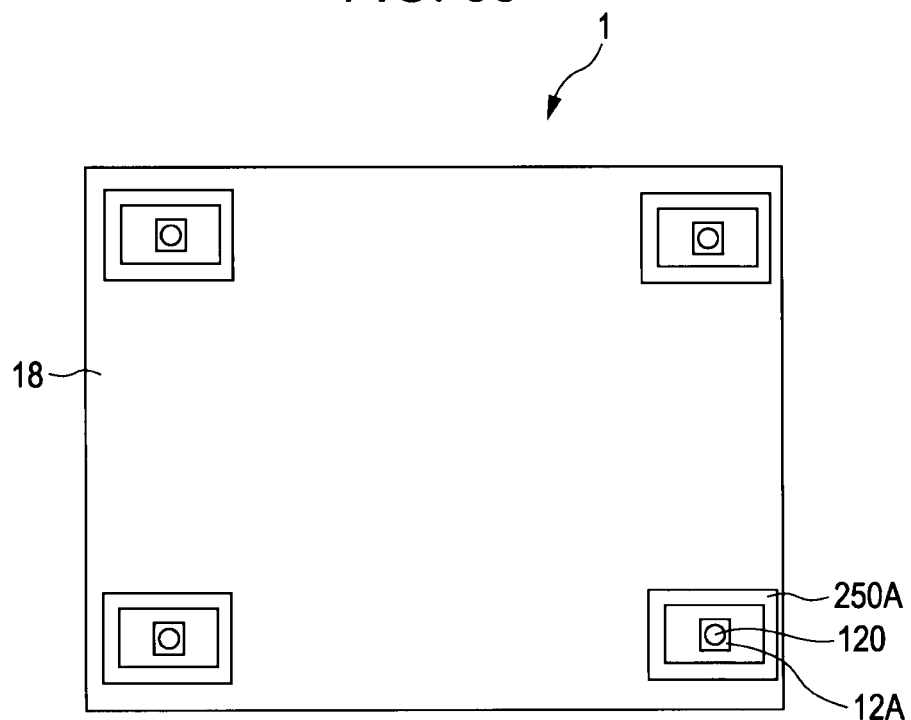
FIG. 65 is a plan view diagrammatically illustrating the solid-state imager with the light blocker arranged in the second layout example.

FIG. 64 is a side view diagrammatically illustrating the solid-state imager 1 having the light blocker in a second layout. FIG. 65 is a plan view diagrammatically illustrating the solid-state imager 1 having the light blocker in the second layout. The solid-state imager 1 includes four optical communication units 12A, each including one light transmitter 120, arranged at the four corners of the bottom surface of the substrate 18. The solid-state imager 1 supports the area reading mode discussed with reference to FIG. 44. The solid-state imager 1 also includes a light blocker 250A surrounding each optical communication unit 12A.

The light blockers 250A are arranged in the solid-state imager 1 in which the optical communication units 12A are distributed at a plurality of locations on the bottom surface of the substrate 18. The light blocker 250A blocks the light leaked from the top surface of the optical communication unit 12A and prevents the light from passing through the substrate 18. The light blocker 250A thus prevents the leaked light Ln from the optical communication unit 12A from being incident on the pixel unit 10A as stray light. Similarly, the light leaked from the area of the optical communication unit 12A other than the top side of the optical communication unit 12A is blocked. The light blocker 250A thus prevents the light leaked from the optical communication unit 12A from reflecting from the lens or the like, and straying into the pixel unit 10A.

(3) Third Layout Example of the Light Blocker

Figure 66:
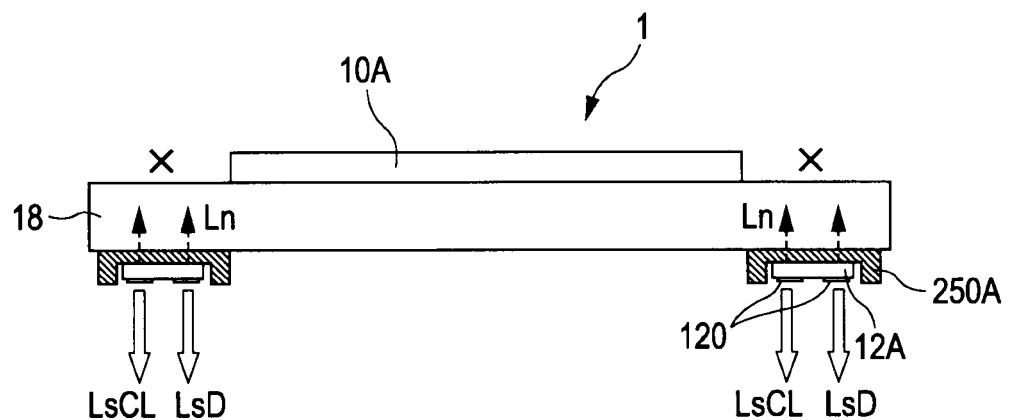
FIG. 66 is a side view diagrammatically illustrating the solid-state imager with the light blocker arranged in a third layout example.
Figure 67:
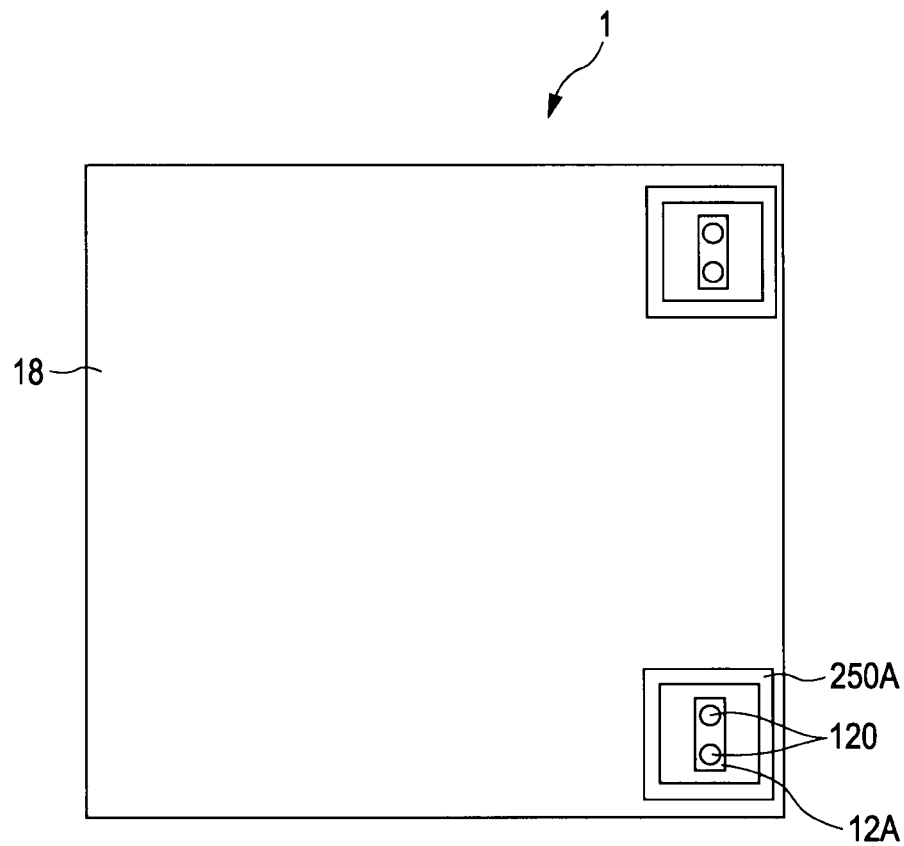
FIG. 67 is a plan view diagrammatically illustrating the solid-state imager with the light blocker arranged in the third layout example.

FIG. 66 is a side view diagrammatically illustrating the solid-state imager 1 having the light blocker in a third layout. FIG. 65 is a plan view diagrammatically illustrating the solid-state imager 1 having the light blocker in the third layout. The solid-state imager 1 includes two optical communication units 12A, each including two light transmitter 120, arranged at the two opposed end of one edge portion of the bottom surface of the substrate 18. The solid-state imager 1 supports the four-pixel addition reading mode discussed with reference to FIG. 50. The solid-state imager 1 also includes a light blocker 250A surrounding each optical communication unit 12A. The light blockers 250A cover the top surface and the sides faces of the optical communication units 12A, thus surrounding the two optical communication units 12A.

The light blockers 250A are arranged in the solid-state imager 1 in which the optical communication units 12A are distributed at a plurality of locations on the bottom surface of the substrate 18. The light blocker 250A blocks the light leaked from the top surface of the optical communication unit 12A and prevents the light from passing through the substrate 18. The light blocker 250A thus prevents the leaked light from the optical communication unit 12A from being incident on the pixel unit 10A as stray light. Similarly, the light leaked from the area of the optical communication unit 12A other than the top surfaces of the optical communication unit 12A is blocked. The light blocker 250A thus prevents the light leaked from the optical communication unit 12A from reflecting from the lens or the like, and straying into the pixel unit 10A.

(4) Fourth Layout Example of the Light Blocker

Figure 68:
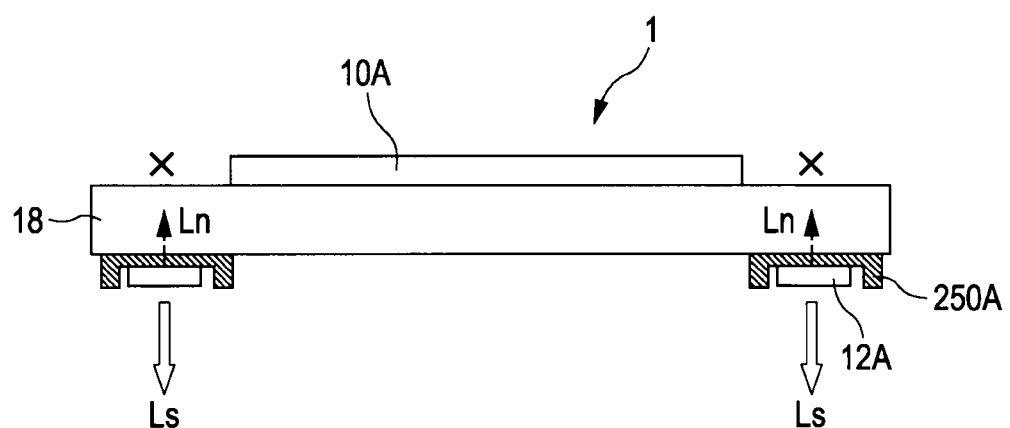
FIG. 68 is a side view diagrammatically illustrating the solid-state imager with the light blocker arranged in a fourth layout example.
Figure 69:
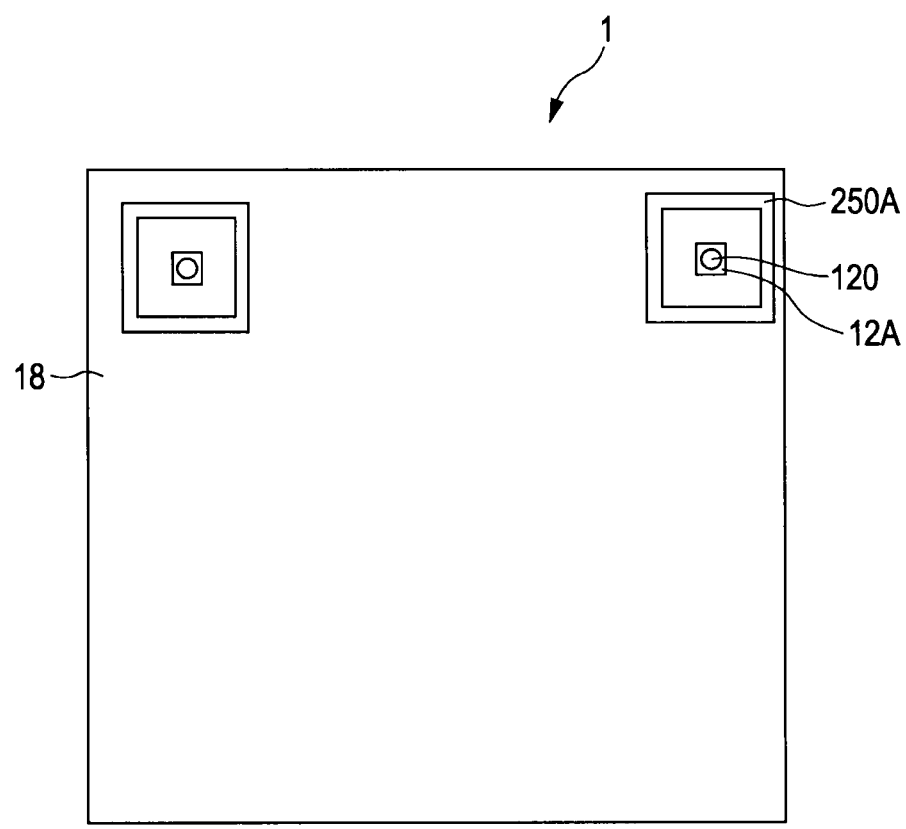
FIG. 69 is a plan view diagrammatically illustrating the solid-state imager with the light blocker arranged in the fourth layout example.

FIG. 68 is a side view diagrammatically illustrating the solid-state imager 1 having the light blocker in a fourth layout. FIG. 69 is a plan view diagrammatically illustrating the solid-state imager 1 having the light blocker in the fourth layout. The solid-state imager 1 includes two optical communication units 12A, each including one light transmitter 120, arranged at the two opposed ends of the upper edge portion or the lower edge portion of the bottom surface of the substrate 18 as illustrated in FIG. 69. The solid-state imager 1 supports the double-door reading mode discussed with reference to FIG. 46. The solid-state imager 1 also includes a light blocker 250A surrounding each optical communication unit 12A The light blockers 250A are arranged in the optical communication units 12A in which the optical communication units 12A are arranged at the two opposed ends of the upper edge portion or the lower edge portion of the bottom surface of the substrate 18. The light blocker 250A blocks the light leaked from the top surface of the optical communication unit 12A and prevents the light from passing through the substrate 18. The light blocker 250A thus prevents the leaked light from the optical communication unit 12A from being incident on the pixel unit 10A as stray light. Similarly, the light leaked from the area of the optical communication unit 12A other than the top surface of the optical communication unit 12A is blocked. The light blocker 250A thus prevents the light leaked from the optical communication unit 12A from reflecting from the lens or the like, and straying into the pixel unit 10A.

Control of the Signal Processing System

Figure 70:
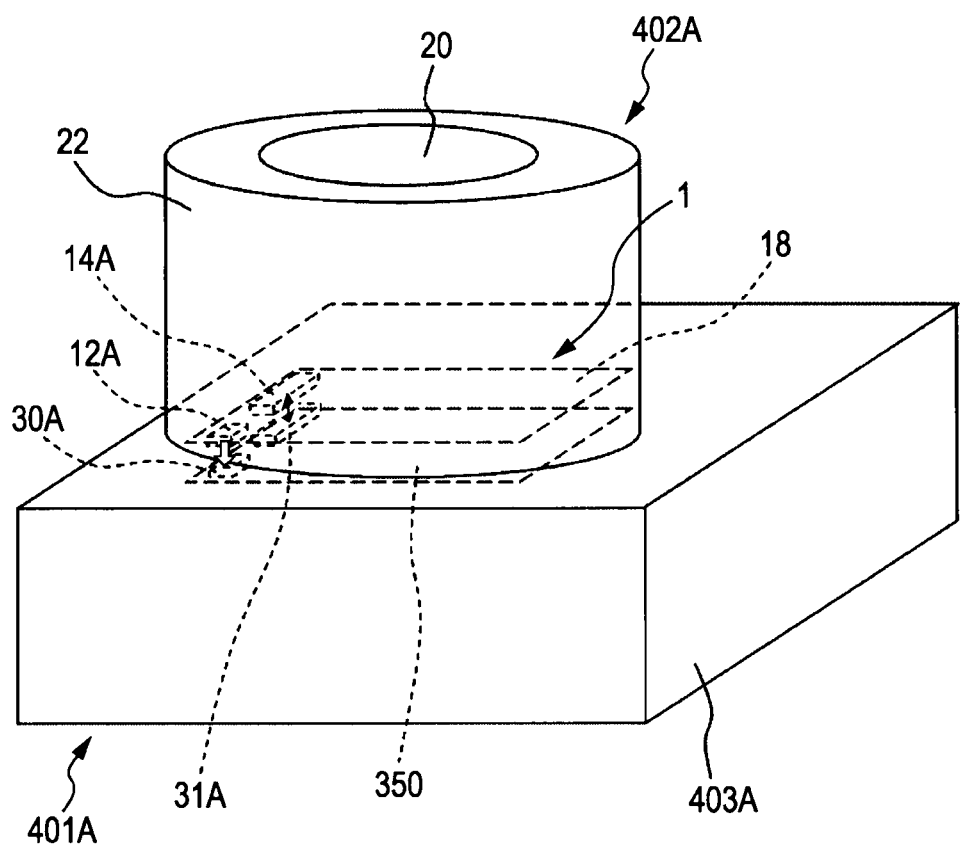
FIG. 70 is a perspective view illustrating one example of camera system as an application of the signal processing system.
Figure 71:
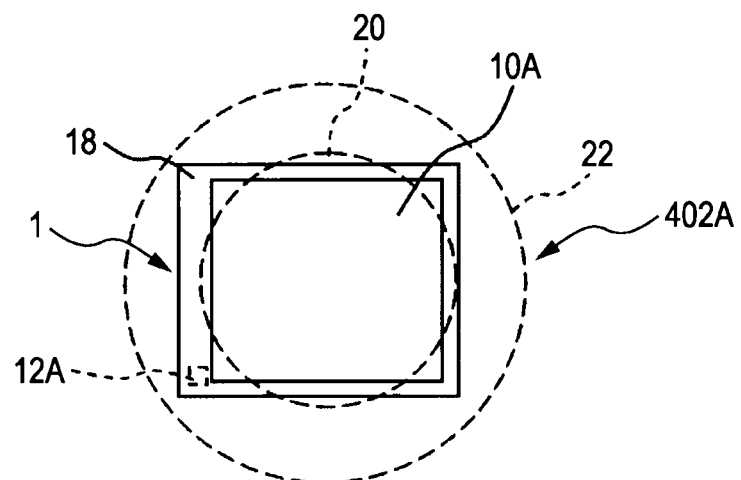
FIG. 71 is a front view illustrating a lens unit forming the camera system.

FIG. 70 is a perspective view diagrammatically illustrating a camera system 401 as an application of the signal processing system 4A. FIG. 71 is a front view diagrammatically illustrating a lens unit 402A forming the camera system 401A. The camera system 401A is an example of the signal processing system 4A discussed with reference to FIG. 19.

The camera system 401A includes the lens unit 402A discussed as the optical device 2A with reference to FIG. 19, and a camera main unit 403A as the signal processing device 3A. The lens unit 402A includes a lens section 20, and a lens barrel 22 in addition to the above-described solid-state imager 1. The solid-state imager 1 includes the pixel unit 10A, the size of which is defined by the lens section 20 of the lens unit 402A as illustrated in FIG. 71.

The camera main unit 403A has the lens unit 402A detachably mounted thereon and includes a signal processing board 350. The signal processing board 350 forms the signal processing device 3A discussed with reference to FIG. 19 and other drawings. With the lens unit 402A is mounted on the camera main unit 403A, the optical communication unit 12A in the solid-state imager 1 is optically coupled with the optical communication unit 30A. The control input/output unit 14A in the solid-state imager 1 is also connected to the control input/output unit 31A.

As previously discussed, the optical communication unit 12A is arranged on the bottom surface of the substrate 18 bearing the pixel unit 10A on the top surface of the substrate 18. When the lens unit 402A is mounted on the camera main unit 403A, the signal processing board 350 faces the bottom side of the solid-state imager 1.

Advantages of the Solid-State Imager Including the Optical Communication Unit on the Bottom Surface of the Substrate The solid-state imager of each embodiment includes the optical communication unit on the bottom surface of the substrate with respect to the pixel unit on the top surface of the substrate. The freedom of layout of the optical communication unit is thus increased. Since the substrate is interposed between the pixel unit and the optical communication unit, the effect of the heat generated by the optical communication unit on the pixel unit is reduced. Similarly, the effect of the electromagnetic noise generated by the optical communication unit on the optical communication unit is also reduced. The effect of the heat and the electromagnetic noise is even further reduced if the optical communication unit is arranged on the peripheral area of the bottom surface of the substrate with respect to the formation region of the pixel unit on the top surface of the substrate.

If the freedom of the layout of the optical communication unit is increased, the freedom of the layout of the cooler of the optical communication unit is also increased. For example, the optical communication units, if mounted collectively, are cooled together. If the optical communication units as the heat sources are mounted in a distributed fashion, a cooling operation is also performed in a distributed fashion. A cooler for cooling the entire solid-state imager including the pixel unit and the optical communication unit may be mounted on an available space having no particular elements thereon on the bottom surface of the substrate.

It is sufficient if only the bottom surface of the substrate is taken into consideration as a source of a false signal incident on the pixel unit. The freedom of the layout of the light blocker is increased. A preventive step controlling light leak becomes easy.

The signal read from the pixel unit is transferred via the signal wiring routed to the optical communication unit on the bottom surface of the substrate. The freedom of the signal transmission method to the optical communication unit on the bottom surface of the substrate is increased. A signal transmission method may be selected from a variety of signal transmission methods including a superimposition serial transmission with the synchronization signal and the clock signal superimposed on the data line, a multiple clock signal transmission with serial data line, etc.

The optical communication unit is produced in a process step independent of a process step of the pixel unit. The optical communication unit is easily integrated, leading to an increased freedom of the internal structure of the optical communication unit.

The present application contains subject matter related to that disclosed in Japanese Priority Patent Application JP 2008-264576 filed in the Japan Patent Office on Oct. 10, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imager, comprising:
a pixel area that converts incident light into an electrical signal;
a substrate bearing the pixel area formed thereon;
an analog-to-digital converter, formed on the substrate, for converting a signal read from the pixel area into a digital signal;
an optical communication circuit, arranged on the bottom surface of the substrate opposite the top surface of the substrate bearing the pixel area receiving the incident light, that converts the digital signal, converted by the analog-to-digital converter, into a light signal and outputs the light signal;
a signal line for transferring the digital signal, converted by the analog-to-digital converter, to the optical communication circuit arranged on the bottom surface of the substrate, wherein the optical communication circuit is arranged, on a peripheral area on the bottom surface of the substrate, right below the analog-to-digital converter and is connected to the analog-to-digital converter via the signal line; and
a light blocker arranged between the optical communication circuit and the substrate and configured to block light of an oscillation wavelength of the optical communication circuit.

2. The solid-state imager according to claim 1, further comprising
a serial interface for converting the digital signal, into which the analog-to-digital converter converts the signal read from the pixel area, into serial data, wherein the serial interface is formed on the top surface of the substrate and is connected to an output of the analog-to-digital converter, and wherein the optical communication circuit is arranged on the bottom surface of the substrate right below the serial interface, and is connected to the serial interface via the signal line.

3. The solid-state imager according to claim 1, wherein the optical communication circuit comprises a serial interface for converting the digital signal, into which the analog-to-digital converter converts the signal read from the pixel area, into serial data, the serial interface in the optical communication circuit is formed on the top surface of the substrate and is connected to an output of the analog-to-digital converter, and the optical communication circuit includes a light transmitter, the light transmitter converting the serial data, converted by the serial interface, into a light signal and outputting the light signal, the light transmitter arranged on the bottom surface of the substrate right below the serial interface and connected to the serial interface via the signal line.

4. The solid-state imager according to claim 1, further comprising
a timing generator for generating a synchronization signal, the synchronization signal synchronizing the pixel area, the analog-to-digital converter and the optical communication circuit in signal inputting and outputting, and
a controller for controlling signal reading, wherein the pixel area, the analog-to-digital converter, the optical communication circuit, the timing generator and the controller are integrated in a single chip onto the substrate.

5. The solid-state imager according to claim 1, wherein the optical communication circuit comprises a cooler for sinking heat generated by the optical communication circuit, the cooler arranged around a region on the bottom surface of the substrate right below at least the formation region of the pixel area.

6. The solid-state imager according to claim 5, further comprising
a heat radiator, the heat radiator covering part or all of the region on the bottom surface of the substrate right below the formation region of the pixel area and formed within an area where heat radiated by the cooler is transferred, the heat radiator connected to the solid-state imager via a heat conductive member.

7. The solid-state imager according to claim 1, wherein at least one optical communication circuit is collectively arranged in a peripheral portion of the substrate.

8. The solid-state imager according to claim 1, wherein one optical communication circuit is arranged in a distributed fashion in a peripheral area of the substrate.

9. The solid-state imager according to claim 1, wherein a plurality of optical communication circuits are arranged in a distributed fashion in a peripheral portion of the substrate.

10. The solid-state imager according to claim 1, wherein the pixel area is partitioned into groups according to characteristics of each pixel or the position of each pixel, signal reading is performed on a per group basis, and analog-to-digital converters are respectively arranged for a plurality of signal lines reading a signal from the pixel area.

11. The solid-state imager according to claim 3, wherein the pixel area is partitioned into groups according to characteristics of each pixel or the position of each pixel, signal reading is performed on a per group basis, and analog-to-digital converters and serial interfaces are respectively arranged for a plurality of signal lines reading a signal from the pixel area.

12. A signal processing system, comprising:
an optical device including a solid-state imager for converting incident light into an electrical signal, and an optical element for guiding light to the solid-state imager; and
a signal processing device connected to the optical device, wherein
the solid-state imager includes
a pixel area that converts incident light into an electrical signal;
a substrate bearing the pixel area formed thereon;
an analog-to-digital converter, formed on the substrate, for converting a signal read from the pixel area into a digital signal;
an optical communication circuit, arranged on the bottom surface of the substrate opposite the top surface of the substrate bearing the pixel area receiving the incident light, that converts the digital signal converted by the analog-to-digital converter into a light signal and outputs the light signal;
a signal line for transferring the digital signal, converted by the analog-to-digital converter, to the optical communication circuit arranged on the bottom surface of the substrate; and
a light blocker arranged between the optical communication circuit and the substrate and configured to block light of an oscillation wavelength of the optical communication circuit, and
the optical communication circuit is arranged, on a peripheral area on the bottom surface of the substrate, right below the analog-to-digital converter and is connected to the analog-to-digital converter via the signal line.

* * * * *